(12) United States Patent
Nakamura et al.

(10) Patent No.: US 8,138,502 B2
(45) Date of Patent: Mar. 20, 2012

(54) LIGHT-EMITTING DEVICE AND MANUFACTURING METHOD THEREOF

(75) Inventors: Osamu Nakamura, Kanagawa (JP); Miyuki Higuchi, Kanagawa (JP); Yasuko Watanabe, Kanagawa (JP); Yasuyuki Arai, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 738 days.

(21) Appl. No.: 11/459,768

(22) Filed: Jul. 25, 2006

(65) Prior Publication Data

US 2007/0029554 A1    Feb. 8, 2007

(30) Foreign Application Priority Data

Aug. 5, 2005 (JP) ................................. 2005-228678

(51) Int. Cl.
*H01L 29/04* (2006.01)
(52) U.S. Cl. ............... 257/72; 257/79; 257/80; 257/83; 257/82; 257/918; 257/642; 257/643; 257/759; 257/E51.001; 257/E51.052; 257/E25.008; 257/E25.009; 257/E51.018; 257/E51.022; 257/E33.077; 257/E25.032
(58) Field of Classification Search ............ 257/79–103, 257/13, 918, 72, 642, 643, 759, E51.001, 257/E51.052, E25.008, E25.009, E51.018, 257/E51.022, E33.077, E25.032
See application file for complete search history.

(56) References Cited

U.S. PATENT DOCUMENTS

| 3,885,196 | A | 5/1975 | Fischer |
| 5,627,364 | A | 5/1997 | Codama et al. |
| 5,684,365 | A | 11/1997 | Tang et al. |
| 6,175,345 | B1 | 1/2001 | Kuribayashi et al. |
| 6,236,444 | B1 | 5/2001 | Konuma et al. |
| 6,475,845 | B2 | 11/2002 | Kimura |
| 6,603,270 | B2 | 8/2003 | Suzuki et al. |
| 6,744,197 | B2 | 6/2004 | Park et al. |
| 6,815,905 | B2 | 11/2004 | Suzuki et al. |

(Continued)

FOREIGN PATENT DOCUMENTS

CN    1319892 A    10/2001

(Continued)

OTHER PUBLICATIONS

Japan 08-234683: English abstract provided by esp@cenet Worldwide (2006) and family to U.S. Patent No. 5,684,365 (Desig. ID "AD").

(Continued)

*Primary Examiner* — Marc Armand
(74) *Attorney, Agent, or Firm* — Fish & Richardson P.C.

(57) ABSTRACT

To prevent a point defect and a line defect in forming a light-emitting device, thereby improving the yield. A light-emitting element and a driver circuit of the light-emitting element, which are provided over different substrates, are electrically connected. That is, a light-emitting element and a driver circuit of the light-emitting element are formed over different substrates first, and then electrically connected. By providing a light-emitting element and a driver circuit of the light-emitting element over different substrates, the step of forming the light-emitting element and the step of forming the driver circuit of the light-emitting element can be performed separately. Therefore, degrees of freedom of each step can be increased, and the process can be flexibly changed. Further, steps (irregularities) on the surface for forming the light-emitting element can be reduced than in the conventional technique.

37 Claims, 34 Drawing Sheets

U.S. PATENT DOCUMENTS

| | | |
|---|---|---|
| 6,958,489 B2 | 10/2005 | Kimura |
| 6,980,275 B1 | 12/2005 | Konuma et al. |
| 7,012,290 B2 | 3/2006 | Kimura |
| 7,030,551 B2 | 4/2006 | Yamazaki et al. |
| 7,038,288 B2 | 5/2006 | Lai et al. |
| 7,045,438 B2 | 5/2006 | Yamazaki et al. |
| 7,057,340 B2 | 6/2006 | Imura |
| 7,071,488 B2 | 7/2006 | Kimura |
| 7,161,185 B2 | 1/2007 | Yamazaki et al. |
| 7,354,803 B2 | 4/2008 | Koeda et al. |
| 7,400,089 B2 | 7/2008 | Kim |
| 7,402,945 B2 | 7/2008 | Yamazaki et al. |
| 7,402,946 B2 | 7/2008 | Park et al. |
| 7,551,454 B2 | 6/2009 | Wuchse et al. |
| 7,723,721 B2 | 5/2010 | Udagawa et al. |
| 2003/0136966 A1 | 7/2003 | Inoue et al. |
| 2003/0168969 A1 | 9/2003 | Tanabe |
| 2003/0173567 A1* | 9/2003 | Kokubo et al. ............... 257/66 |
| 2004/0227886 A1* | 11/2004 | Kimura ...................... 349/139 |
| 2005/0122036 A1* | 6/2005 | Park et al. ................. 313/504 |
| 2005/0161675 A1 | 7/2005 | Kimura |
| 2005/0161754 A1* | 7/2005 | Izumi ......................... 257/432 |
| 2006/0027817 A1 | 2/2006 | Yamazaki et al. |
| 2006/0197116 A1 | 9/2006 | Kimura |
| 2007/0108454 A1 | 5/2007 | Yamazaki et al. |
| 2009/0061551 A1 | 3/2009 | Yamazaki et al. |
| 2009/0184090 A1 | 7/2009 | Wuchse et al. |
| 2010/0224868 A1 | 9/2010 | Udagawa et al. |

FOREIGN PATENT DOCUMENTS

| | | |
|---|---|---|
| CN | 1444427 A | 9/2003 |
| EP | 1139454 A | 10/2001 |
| EP | 1146565 A2 | 10/2001 |
| EP | 1 310 997 A2 | 5/2003 |
| EP | 1343206 A | 9/2003 |
| JP | 08-111516 A | 4/1996 |
| JP | 08-234683 | 9/1996 |
| JP | 2001296814 A | 10/2001 |
| JP | 2003-208110 A | 7/2003 |
| JP | 2003-255850 A | 9/2003 |
| JP | 2003-280552 | 10/2003 |
| JP | 2004-004811 | 1/2004 |
| JP | 2005-037930 A | 2/2005 |
| JP | 2005114916 A | 4/2005 |
| JP | 2007-505484 A | 3/2007 |
| WO | 2005/025282 A1 | 3/2005 |

OTHER PUBLICATIONS

Japan 2003-280552: English abstract provided by esp@cenet Worldwide (2006).

Japan 2004-004811: English abstract provided by esp@cenet Worldwide (2006) and family to U.S. Patent No. 6,744,197 (Desig. ID "AF").

Office Action (Application No. 200610110927.6) dated May 8, 2009, with full English translation, 20 pages.

* cited by examiner

1000

1013

1017 laser light    laser light    laser light read mode display mode

LIGHT-EMITTING DEVICE AND MANUFACTURING METHOD THEREOF

BACKGROUND OF THE INVENTION

1. Field of the Invention

The present invention relates to a light-emitting device and a manufacturing method thereof.

2. Description of the Related Art

Conventionally, a light-emitting device having light-emitting elements has been formed through the following steps of: 1) forming a semiconductor circuit for driving light-emitting elements over a substrate such as a glass substrate by using a semiconductor process, 2) forming an insulating film (planarizing film) over the semiconductor circuit, and 3) forming light-emitting elements over the insulating film. That is, a semiconductor circuit for driving light-emitting elements and light-emitting elements are formed by stacking layers over a substrate in order from the bottom.

Since a light-emitting device manufactured through the conventional manufacturing process has an insulating film over a semiconductor circuit for driving light-emitting elements, and light-emitting elements over the insulating film, there are steps (irregularities) or the like resulting from elements or wires that are formed in the layer below the light-emitting elements (Reference 1: Japanese Patent Laid-Open No. H8-234683). Therefore, the area for forming the light-emitting elements has been limited.

In addition, there may be a case where a coverage defect occurs due to steps resulting from elements or wires that are formed in the layer below the light-emitting elements. Such a coverage defect may cause a point defect, a line defect, or the like.

SUMMARY OF THE INVENTION

It is an object of the invention to prevent a point defect and a line defect in forming a light-emitting device, thereby improving the yield. It is another object of the invention to form a light-emitting element by best effectively utilizing a plane surface with few steps.

A light-emitting device of the invention includes: a light-emitting element and a driver circuit of the light-emitting element, which are formed over different substrates but are electrically connected. That is, after providing a light-emitting element and a driver circuit of the light-emitting element over different substrates, they are electrically connected.

Note that a light-emitting element includes an active matrix light-emitting device and a passive matrix light-emitting device, and the light-emitting device of the invention can be applied to either of them.

In addition, a light-emitting element includes an organic EL element and an inorganic EL element, and either of them can be used in the invention.

A light-emitting device of the invention includes: a first substrate over which a light-emitting element is formed, and a second substrate over which a pixel circuit for driving the light-emitting element is formed, the second substrate being provided to face the first substrate. The light-emitting element is electrically connected to the pixel circuit.

A light-emitting device of the invention includes: a first substrate over which a light-emitting element is formed, and a second substrate over which a pixel circuit for driving the light-emitting element is formed, the second substrate functioning as a sealing substrate and being provided to face a surface of the first substrate where the light-emitting element is formed. The light-emitting element is electrically connected to the pixel circuit.

A light-emitting device of the invention includes: a first substrate over which a light-emitting element is formed, a second substrate over which a pixel circuit for driving the light-emitting element is formed, the second substrate being provided to face a surface of the first substrate where no light-emitting element is formed, and a third substrate functioning as a sealing substrate, the third substrate being provided to face a surface of the first substrate where the light-emitting element is formed. The light-emitting element is electrically connected to the pixel circuit.

A light-emitting device of the invention includes: a first substrate over which a light-emitting element is formed, and a second substrate over which a row driver and a column driver for driving the light-emitting element are formed, the second substrate functioning as a sealing substrate and being provided to face the first substrate. The light-emitting element is electrically connected to the row driver or the column driver.

A light-emitting device of the invention includes: a first substrate over which a light-emitting element is formed, and a second substrate over which an image sensor and a pixel circuit for driving the light-emitting element are formed, the second substrate being provided to face the first substrate. The light-emitting element is electrically connected to the pixel circuit.

A light-emitting device of the invention includes: a first substrate over which a light-emitting element and an image sensor are formed, and a second substrate over which a pixel circuit for driving the light-emitting element is formed, the second substrate being provided to face the first substrate. The light-emitting element is electrically connected to the pixel circuit.

A light-emitting device of the invention includes a first substrate and a second substrate provided to face the first substrate. A first electrode of a light-emitting element is formed over the first substrate, and a layer containing a light-emitting substance is formed over the first electrode of the light-emitting element. A driving transistor for driving the light-emitting element is formed over the second substrate, an interlayer insulating film is formed over the driving transistor, and an electrode which is electrically connected to a source region or a drain region of the driving transistor is formed over the interlayer insulating film. The electrode which is electrically connected to the source region or the drain region of the driving transistor is electrically connected to the layer containing a light-emitting substance.

The substrate of the light-emitting device of the invention may be flexible. In that case, the substrate of the light-emitting device may be formed to have a thickness of 100 μm or less, or preferably 20 to 50 μm.

A light-emitting device of the invention includes: a first substrate over which a light-emitting element is formed, and a film including a pixel circuit for driving the light-emitting element, the film being provided to face the first substrate. The light-emitting element is electrically connected to the pixel circuit. In this case, the first substrate may be formed to have a thickness of 100 μm or less, or preferably 20 to 50 μm.

A manufacturing method of a light-emitting device of the invention includes the steps of: forming a light-emitting element over a first substrate, forming a pixel circuit for driving the light-emitting element over a second substrate, and attaching the first substrate and the second substrate to each other so that the first substrate and the second substrate face each other, thereby electrically connecting the light-emitting element to the pixel circuit.

A manufacturing method of a light-emitting device of the invention includes the steps of: forming a light-emitting element over a first substrate, forming a separation layer over a second substrate, forming a layer including a pixel circuit for driving the light-emitting element over the separation layer, separating the layer including the pixel circuit for driving the light-emitting element from the second substrate, and attaching the first substrate and the layer including the pixel circuit for driving the light-emitting element to each other so that the first substrate and the layer including the pixel circuit for driving the light-emitting element face each other, thereby electrically connecting the light-emitting element to the pixel circuit.

A manufacturing method of a light-emitting device of the invention includes the steps of: forming a light-emitting element over a first substrate, forming a layer including a pixel circuit for driving the light-emitting element over a second substrate, processing the second substrate to be thinner, and attaching the first substrate and the second substrate to each other so that the first substrate and the second substrate face each other, thereby electrically connecting the light-emitting element to the pixel circuit. In this case, the second substrate may be processed to have a thickness of 100 μm or less by the process of thinning the second substrate.

In the invention, a light-emitting element and a driver circuit of the light-emitting element are formed over different substrates, and thus the step of forming a light-emitting element and the step of forming a driver circuit of the light-emitting element are separately performed. Therefore, degrees of freedom of each step can be increased, and the process can be flexibly changed. Although a conventional light-emitting device is manufactured by forming a planarizing film over a driver circuit of a light-emitting element first, and then forming a light-emitting element thereover, the light-emitting device of the invention is manufactured by separately forming a light-emitting element and a driver circuit of the light-emitting element over different substrates. Therefore, steps (irregularities) on the surface for forming the light-emitting element can be reduced than in the conventional technique. Accordingly, defects such as a point defect and a line defect, which would occur in forming a light-emitting element, can be reduced. Thus, the yield in forming a light-emitting device can be improved.

BRIEF DESCRIPTION OF THE DRAWINGS

In the accompanying drawings.

DETAILED DESCRIPTION OF THE INVENTION

Embodiment modes and embodiments for carrying out the invention will be described below.

Embodiment Mode 1

In this embodiment mode, description is made of the first example of an active matrix light-emitting device where a light-emitting element formed over a first substrate and a transistor formed over a second substrate are electrically connected. That is, description is made of the first example where the light-emitting device with the first structure of the invention is an active matrix light-emitting device.

Figure 10:
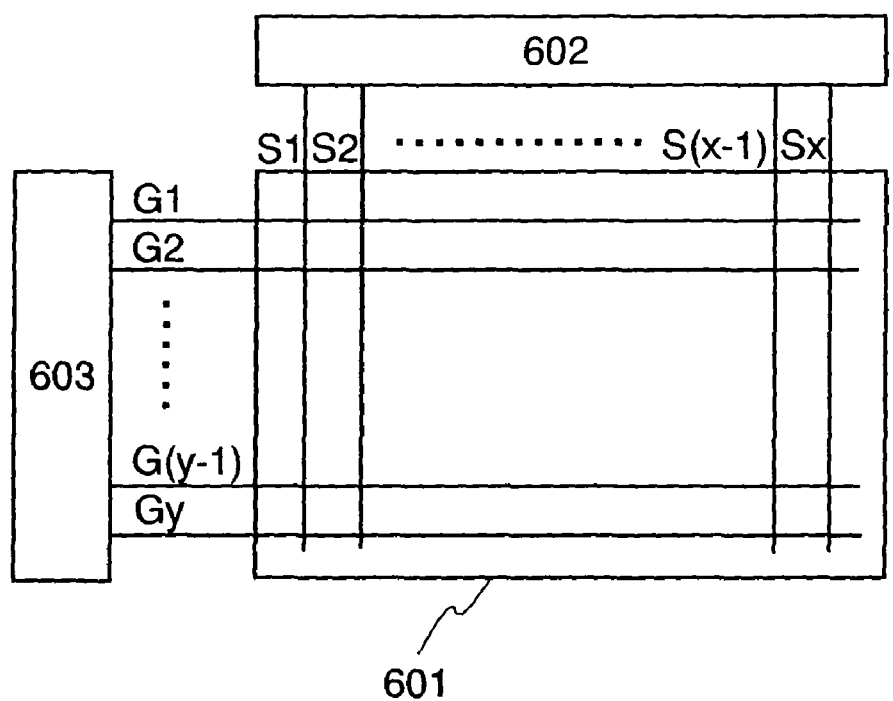
FIG. 10 illustrates an active matrix light-emitting device.

FIG. 10 illustrates a schematic view of an active matrix light-emitting device. As shown in FIG. 10, the active matrix light-emitting device includes source signal lines (S1 to Sx), gate signal lines (G1 to Gy), a pixel portion 601, a source signal line driver circuit 602, and a gate signal line driver circuit 603.

Figure 11:
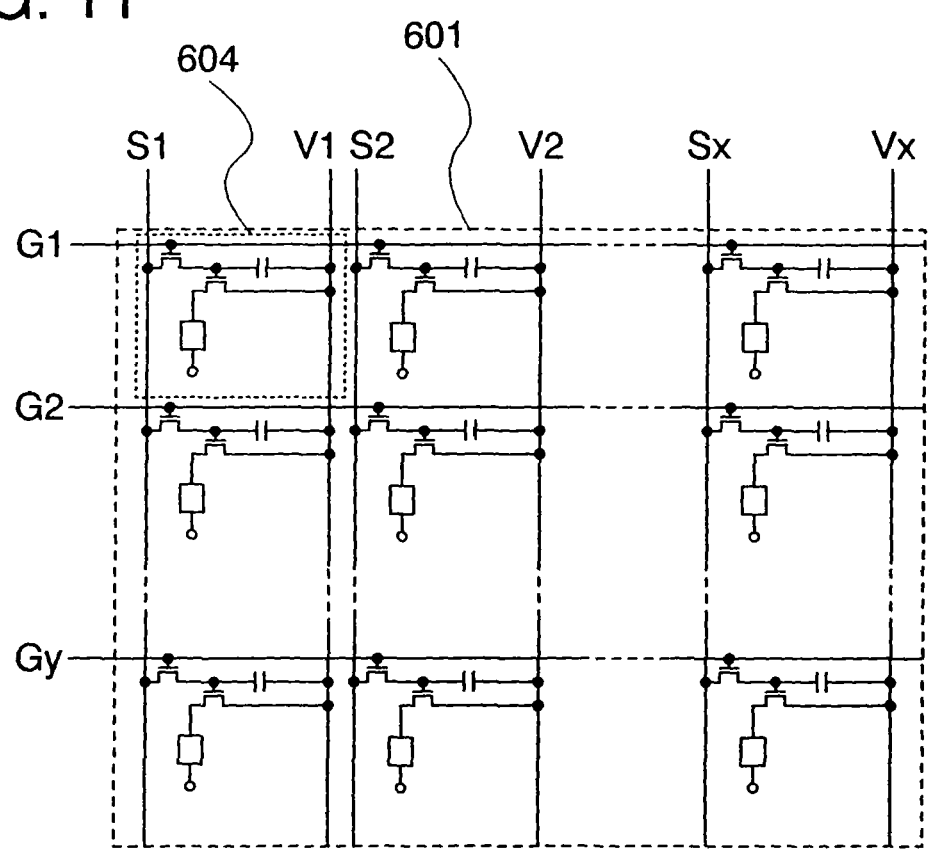
FIG. 11 illustrates an exemplary pixel portion of an active matrix light-emitting device.

FIG. 11 illustrates an equivalent circuit diagram of the pixel portion 601. In the pixel portion 601, a plurality of pixels 604, which are formed to be surrounded by the source signal lines (S1 to Sx), power supply lines (V1 to Vx), and the gate signal lines (G1 to Gy), are arranged in matrix.

Figure 12:
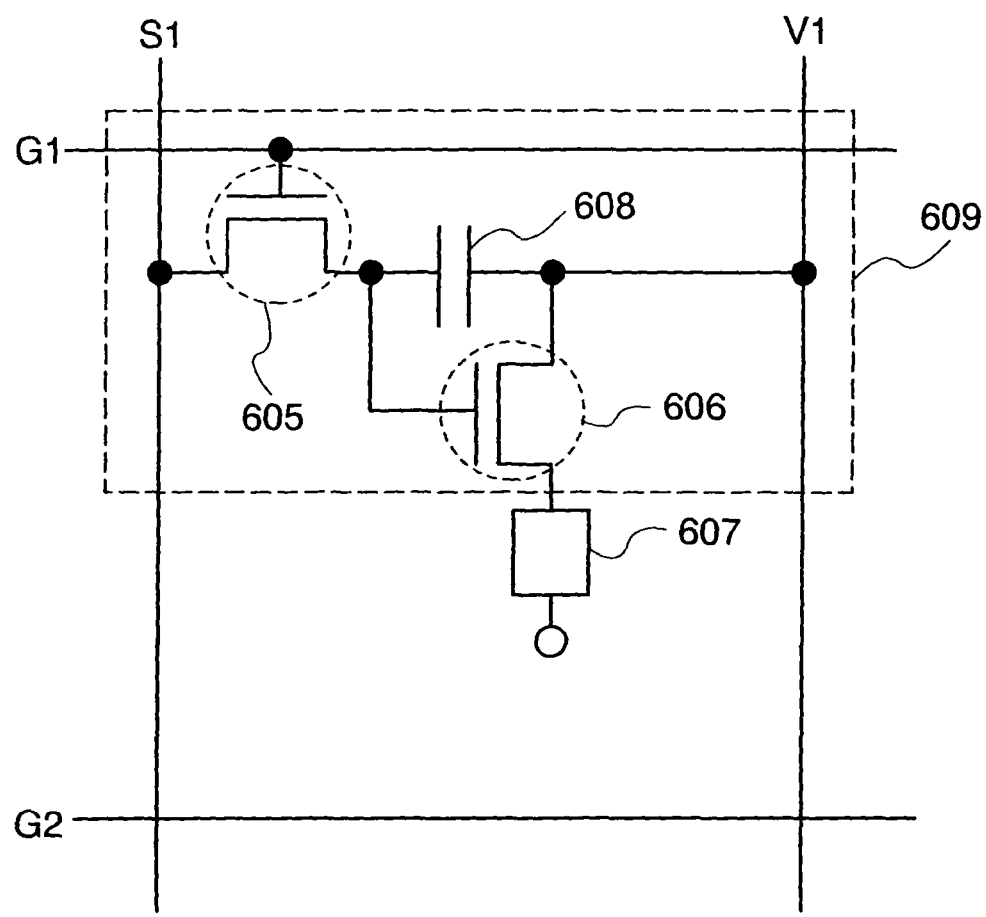
FIG. 12 illustrates an exemplary pixel of an active matrix light-emitting device.

FIG. 12 is a magnified view of the pixel 604. The pixel 604 includes a switching transistor for selecting a pixel (hereinafter called a switching transistor) 605, a light-emitting element 607, a transistor for driving the light-emitting element 607 (hereinafter called a driving transistor) 606, and a capacitor 608.

A gate electrode of the switching transistor 605 is connected to the gate signal line G (G1 to Gx), and one of either a source or drain region of the switching transistor 605 is connected to the source signal line S (S1 to Sx), while the other is connected to a gate electrode of the driving transistor 606 and a first electrode of the capacitor 608.

The capacitor 608 is provided to hold the gate voltage (a potential difference between the gate electrode and a source region) of the driving transistor 606 when the switching transistor 605 is not selected (off state). Although this embodiment mode illustrates a configuration having the capacitor 608, the invention is not limited to this, and a configuration without capacitor 608 may be employed as well.

One of either the source region or a drain region of the driving transistor 606 is connected to the power supply line V (V1 to Vx), while the other is connected to one electrode of the light-emitting element 607. The power supply line V is connected to a second electrode of the capacitor 608.

A counter potential is supplied to the other electrode of the light-emitting element 607, while a power source potential is supplied to the power supply line V. The power source potential and the counter potential are supplied from a power source which is provided in an external IC or the like of the light-emitting device of the invention.

Each of the switching transistor 605 and the driving transistor 606 may be either an n-channel transistor or a p-channel transistor. However, the driving transistor 606 is desirably a p-channel transistor when the source or drain region of the driving transistor 606 is connected to an anode of the light-emitting element 607. On the other hand, the driving transistor 606 is desirably an n-channel transistor when the source or drain region of the driving transistor 606 is connected to a cathode of the light-emitting element 607.

Each of the switching transistor 605 and the driving transistor 606 may have a multi-gate structure such as a double-gate structure or a triple-gate structure as well as a single-gate structure.

In an active matrix light-emitting device with the aforementioned configuration in this embodiment mode, the light-emitting element 607 is formed over a first substrate, while a pixel circuit 609 for driving the light-emitting element 607 is formed over a second substrate. Then, the light-emitting element 607 and the pixel circuit 609 for driving the light-emitting element 607 are electrically connected. That is, the light-emitting element 607 is formed over the first substrate, while the source signal lines (S1 to Sx), the gate signal lines (G1 to Gy), the power supply lines (V1 to Vx), the switching transistor 605, the driving transistor 606, and the capacitor 608 which are included in the pixel circuit 609 are formed over the second substrate. Then, the light-emitting element 607 and the driving transistor 606 are electrically connected.

Figure 1:
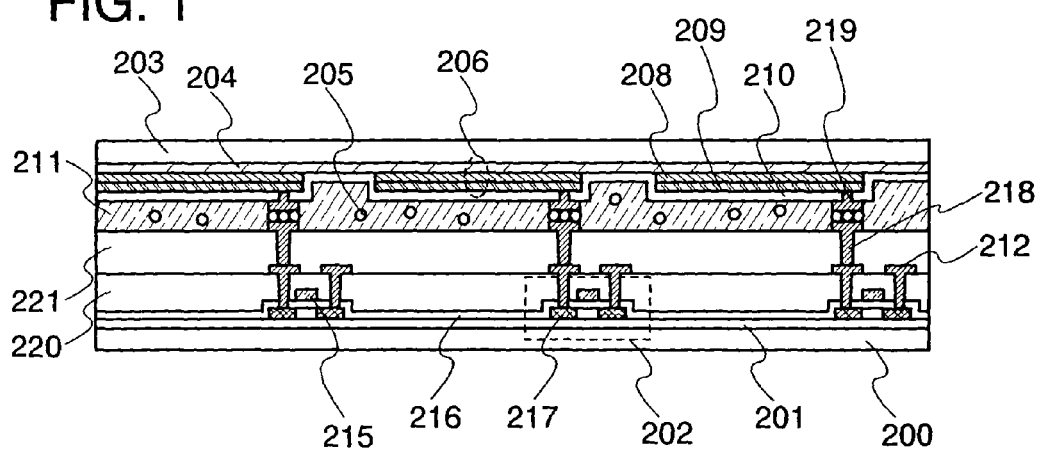
FIG. 1 illustrates Embodiment Mode 1.

FIG. 1 shows a partial cross section of a light-emitting device of this embodiment mode. FIG. 1 shows a case where transistors included in the pixel circuit 609 are thin film transistors.

In FIG. 1, a first substrate 203 over which a plurality of light-emitting elements 206 are formed, and a second substrate 200 over which a plurality of thin film transistors 202 are formed are provided to face each other. Note that in this embodiment mode, the first substrate 203 and the second substrate 200 are attached to each other so that the second substrate 200 faces a surface of the first substrate 203 where the light-emitting elements are formed. Accordingly, the second substrate 200 functions as a sealing substrate.

The light-emitting element 206 in FIG. 1 corresponds to the light-emitting element 607 in FIG. 12. In addition, the thin film transistor 202 in FIG. 1 corresponds to the driving transistor 606 in FIG. 12.

Note that the structure of the thin film transistors formed over the second substrate is not limited to the one shown in FIG. 1, and any known structure of a thin film transistor may be employed.

In addition, although FIG. 1 shows a case where each transistor included in the pixel circuit 609 is a thin film transistor, it may be a transistor other than the thin film transistor. For example, the pixel circuit over the second substrate 200 may be formed by using a semiconductor substrate as the second substrate 200 and by forming a MOS transistor and the like on the semiconductor substrate.

Although the cross section in FIG. 1 shows only a portion where the driving transistor 606 is formed over the second substrate 200, elements included in the pixel circuit 609 other than the driving transistor 606 (e.g., the switching transistor 605 and the capacitor 608) are also formed over the second substrate 200.

Each of the first substrate 203 and the second substrate 200 may be a light-transmissive substrate such as a glass substrate, a quartz substrate, or a light-transmissive resin substrate.

Note that in the case of forming the light-emitting element 206 to have a structure where the light emitted from the light-emitting element 206 travels only in the direction of the first substrate 203, the second substrate 200 is not necessarily required to be a light-transmissive substrate. Accordingly, the second substrate 200 may be a substrate which does not transmit light such as a resin substrate having no light transmissivity, a semiconductor substrate, a ceramic substrate, or a metal substrate.

In the case of forming the light-emitting element 206 to have a structure where the light emitted from the light-emitting element 206 travels only in the direction of the second substrate 200, the first substrate 203 is not necessarily required to be a light-transmissive substrate. Accordingly, the first substrate 203 may be a substrate which does not transmit light such as a resin substrate having no light transmissivity, a semiconductor substrate, a ceramic substrate, or a metal substrate.

In addition, the first substrate 203 and the second substrate 200 may be the aforementioned substrates but are formed to be thin enough to have flexibility.

The light-emitting element 206 formed over the first substrate 203 includes a first electrode 204, a layer 208 containing a light-emitting substance, and a second electrode 209.

The first electrode 204 is formed over the first substrate 203 as a common electrode for all of the light-emitting elements. Then, the layer 208 containing a light-emitting substance is formed over the first electrode 204, and the second electrode 209 is formed over the layer 208 containing a light-emitting substance. An insulating film 210 is formed over the second electrode 209, and an electrode 219, which is electrically connected to the second electrode 209, is formed over the insulating film 210.

In the case of forming the light-emitting element 206 to have a structure where the light emitted from the light-emitting element 206 travels only in the direction of the first substrate 203, the first electrode 204 is formed of a light-transmissive conductive film. In this case, the first electrode 204 may be formed using, for example, a light-transmissive conductive film such as indium tin oxide (ITO) or IZO (Indium Zinc Oxide) which is a mixture of indium oxide and zinc oxide, a metal film which is formed to be thin enough to transmit light, or the like, while the second electrode 209 may be formed using a metal film such as an aluminum film (which includes an aluminum alloy film and an aluminum film containing an additive).

In the case of forming the light-emitting element 206 to have a structure where the light emitted from the light-emitting element 206 travels only in the direction of the second substrate 200, the second electrode 209 is formed of a light-transmissive conductive film. In this case, the first electrode 204 may be formed using, for example, a metal film such as an aluminum film (which includes an aluminum alloy film and an aluminum film containing an additive), while the second electrode 209 may be formed using a light-transmissive conductive film such as indium tin oxide (ITO) or IZO (Indium Zinc Oxide) which is a mixture of indium oxide and zinc oxide, a metal film which is formed to be thin enough to transmit light, or the like.

In the case of forming the light-emitting element 206 to have a structure where the light emitted from the light-emitting element 206 travels in both directions of the first substrate 203 and the second substrate 200, each of the first electrode 204 and the second electrode 209 is formed of a light-transmissive conductive film. For example, the first electrode 204 and the second electrode 209 may be formed by using a light-transmissive conductive film such as indium tin oxide (ITO) or IZO (Indium Zinc Oxide) which is a mixture of indium oxide and zinc oxide, a metal film which is formed to be thin enough to transmit light, or the like.

The materials for the first electrode 204 and the second electrode 209 are required to be selected in consideration of work functions. Note that either of the first electrode 204 or the second electrode 209 may serve as an anode or a cathode depending on the structure of a pixel circuit.

The layer 208 containing a light-emitting substance is a layer containing a light-emitting material which emits light when a voltage is applied thereto, and may have a known layer structure. When the light-emitting element is an organic EL element, the following layer structures can be given as examples. For example, when the first electrode 204 is used as an anode, an HIL (Hole Injecting Layer), an HTL (Hole Transporting Layer), an EML (light EMitting Layer), an ETL (Electron Transporting Layer), and an EIL (Electron Injection Layer) may be formed in this order over the first electrode 204. On the other hand, when the first electrode 204 is used as a cathode, an EIL (Electron Injecting Layer), an ETL (Electron Transporting Layer), an EML (light EMitting Layer), an HTL (Hole Transporting Layer), and an HIL (Hole Injecting Layer) may be formed in this order over the first electrode 204, or alternatively, an ETL (Electron Transporting Layer), an EML (light EMitting Layer), and an HTL (Hole Transporting Layer) may be formed in this order over the first electrode 204.

As a light-emitting substance included in the layer 208 containing a light-emitting substance, there are a material which emits light through energy conversion upon returning from a singlet excited state to a ground state (fluorescent material), and a material which emits light through energy conversion upon returning from a triplet excited state to a ground state (phosphorescent material). Either of the light-emitting substances may be used as the light-emitting material for the light-emitting device of the invention.

The thin film transistor (driving transistor) 202 for driving the light-emitting element 206 is formed over the second substrate 200 which is provided to face the first substrate 203. In FIG. 1, the thin film transistor 202 includes a semiconductor film 217 formed over the second substrate with a base film 201 sandwiched therebetween, a gate insulating film 216, and a gate electrode 215.

A first interlayer insulating film 220 is formed over the thin film transistor 202, and an electrode 212, which is electrically connected to the semiconductor film 217 of the thin film transistor 202, is formed over the first interlayer insulating film 220. Then, a second interlayer insulating film 221 is formed over the electrode 212, and an electrode 218, which is electrically connected to the electrode 212, is formed over the second interlayer insulating film 221. Accordingly, the electrode 218 is electrically connected to the thin film transistor 202.

The first substrate 203 and the second substrate 200 having the aforementioned structures are attached to each other with an anisotropic conductive film 211. As the anisotropic conductive film 211, ACP (Anisotropic Conductive Paste), an ACF (Anisotropic Conductive Film), and the like can be given as examples. By attaching the first substrate 203 and the second substrate 200 to each other with the anisotropic conductive film 211, the electrodes 218 and 219 are electrically connected through a conductive particle 205 included in the anisotropic conductive film 211. That is, the light-emitting element 206 formed over the first substrate 203 and the thin film transistor 202 formed over the second substrate 200 are electrically connected.

Although FIG. 1 shows an example where the electrodes 218 and 219 are electrically connected by attaching the first substrate 203 and the second substrate 200 to each other with the anisotropic conductive film 211, the method for electrically connecting the electrodes 218 and 219 is not particularly limited to this, and any known connection method may be employed. For example, the electrodes 218 and 219 may be electrically connected by using NCP (Non-Conductive Paste) or eutectic bonding with supersonic waves.

In addition, a spacer may be provided between the first substrate 203 and the second substrate 200 as appropriate when attaching the first substrate 203 and the second substrate 200 to each other.

Although FIG. 1 does not specifically show a connection between the first electrode 204 of the light-emitting element 206 and a power source, a counter potential is supplied to the first electrode 204 by providing a connecting terminal electrically connected to the first electrode 204 around the pixel portion 601 or in an outer region of the source signal line driver circuit 602 and the gate signal line driver circuit 603, and connecting the connecting terminal to an external power source provided in an IC or the like.

Although the description has been made heretofore of a case where the pixel circuit 609 shown in FIG. 12 is used as an example of a pixel circuit for driving a light-emitting element provided in each pixel, the structure thereof is not limited to this. The structure of the pixel circuit 609 shown in FIG. 12 is illustrative only, and therefore, this embodiment mode can be implemented in various other pixel circuits.

The pixel circuit 609 shown in FIG. 12 has a circuit configuration where the light-emitting element 607 is connected to the driving transistor 606 as a thin film transistor for driving the light-emitting element 607. Accordingly, the light-emitting element 607 and the driving transistor 606 are electrically connected through an anisotropic conductive film. Thus, when applying the invention to other pixel circuit configurations, it is only required that an element that is to be connected to a light-emitting element be electrically connected to the light-emitting element through an anisotropic conductive film. In most of the pixel circuits, an element connected to a light-emitting element is a thin film transistor for driving the light-emitting element. Thus, in most cases, a light-emitting element and a transistor for driving the light-emitting element are electrically connected through an anisotropic conductive film.

Description is made below of manufacturing steps of the components over the first substrate 203 of a light-emitting device which has the cross-sectional structure shown in FIG. 1.

Figure 24A:
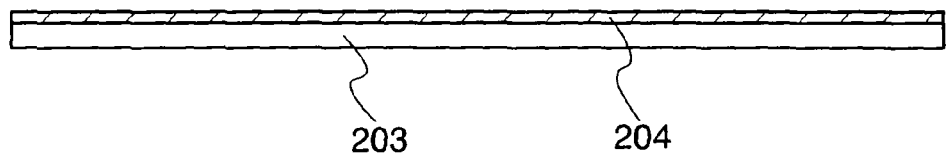
FIGS. 24A to 24D illustrate manufacturing steps in Embodiment Mode 1.

First, as shown in FIG. 24A, the first electrode 204 is formed over the first substrate 203. The first electrode 204 may be formed with the aforementioned materials selected as appropriate according to the structure of the light-emitting element.

Figure 24B:
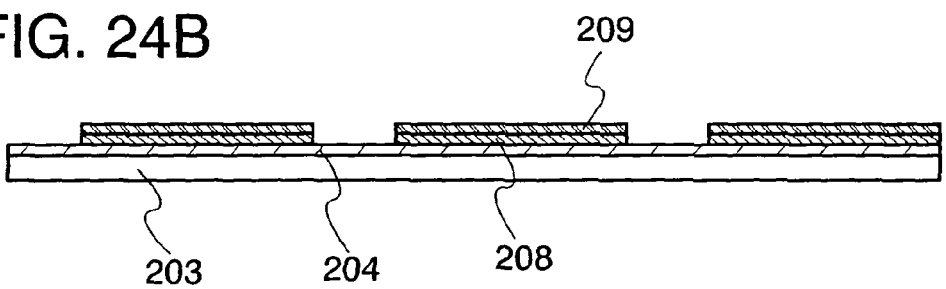

Then, as shown in FIG. 24B, the layer 208 containing a light-emitting substance is formed over the first electrode 204 by vapor deposition using a metal mask. Then, the second electrode 209 is formed over the layer 208 containing a light-emitting substance by vapor deposition using a metal mask. As a method for forming the layer 208 containing a light-emitting substance and the second electrode 209, ink-jet method, printing, or the like may be used in addition to the method using a metal mask.

Figure 24C:
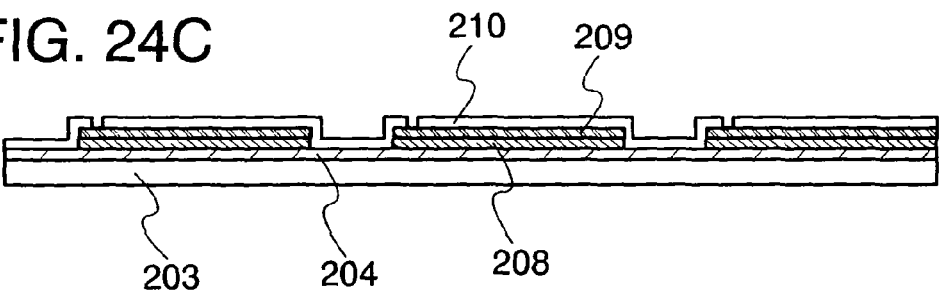

As shown in FIG. 24C, an insulating film 210 having an opening for exposing the second electrode 209 is formed over the first electrode 204, the layer 208 containing a light-emitting substance, and the second electrode 209. The insulating film 210 may be formed to have either a single-layer structure or a stacked-layer structure, using an inorganic material (e.g., silicon oxide, silicon nitride, silicon oxynitride, or a DLC film), a photosensitive or non-photosensitive organic material (e.g., polyimide, acrylic, polyamide, polyimide amide, resist, or benzocyclobutene), or siloxane (a material having a skeletal structure with a bond of silicon (Si) and oxygen (O). As a substituent of siloxane, an organic group containing at least hydrogen (e.g., an alkyl group or aromatic hydrocarbon) is used. Alternatively, a fluoro group may be used as the substituent, or both a fluoro group and an organic group containing at least hydrogen may be used as the substituent). In particular, when silicon nitride, silicon oxynitride, a DLC film, or the like is used, moisture, oxygen, and other impurities can be prevented from entering the light-emitting element 206 from outside.

Figure 24D:
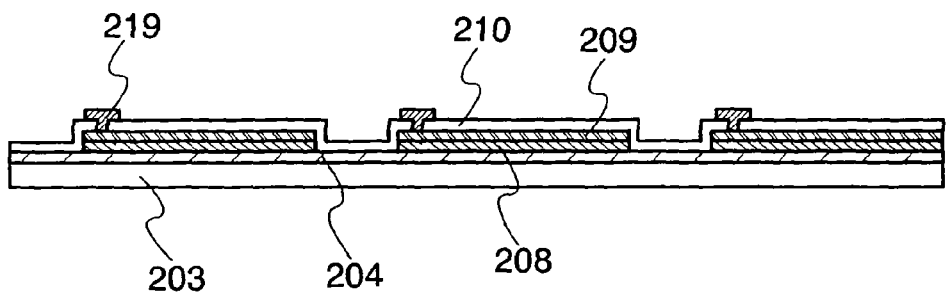

Then, as shown in FIG. 24D, the electrode 219 is formed to be electrically connected to the second electrode 209.

As a method for forming the electrode 219 electrically connected to the second electrode 209, the following method can be used in addition to the method described with reference to FIGS. 24C and 24D.

Figure 25A:
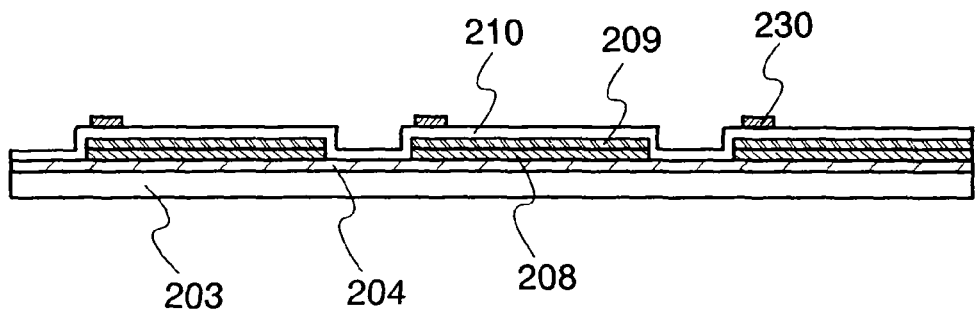
FIGS. 25A to 25C illustrate manufacturing steps in Embodiment Mode 1.

After the state shown in FIG. 24B is obtained through the aforementioned manufacturing steps, the insulating film 210 is formed over the first electrode 204, the layer 208 containing a light-emitting substance, and the second electrode 209 as shown in FIG. 25A, and then a conductive film 230 is formed over the insulating film 210 to have a thickness of 1 to several ten μm, or preferably 10 to 20 μm. The conductive film 230 may be formed by, for example, screen printing using solder or a conductive material such as Au paste, Ag paste, Cu paste, Ni paste, or Al paste.

Figure 25B:
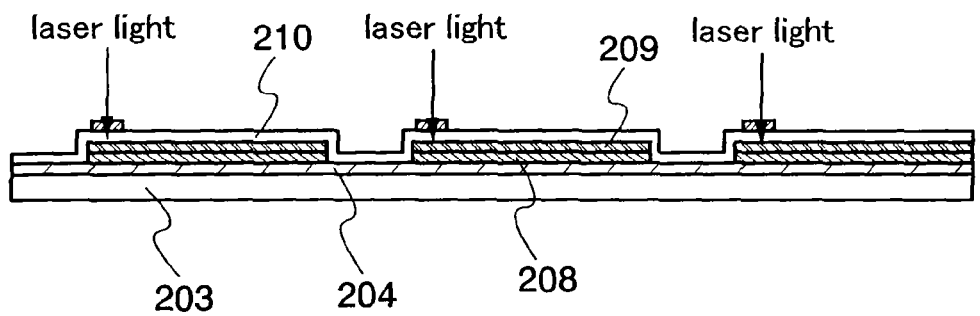
Figure 25C:
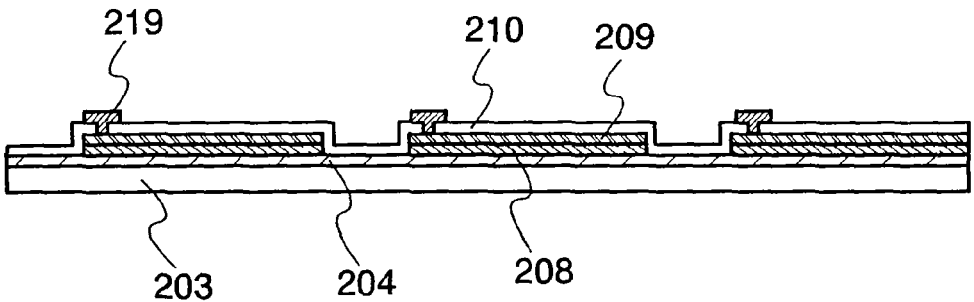

Then, as shown in FIG. 25B, the conductive film 230 is irradiated with laser. At this time, the laser output is adjusted so that the conductive film 230 penetrates the insulating film 210 to reach the second electrode 209. Accordingly, the electrode 219 electrically connected to the second electrode 209 is formed as shown in FIG. 25C.

Note that this embodiment mode can be implemented in combination with the techniques described in other embodiment modes as appropriate.

Embodiment Mode 2

In this embodiment mode, description is made of the second example of an active matrix light-emitting device, where a light-emitting element formed over a first substrate and a transistor formed over a second substrate are electrically connected. That is, description is made of the second example of a case where the light-emitting device with the first structure of the invention is an active matrix light-emitting device.

The light-emitting device in this embodiment mode has a light-emitting element with a cross-sectional structure which differs from that shown in Embodiment Mode 1. Note that description will be made by using the pixel circuit 609 shown in FIG. 12 as an illustrative configuration of a pixel circuit as in Embodiment Mode 1.

In the light-emitting device shown in this embodiment mode, the structure of the components over the second substrate is similar to that in Embodiment Mode 1; therefore, description of the second substrate is omitted, and the same components as those in Embodiment Mode 1 are denoted by the same reference numerals.

Note that in this embodiment mode, transistors included in the pixel circuit 609 may be transistors other than thin film transistors as in Embodiment Mode 1. For example, the pixel circuit over the second substrate may be formed by using a semiconductor substrate as the second substrate and by forming a MOS transistor and the like on the semiconductor substrate.

Figure 2:
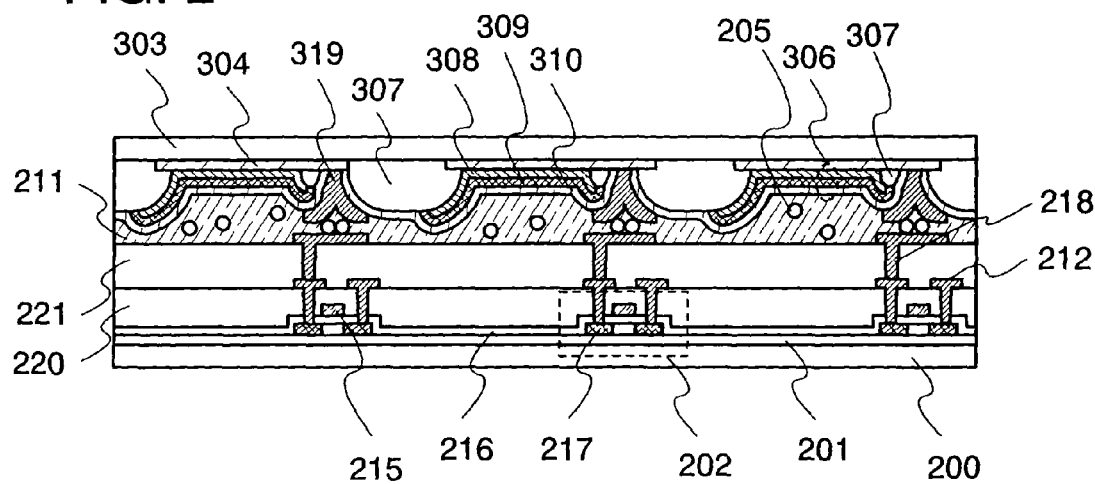
FIG. 2 illustrates Embodiment Mode 2.

FIG. 2 shows a partial cross section of a light-emitting device in this embodiment mode. In FIG. 2, a first substrate 303 over which a plurality of light-emitting elements 306 are formed, and a second substrate 200 over which a plurality of thin film transistors 202 are formed are provided to face each other. Note that in this embodiment mode, the first substrate 303 and the second substrate 200 are attached to each other so that the second substrate 200 faces a surface of the first substrate 303 where the light-emitting elements are formed. Accordingly, the second substrate 200 functions as a sealing substrate.

The light-emitting element 306 in FIG. 2 corresponds to the light-emitting element 607 in FIG. 12. In addition, the thin film transistor 202 in FIG. 2 corresponds to the driving transistor 606 in FIG. 12.

Each of the first substrate 303 and the second substrate 200 may be a light-transmissive substrate such as a glass substrate, a quartz substrate, or a light-transmissive resin substrate. Note that in the case of forming the light-emitting element 306 to have a structure where the light emitted from the light-emitting element 306 travels only in the direction of the first substrate 303, the second substrate 200 is not necessarily required to be a light-transmissive substrate. Accordingly, the second substrate 200 may be a substrate which does not transmit light such as a resin substrate having no light transmissivity, a semiconductor substrate, a ceramic substrate, or a metal substrate.

In the case of forming the light-emitting element 306 to have a structure where the light emitted from the light-emitting element 306 travels only in the direction of the second substrate 200, the first substrate 303 is not necessarily required to be a light-transmissive substrate. Accordingly, the first substrate 303 may be a substrate which does not transmit light such as a resin substrate having no light transmissivity, a semiconductor substrate, a ceramic substrate, or a metal substrate.

In addition, the first substrate 303 and the second substrate 200 may be the aforementioned substrates but are formed to be thin enough to have flexibility.

The light-emitting element 306 formed over the first substrate 303 includes a first electrode 304, a layer 308 containing a light-emitting substance, and a second electrode 309.

The first electrode 304 is formed over the first substrate 303. Then, a first insulating film 307 is formed over the first substrate 303 so as to cover edges of the first electrode 304. Then, the layer 308 containing a light-emitting substance is formed over the first electrode 304, and the second electrode 309 is formed over the layer 308 containing a light-emitting substance. The layer 308 containing a light-emitting substance and the second electrode 309 are partially formed over the first insulating film 307. Then, a second insulating film 310 is formed over the second electrode 309, and an electrode 319, which is electrically connected to the second electrode 309, is formed over the second insulating film 310 positioned over the first insulating film 307.

The materials used for the first electrode 304 and the second electrode 309 and the like may be selected from those described in Embodiment Mode 1. In addition, the layer 308 containing a light-emitting substance may have a known layer structure as has been described in Embodiment Mode 1.

The first substrate 303 and the second substrate 200 having the aforementioned structures are attached to each other with an anisotropic conductive film 211. As the anisotropic conductive film 211, ACP (Anisotropic Conductive Paste), an ACF (Anisotropic Conductive Film), and the like can be given as examples. By attaching the first substrate 303 and the second substrate 200 to each other with the anisotropic conductive film 211, the electrodes 218 and 319 are electrically connected through a conductive particle 205 included in the anisotropic conductive film 211. That is, the light-emitting element 306 formed over the first substrate 303 and the thin film transistor 202 formed over the second substrate 200 are electrically connected.

Although FIG. 2 shows an example where the electrodes 218 and 319 are electrically connected by attaching the first substrate 303 and the second substrate 200 to each other with the anisotropic conductive film 211, the method for electrically connecting the electrodes 218 and 319 is not particularly limited to this, and any known connection method may be employed. For example, the electrodes 218 and 319 may be electrically connected by using NCP (Non-Conductive Paste) or eutectic bonding with supersonic waves.

In addition, a spacer may be provided between the first substrate 303 and the second substrate 200 as appropriate when attaching the first substrate 303 and the second substrate 200 to each other.

Although FIG. 2 does not specifically show a connection between the first electrode 304 of the light-emitting element 306 and a power source, a counter potential is supplied to the first electrode 304 by providing a connecting terminal electrically connected to the first electrode 304 around the pixel portion 601 or in an outer region of the source signal line driver circuit 602 and the gate signal line driver circuit 603, and connecting the connecting terminal to an external power source provided in an IC or the like.

Although the description has been made heretofore of a case where the pixel circuit 609 shown in FIG. 12 is used as an example of a pixel circuit for driving a light-emitting element provided in each pixel, the structure thereof is not limited to this. The structure of the pixel circuit 609 shown in FIG. 12 is illustrative only, and therefore, this embodiment mode can be implemented in various other pixel circuits.

The pixel circuit 609 shown in FIG. 12 has a circuit configuration where the light-emitting element 607 is connected to the driving transistor 606 as a thin film transistor for driving the light-emitting element 607. Accordingly, the light-emitting element 607 and the driving transistor 606 are electrically connected through an anisotropic conductive film. Thus, when applying the invention to other pixel circuit configurations, it is only required that an element that is to be connected to a light-emitting element be electrically connected to the light-emitting element through an anisotropic conductive film. In most of the pixel circuits, an element connected to a light-emitting element is a thin film transistor for driving the light-emitting element. Thus, in most cases, a light-emitting element and a transistor for driving the light-emitting element are electrically connected through an anisotropic conductive film.

Description is made below of manufacturing steps of the components over the first substrate 303 of a light-emitting device which has the cross-sectional structure shown in FIG. 2.

Figure 26A:
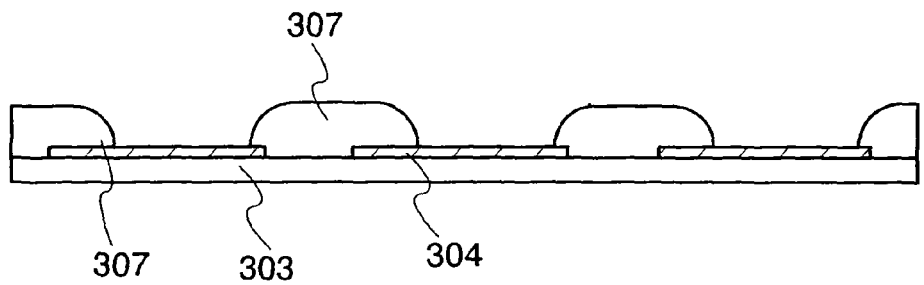
FIGS. 26A to 26D illustrate manufacturing steps in Embodiment Mode 2.

First, as shown in FIG. 26A, the first electrode 304 is formed over the first substrate 303, and then the first insulating film 307 is formed so as to cover edges of the first electrode 304.

The first electrode 304 may be formed by selecting the materials described in the embodiment mode 1 as appropriate according to the structure of the light-emitting element.

The first insulating film 307 may be formed to have either a single-layer structure or a stacked-layer structure, using an inorganic material (e.g., silicon oxide, silicon nitride, silicon oxynitride, or a DLC film), a photosensitive or non-photosensitive organic material (e.g., polyimide, acrylic, polyamide, polyimide amide, resist, or benzocyclobutene), or siloxane (a material having a skeletal structure with a bond of silicon (Si) and oxygen (O). As a substituent of siloxane, an organic group containing at least hydrogen (e.g., an alkyl group or aromatic hydrocarbon) is used. Alternatively, a fluoro group may be used as the substituent, or both a fluoro group and an organic group containing at least hydrogen may be used as the substituent). The first insulating film 307 preferably has a shape that the curvature radius continuously changes. By forming such a shape, the coverage of the first insulating film 307 with the layer 308 containing a light-emitting substance and the second electrode 309 can be improved.

Figure 26B:
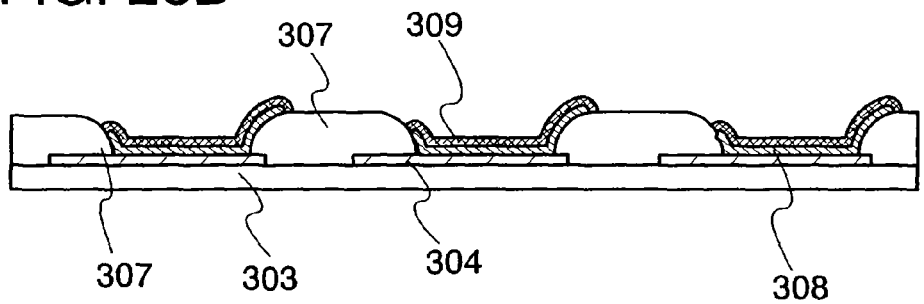

Next, as shown in FIG. 26B, the layer 308 containing a light-emitting substance is formed over the first electrode 304 and the first insulating film 307 by vapor deposition using a metal mask, and then the second electrode 309 is formed over the layer 308 containing a light-emitting substance by vapor deposition using a metal mask. As a method for forming the layer 308 containing a light-emitting substance and the second electrode 309, ink-jet method, printing, or the like may be used in addition to the method using a metal mask.

Figure 26C:
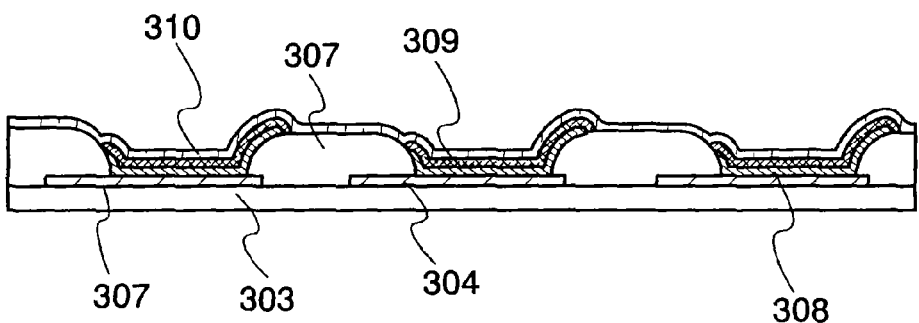

As shown in FIG. 26C, the second insulating film 310 is formed over the second electrode 309 and the first insulating film 307. The second insulating film 310 may be formed to have either a single-layer structure or a stacked-layer structure, using an inorganic material (e.g., silicon oxide, silicon nitride, silicon oxynitride, or a DLC film), a photosensitive or non-photosensitive organic material (e.g., polyimide, acrylic, polyamide, polyimide amide, resist, or benzocyclobutene), or siloxane (a material having a skeletal structure with a bond of silicon (Si) and oxygen (O). As a substituent of siloxane, an organic group containing at least hydrogen (e.g., an alkyl group or aromatic hydrocarbon) is used. Alternatively, a fluoro group may be used as the substituent, or both a fluoro group and an organic group containing at least hydrogen may be used as the substituent). In particular, when silicon nitride, silicon oxynitride, a DLC film, or the like is used, moisture, oxygen, and other impurities can be prevented from entering the light-emitting element 306 from outside.

Figure 26D:
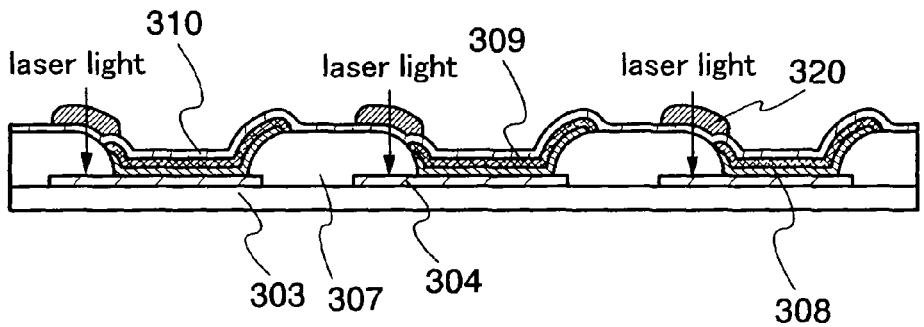

Then, as shown in FIG. 26D, a conductive film 320 is formed to have a thickness of 1 to several ten μm, or preferably 10 to 20 μm, over the second insulating film 310 positioned over the first insulating film 307. The conductive film 320 may be formed by, for example, screen printing using solder or a conductive material such as Au paste, Ag paste, Cu paste, Ni paste, or Al paste.

Figure 27:
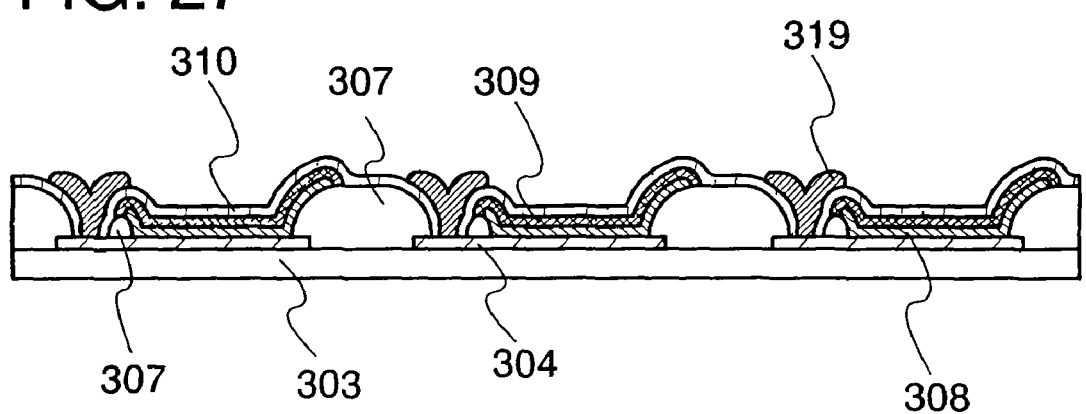
FIG. 27 illustrates a manufacturing step in Embodiment Mode 2.

Then, the conductive film 320 is irradiated with laser. At this time, the laser output is adjusted so that the conductive film 320 penetrates the second insulating film 310 and the first insulating film 307 to reach the first electrode 304. Accordingly, the electrode 319 electrically connected to the first electrode 304 is formed as shown in FIG. 27.

Note that this embodiment mode can be implemented in combination with the techniques described in other embodiment modes as appropriate.

Embodiment Mode 3

In this embodiment mode, description is made of the third example of an active matrix light-emitting device, where a light-emitting element formed over a first substrate and a transistor formed over a second substrate are electrically connected. That is, description is made of the third example of a case where the light-emitting device with the first structure of the invention is an active matrix light-emitting device.

The light-emitting device in this embodiment mode has a light-emitting element with a cross-sectional structure which differs from that shown in Embodiment Modes 1 and 2. Note that description will be made by using the pixel circuit 609 shown in FIG. 12 as an illustrative configuration of a pixel circuit as in Embodiment Modes 1 and 2.

In the light-emitting device shown in this embodiment mode, the structure of the components over the second substrate is similar to that in Embodiment Mode 1; therefore, description of the second substrate is omitted, and the same components as those in Embodiment Mode 1 are denoted by the same reference numerals.

Note that in this embodiment mode, transistors included in the pixel circuit 609 may be transistors other than thin film transistors as in Embodiment Mode 1. For example, the pixel circuit over the second substrate may be formed by using a semiconductor substrate as the second substrate and by forming a MOS transistor and the like over the semiconductor substrate.

Figure 3:
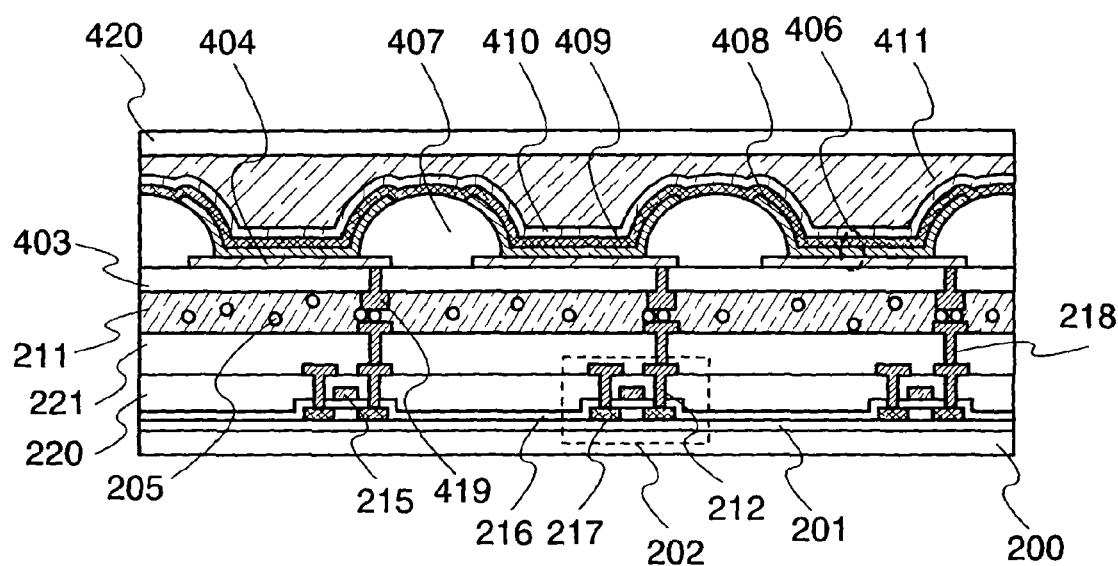
FIG. 3 illustrates Embodiment Mode 3.

FIG. 3 shows a partial cross section of a light-emitting element in this embodiment mode. In FIG. 3, a first substrate 403 over which a plurality of light-emitting elements 406 are formed, and a second substrate 200 over which a plurality of thin film transistors 202 are formed are provided to face each other. In addition, a third substrate 420 is provided to face the first substrate 403.

Although Embodiment Modes 1 and 2 have each illustrated a structure where the surface of the first substrate where the light-emitting elements are formed is provided to face the second substrate, this embodiment mode illustrates a structure where a surface of the first substrate where no light-emitting element is formed is provided to face the second substrate. Accordingly, the third substrate 420 having a sealing function is provided to face the surface of the first substrate 403 where the light-emitting elements are formed, in order to seal the surface of the first substrate 403 where the light-emitting elements are formed.

The light-emitting element 406 in FIG. 3 corresponds to the light-emitting element 607 in FIG. 12. In addition, the thin film transistor 202 in FIG. 3 corresponds to the driving transistor 606 in FIG. 12.

Although the cross section in FIG. 3 shows only a portion where the driving transistor 606 is formed over the second substrate 200, elements included in the pixel circuit 609 other than the driving transistor 606 (e.g., the switching transistor 605 and the capacitor 608) are also formed over the second substrate 200.

Each of the first substrate 403, the second substrate 200, and the third substrate 420 may be a light-transmissive substrate such as a glass substrate, a quartz substrate, or a light-transmissive resin substrate. Note that in this embodiment mode, the first substrate 403 is preferably formed to be not thicker than 100 μm, and more preferably be in the range of 20 to 50 μm, because an electrode which is electrically connected to one of the electrodes of the light-emitting element is formed on the side of the first substrate 403 where no light-emitting element is formed.

Note that in the case of forming the light-emitting element 406 to have a structure where the light emitted from the light-emitting element 406 travels only in the direction of the third substrate 420, the first substrate 403 and the second substrate 200 are not necessarily required to be light-transmissive substrates. Accordingly, each of the first substrate 403 and the second substrate 200 may be a substrate which does not transmit light such as a resin substrate having no light transmissivity, a semiconductor substrate, a ceramic substrate, or a metal substrate.

In the case of forming the light-emitting element 406 to have a structure where the light emitted from the light-emitting element 406 travels only in the direction of the second substrate 200, the third substrate 420 is not necessarily required to be a light-transmissive substrate. Accordingly, the third substrate 420 may be a substrate which does not transmit light such as a resin substrate having no light transmissivity, a semiconductor substrate, a ceramic substrate, or a metal substrate.

In addition, the first substrate 403 and the second substrate 200 may be the aforementioned substrates but are formed to be thin enough to have flexibility.

The light-emitting element 406 formed over the first substrate 403 includes a first electrode 404, a layer 408 containing a light-emitting substance, and a second electrode 409.

A first insulating film 407 is formed so as to cover edges of the first electrode 404. Then, the layer 408 containing a light-emitting substance is formed over the first electrode 404 and the first insulating film 407, and the second electrode 409 is formed over the layer 408 containing a light-emitting substance. Accordingly, the layer 408 containing a light-emitting substance and the second electrode 409 are partially formed over the first insulating film 407. Note that the second electrode 409 is formed as a common electrode for all of the light-emitting elements.

An electrode 419 electrically connected to the first electrode 404 is formed on the side of the first substrate 403 where no light-emitting element 406 is formed.

The first substrate 403 is sealed by the third substrate 420. In FIG. 3, the third substrate 420 having a sealing function is attached to the first substrate 403 with an adhesive 411, so that the third substrate 420 faces a surface of the first substrate 403 where the light-emitting element 406 is formed. Although FIG. 3 shows the case where the first substrate 403 and the third substrate 420 are attached to each other with the adhesive 411 formed in the entire gap between the first substrate 403 and the third substrate 420, other known sealing methods may be employed as well.

Note that the materials used for the first electrode 404 and the second electrode 409 and the like may be selected from those described in Embodiment Mode 1. In addition, the layer 408 containing a light-emitting substance may have a known layer structure as has been described in Embodiment Mode 1.

The first substrate 403 and the second substrate 200 having the aforementioned structures are attached to each other with an anisotropic conductive film 211. As the anisotropic conductive film 211, ACP (Anisotropic Conductive Paste), an ACF (Anisotropic Conductive Film), and the like can be given as examples. By attaching the first substrate 403 and the second substrate 200 to each other with the anisotropic conductive film 211, the electrodes 218 and 419 are electrically connected through a conductive particle 205 included in the anisotropic conductive film 211. That is, the light-emitting element 406 formed over the first substrate 403 and the thin film transistor 202 formed over the second substrate 200 are electrically connected.

Although FIG. 3 shows an example where the electrodes 218 and 419 are electrically connected by attaching the first substrate 403 and the second substrate 200 to each other with the anisotropic conductive film 211, the method for electrically connecting the electrodes 218 and 419 is not particularly limited to this, and any known connection method may be employed. For example, the electrodes 218 and 419 may be electrically connected by using NCP (Non-Conductive Paste) or eutectic bonding with supersonic waves.

In addition, a spacer may be provided between the first substrate 403 and the second substrate 200 as appropriate when attaching the first substrate 403 and the second substrate 200 to each other.

Although FIG. 3 does not specifically show a connection between the first electrode 404 of the light-emitting element 406 and a power source, a counter potential is supplied to the first electrode 404 by providing a connecting terminal electrically connected to the first electrode 404 around the pixel portion 601 or in an outer region of the source signal line driver circuit 602 and the gate signal line driver circuit 603, and connecting the connecting terminal to an external power source provided in an IC or the like.

Although the description has been made heretofore of a case where the pixel circuit 609 shown in FIG. 12 is used as an example of a pixel circuit for driving a light-emitting element provided in each pixel, the structure thereof is not limited to this. The structure of the pixel circuit 609 shown in FIG. 12 is illustrative only, and therefore, this embodiment mode can be implemented in various other pixel circuits.

The pixel circuit 609 shown in FIG. 12 has a circuit configuration where the light-emitting element 607 is connected to the driving transistor 606 as a thin film transistor for driving the light-emitting element 607. Accordingly, the light-emitting element 607 and the driving transistor 606 are electrically connected through an anisotropic conductive film. Thus, when applying the invention to other pixel circuit configurations, it is only required that an element that is to be connected to a light-emitting element be electrically connected to the light-emitting element through an anisotropic conductive film. In most of the pixel circuits, an element connected to a light-emitting element is a thin film transistor for driving the light-emitting element. Thus, in most cases, a light-emitting element and a transistor for driving the light-emitting element are electrically connected through an anisotropic conductive film.

Description is made below of manufacturing steps of the components over the first substrate 403 of a light-emitting device which has the cross-sectional structure shown in FIG. 3.

Figure 28A:
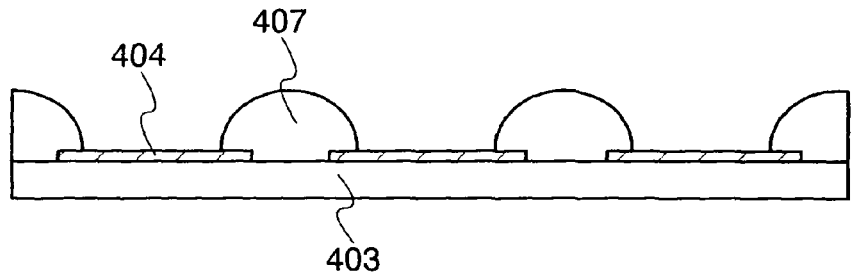
FIGS. 28A to 28D illustrate manufacturing steps in Embodiment Mode 3.

First, as shown in FIG. 28A, the first electrode 404 is formed over the first substrate 403, and then the first insulating film 407 is formed so as to cover edges of the first electrode 404.

The first electrode 404 may be formed with the aforementioned materials selected as appropriate according to the structure of the light-emitting element.

The first insulating film 407 may be formed to have either a single-layer structure or a stacked-layer structure, using an inorganic material (e.g., silicon oxide, silicon nitride, silicon oxynitride, or a DLC film), a photosensitive or non-photosensitive organic material (e.g., polyimide, acrylic, polyamide, polyimide amide, resist, or benzocyclobutene), or siloxane (a material having a skeletal structure with a bond of silicon (Si) and oxygen (O). As a substituent of siloxane, an organic group containing at least hydrogen (e.g., an alkyl group or aromatic hydrocarbon) is used. Alternatively, a fluoro group may be used as the substituent, or both a fluoro group and an organic group at least containing hydrogen may be used as the substituent). The first insulating film 407 preferably has a shape that the curvature radius continuously changes. By forming such a shape, the coverage of the first insulating film 407 with the layer 408 containing a light-emitting substance and the second electrode 409 can be improved.

Figure 28B:
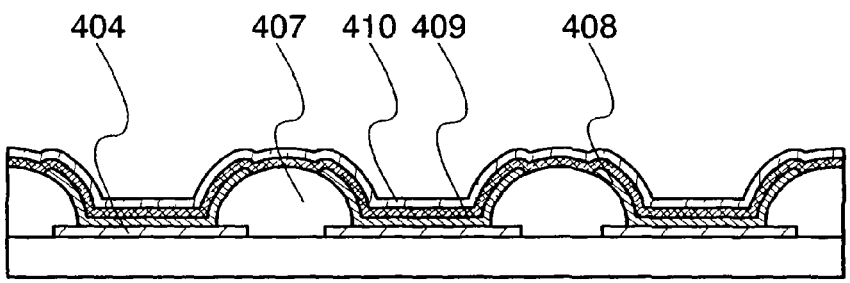

Next, as shown in FIG. 28B, the layer 408 containing a light-emitting substance is formed over the first electrode 404 and the first insulating film 407 by vapor deposition using a metal mask, and then the second electrode 409 is formed over the layer 408 containing a light-emitting substance by vapor deposition using a metal mask. As a method for forming the layer 408 containing a light-emitting substance and the second electrode 409, ink-jet method, printing, or the like may be used in addition to the method using a metal mask.

Then, a second insulating film 410 is formed over the second electrode 409. The second insulating film 410 may be formed to have either a single-layer structure or a stacked-layer structure, using an inorganic material (e.g., silicon oxide, silicon nitride, silicon oxynitride, or a DLC film), a photosensitive or non-photosensitive organic material (e.g., polyimide, acrylic, polyamide, polyimide amide, resist, or benzocyclobutene), or siloxane (a material having a skeletal structure with a bond of silicon (Si) and oxygen (O). As a substituent of siloxane, an organic group containing at least hydrogen (e.g., an alkyl group or aromatic hydrocarbon) is used. Alternatively, a fluoro group may be used as the substituent, or both a fluoro group and an organic group containing at least hydrogen may be used as the substituent). In particular, when silicon nitride, silicon oxynitride, a DLC film, or the like is used, moisture, oxygen, and other impurities can be prevented from entering the light-emitting element 406 from outside.

Figure 28C:
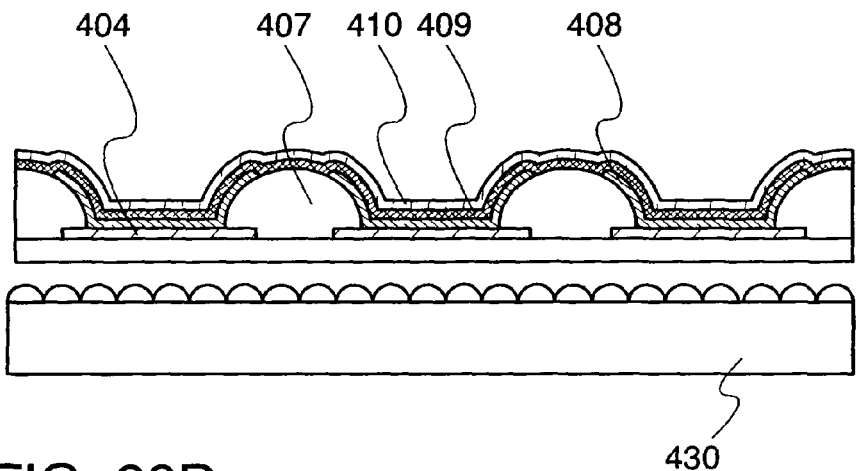

Then, as shown in FIG. 28C, the first substrate 403 is processed into a thinner shape with a grinder or polisher 430. At this time, the first substrate 403 is made as thin as 100 μm or less, or preferably 20 to 50 μm. Although a grinder or polisher is used to thin the first substrate 403 here, wet etching may be employed as well.

Note that in the case where a flexible resin substrate or the like is used as the first substrate 403, the process of thinning the first substrate 403 is not required.

Figure 28D:
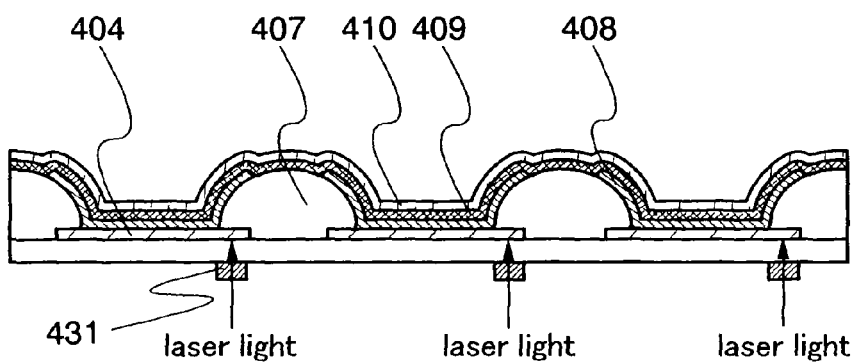

Next, as shown in FIG. 28D, a conductive film 431 is formed to have a thickness of 1 to several ten μm, or preferably 10 to 20 μm over a surface of the first substrate 403 which is opposite to the surface where the light-emitting elements are formed. The conductive film 431 may be formed by, for example, screen printing using solder or a conductive material such as Au paste, Ag paste, Cu paste, Ni paste, or Al paste. Note that the conductive film 431 is formed so as to face the first electrode 404 with the first substrate 403 sandwiched therebetween.

Figure 29:
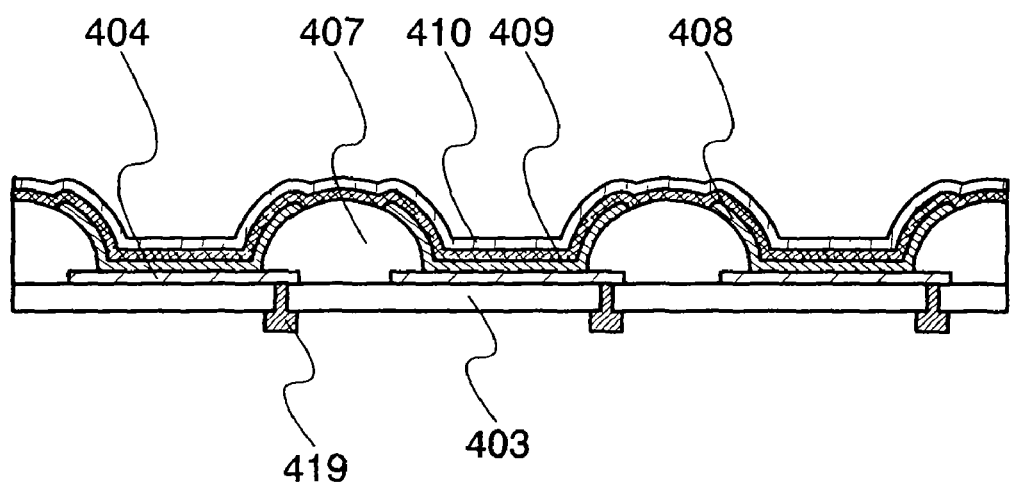
FIG. 29 illustrates a manufacturing step in Embodiment Mode 3.

Then, the conductive film 431 is irradiated with laser. At this time, the laser output is adjusted so that the conductive film 431 penetrates the first substrate 403 to reach the first electrode 404. Accordingly, the electrode 419 electrically connected to the first electrode 404 is formed as shown in FIG. 29.

Note that this embodiment mode can be implemented in combination with the techniques described in other embodiment modes as appropriate.

Embodiment Mode 4

In this embodiment mode, description is made of an example of a light-emitting device with the first structure of the invention, where an image sensor is additionally formed over the second substrate. That is, description is made of an example of a light-emitting device having a first substrate over which a light-emitting element is formed, and a second substrate over which a pixel circuit for driving the light-emitting element and an image sensor are formed, where the light-emitting element and the pixel circuit for driving the light-emitting element are electrically connected.

Figure 22A:
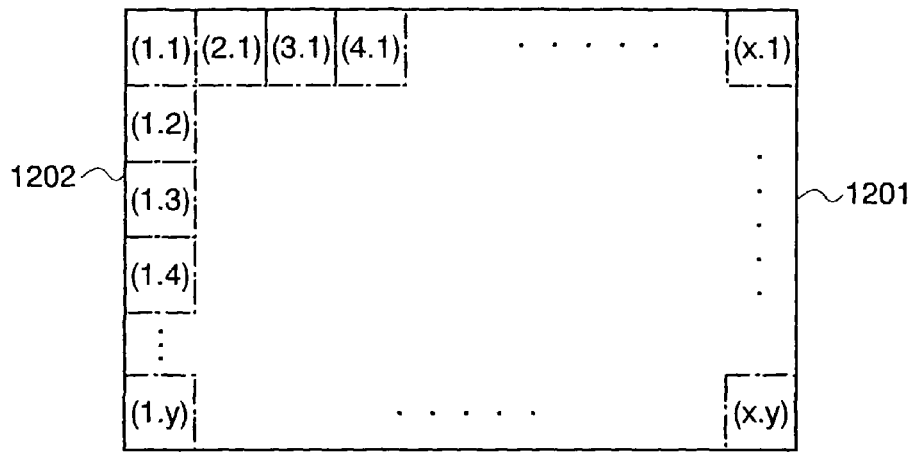
FIGS. 22A to 22E illustrate exemplary pixel configurations of a light-emitting device having an image sensor.

First, a configuration of a pixel portion of a light-emitting device in this embodiment mode is described. FIG. 22A shows an exemplary configuration of a pixel portion in this embodiment mode. A pixel portion 1201 includes a plurality of pixels 1202 arranged in matrix, and each pixel 1202 has a subpixel including a light-emitting element and a subpixel including an image sensor. Each pixel 1202 may have various configurations, and the following cases can be given as examples: a case where one pixel has a total of six subpixels that are three subpixels (1250 to 1252) including light-emitting elements which respectively emit light with R, G, and B colors, and three subpixels (1253 to 1255) including image sensors (FIG. 22B); a case where one pixel has a total of four subpixels that are three subpixels (1256 to 1258) including light-emitting elements which respectively emit light with R, G, and B colors, and one subpixel 1259 including an image sensor (FIG. 22C); and a case where one pixel has a total of two subpixels that are one subpixel 1260 including a light-emitting element which emits light with a white color and a subpixel 1261 including an image sensor (FIG. 22D).

Any pixel configuration may be employed for the light-emitting device in this embodiment mode. Accordingly, any of the aforementioned configurations may be employed and selected by taking into account the sensitivity of the sensor, the brightness of a display screen, and the like. It is needless to say that the reading accuracy can be improved with a larger number of subpixels including image sensors. In addition, when a large number of subpixels including image sensors each of which has a small area are provided, the reading accuracy can be improved.

Figure 22B:
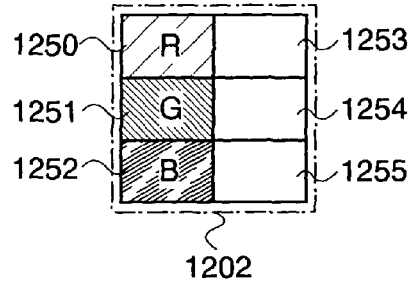
Figure 22C:
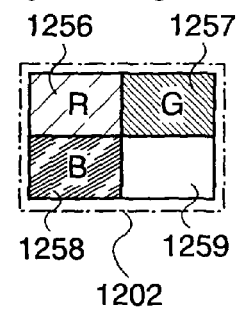
Figure 22D:
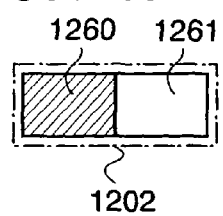

Note that the pixels shown in FIGS. 22B and 22C perform color display, while the pixel shown in FIG. 22D performs monochrome display. When a pixel has a display function of performing monochrome display, its reading function is limited to monochrome. On the other hand, when a pixel has a display function of performing color display, its reading function can allow reading of both monochrome and colors. Note that in the case of reading information of an object with colors, the information of the object is read out by sequentially lighting light-emitting elements with the respective colors of R, G, and B. After that, the information read out with the respective colors of R, G, and B are combined, thereby a color image can be displayed using the combined information.

Figure 22E:
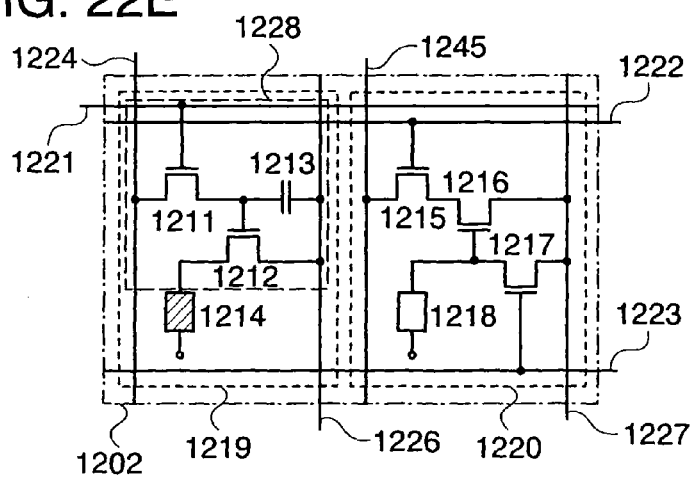

FIG. 22E shows an example of an equivalent circuit diagram of one pixel 1202 in the case where one pixel has a subpixel including a light-emitting element and a subpixel including an image sensor, which corresponds to the pixel configuration shown in FIG. 22D. In FIG. 22E, one pixel 1202 is composed of a subpixel 1219 including a light-emitting element 1214 and a subpixel 1220 including an image sensor 1218. Signal lines 1224 and 1245 and power source lines 1226 and 1227 are disposed in columns, and scan lines 1221, 1222, and 1223 are disposed in rows. The subpixel 1219 includes a switching transistor 1211, a driving transistor 1212, and a capacitor 1213, while the subpixel 1220 includes a switching transistor 1215, a buffer transistor 1216, and a reset transistor 1217. Although description will be made below of an example where one pixel 1202 has the circuit configuration shown in FIG. 22E, the circuit configuration in FIG. 22E is illustrative only, and therefore, the circuit configuration of each subpixel is not limited to the aforementioned description. Any known circuit configuration may be employed.

In the light-emitting device in this embodiment mode, the light-emitting element 1214 is formed over the first substrate, and elements included in the pixel 1202 other than the light-emitting element 1214 are formed over the second substrate. That is, in the light-emitting device in this embodiment mode, the light-emitting element 1214 is provided over the first substrate, while a pixel circuit 1228 for driving the light-emitting element and the subpixel 1220 including an image sensor are provided over the second substrate.

Figure 15:
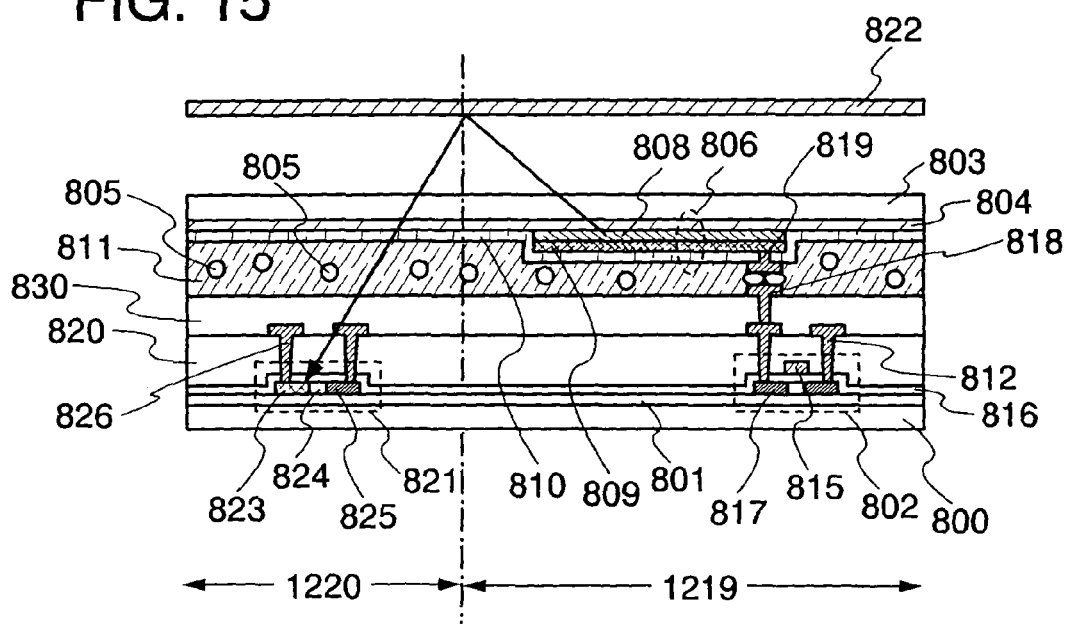
FIG. 15 illustrates Embodiment Mode 4.

FIG. 15 shows a cross section of one pixel of the light-emitting device in this embodiment mode. In FIG. 15, a first substrate 803 over which a light-emitting element 806 is formed, and a second substrate 800 over which a thin film transistor 802 and an image sensor 821 are formed are provided to face each other. Note that in this embodiment mode, the first substrate 803 and the second substrate 800 are attached to each other so that the second substrate 800 faces a surface of the first substrate 803 where the light-emitting element is formed. Accordingly, the second substrate 800 functions as a sealing substrate.

Although FIG. 15 shows a case where the light-emitting element 806 formed over the first substrate 803 has the same structure as the light-emitting element in Embodiment Mode 1, the structure of the light-emitting element 806 formed over the first substrate 803 is not limited to this, and the structures shown in Embodiment Modes 2 and 3, and the like may be employed.

The light-emitting element 806 in FIG. 15 corresponds to the light-emitting element 1214 in FIG. 22E, and the thin film transistor 802 in FIG. 15 corresponds to the driving transistor 1212 in FIG. 22E. In addition, the image sensor 821 in FIG. 15 corresponds to the image sensor 1218 in FIG. 22E.

In FIG. 15, a region on the left side corresponds to a region of the subpixel 1220 including an image sensor, while a region on the right side corresponds to a region of the subpixel 1219 including a light-emitting element.

Although FIG. 15 shows only a portion where the image sensor 1218 (which corresponds to the image sensor 821 in FIG. 15) is formed over the second substrate 800 in the region corresponding to the subpixel 1220 including an image sensor, other elements in the subpixel 1220 including an image sensor (the switching transistor 1215, the buffer transistor 1216, and the reset transistor 1217 in FIG. 22E) are also formed over the second substrate 800.

In addition, although FIG. 15 only shows a portion where the driving transistor 1212 (which corresponds to the thin film transistor 802 in FIG. 15) is formed over the second substrate 800 in the region corresponding to the subpixel 1219 including a light-emitting element, other elements in the pixel circuit 1228 in the subpixel 1219 including a light emitting element (the switching transistor 1211 and the capacitor 1213 in FIG. 22E) are also formed over the second substrate 800.

Each of the first substrate 803 and the second substrate 800 may be a light-transmissive substrate such as a glass substrate, a quartz substrate, or a light-transmissive resin substrate.

Note that in the case of forming the light-emitting element 806 to have a structure where the light emitted from the light-emitting element 806 travels only in the direction of the first substrate 803, the second substrate 800 is not necessarily required to be a light-transmissive substrate. Accordingly, the second substrate 800 may be a substrate which does not transmit light such as a resin substrate having no light transmissivity, a semiconductor substrate, a ceramic substrate, or a metal substrate.

In the case of forming the light-emitting element 806 to have a structure where the light emitted from the light-emitting element 806 travels only in the direction of the second substrate 800, the first substrate 803 is not necessarily required to be a light-transmissive substrate. Accordingly, the first substrate 803 may be a substrate which does not transmit light such as a resin substrate having no light transmissivity, a semiconductor substrate, a ceramic substrate, or a metal substrate.

In addition, the first substrate 803 and the second substrate 800 may be the aforementioned substrates but are formed to be thin enough to have flexibility.

The light-emitting element 806 formed over the first substrate 803 includes a first electrode 804, a layer 808 containing a light-emitting substance, and a second electrode 809.

The first electrode 804 is formed over the first substrate 803 as a common electrode for all of the light-emitting elements. Then, the layer 808 containing a light-emitting substance is formed over the first electrode 804, and the second electrode 809 is formed over the layer 808 containing a light-emitting substance. An insulating film 810 is formed over the second electrode 809, and an electrode 819, which is electrically connected to the second electrode 809, is formed over the insulating film 810.

Note that the materials used for the first electrode 804 and the second electrode 809 and the like may be selected from those described in Embodiment Mode 1. In addition, the layer 808 containing a light-emitting substance may have a known layer structure as has been described in Embodiment Mode 1.

Meanwhile, the thin film transistor (driving transistor) 802 for driving the light-emitting element 806 and the image sensor 821 are formed over the second substrate 800 which is provided to face the first substrate 803.

In FIG. 15, the thin film transistor 802 includes a crystalline semiconductor film 817 formed over the second substrate 800 with a base film 801 sandwiched therebetween, a gate insulating film 816, and a gate electrode 815. Although the thin film transistor 802 is an n-channel thin film transistor here, a p-channel thin film transistor may also be employed.

In FIG. 15, the image sensor 821 includes a crystalline semiconductor film formed over the second substrate 800 with the base film 801 sandwiched therebetween, and the gate insulating film 816. The crystalline semiconductor film of the image sensor 821 is a crystalline semiconductor film formed in the same layer as the crystalline semiconductor film 817 of the thin film transistor 802, and includes a p-type semiconductor 823, an i-type semiconductor 824, and an n-type semiconductor 825.

Although FIG. 15 shows a case where crystalline semiconductor films are used as the semiconductor films of the thin film transistor 802 and the image sensor 821, the semiconductor films of the thin film transistor 802 and the image sensor 821 may be amorphous semiconductor films.

A first interlayer insulating film 820 is formed over the thin film transistor 802 and the image sensor 821, and electrodes 812 and 826 are formed over the first interlayer insulating film 820. The electrodes 812 are electrodes electrically connected to the crystalline semiconductor film 817 of the thin film transistor 802, and the electrodes 826 are electrodes electrically connected to the p-type semiconductor 823 and the n-type semiconductor 825 respectively, which are included in the semiconductor film of the image sensor 821. A second interlayer insulating film 830 is formed over the electrodes 812 and 826 and the first interlayer insulating film 820, and an electrode 818, which is electrically connected to the electrode 812, is formed over the second interlayer insulating film 830. Accordingly, the electrode 818 and the thin film transistor 802 are electrically connected.

The first substrate 803 and the second substrate 800 having the aforementioned structures are attached to each other with an anisotropic conductive film 811. As the anisotropic conductive film 811, ACP (Anisotropic Conductive Paste), an ACF (Anisotropic Conductive Film), and the like can be given as examples. By attaching the first substrate 803 and the second substrate 800 to each other with the anisotropic conductive film 811, the electrodes 818 and 819 are electrically connected through a conductive particle 805 included in the anisotropic conductive film 811. That is, the light-emitting element 806 formed over the first substrate 803 and the thin film transistor 802 formed over the second substrate 800 are electrically connected.

Although FIG. 15 shows an example where the electrodes 818 and 819 are electrically connected by attaching the first substrate 803 and the second substrate 800 to each other with the anisotropic conductive film 811, the method for electrically connecting the electrodes 818 and 819 is not particularly limited to this, and any known connection method may be employed. For example, the electrode 818 and the electrode 819 may be electrically connected by using NCP (Non-Conductive Paste) or eutectic bonding with supersonic waves.

In addition, a spacer may be provided between the first substrate 803 and the second substrate 800 as appropriate when attaching the first substrate 803 and the second substrate 800 to each other.

Although FIG. 15 does not specifically show a connection between the first electrode 804 of the light-emitting element 806 and a power source, a counter potential is supplied to the first electrode 804 by providing a connecting terminal electrically connected to the first electrode 804 around the pixel portion 601 or in an outer region of the source signal line driver circuit 602 and the gate signal line driver circuit 603, and connecting the connecting terminal to an external power source provided in an IC or the like.

Although the description has been made heretofore of a case where one pixel 1202 has the pixel configuration shown in FIG. 22E, the circuit configuration in FIG. 22E is illustrative only, and therefore, the circuit configuration of each subpixel is not limited to the aforementioned description, and any known circuit configuration may be employed. Accordingly, the circuit configuration of the pixel circuit 1228 for driving the light-emitting element included in the subpixel is not limited to the aforementioned description either, and any known pixel circuit may be employed.

The pixel circuit 1228 shown in FIG. 22E has a circuit configuration where the light-emitting element 1214 is connected to the driving transistor 1212 as a thin film transistor for driving the light-emitting element 1214. Accordingly, the light-emitting element 1214 (which corresponds to the light-emitting element 806 in FIG. 15) and the driving transistor 1212 (which corresponds to the thin film transistor 802 in FIG. 15) are electrically connected through the anisotropic conductive film 811. Thus, when applying the invention to other pixel circuit configurations, it is only required that an element that is to be connected to a light-emitting element be electrically connected to the light-emitting element through an anisotropic conductive film. In most of the pixel circuits, an element connected to a light-emitting element is a transistor for driving the light-emitting element (driving transistor).

Thus, in most cases, a light-emitting element and a transistor for driving the light-emitting element are electrically connected through an anisotropic conductive film.

Description is made below of an operation of the light-emitting device in accordance with this embodiment mode described above. Although FIG. 15 shows a case of a light-emitting element with a structure where the light emitted from the light-emitting element 806 is emitted only in the direction of the first substrate 803, the invention is not limited to this. For example, a light-emitting element with a structure where the light emitted from the light-emitting element 806 is emitted only in the direction of the second substrate 800 may be employed as well. However, the structure of a light-emitting element where the light emitted from the light-emitting element 806 is emitted only in the direction of the first substrate 803 is preferable because this structure requires less number of layers through which the light emitted from the light-emitting element 806 travels, and thus the light emitted from the light-emitting element 806 can be effectively utilized. In addition, in the case of a light-emitting element with a structure where the light emitted from the light-emitting element 806 is emitted only in the direction of the first substrate 803 as shown in FIG. 15, a circuit can be formed over the second substrate without taking into account an aperture ratio. Accordingly, the pixel circuit 1228 and the subpixel 1220 formed over the second substrate may have a circuit configuration with more elements.

The light emitted from the light-emitting element 806 is reflected by an object 822 and the light reflected enters the image sensor 821. Then, a potential difference between the opposite electrodes of the image sensor 821 changes, and a current flows between the opposite electrodes in accordance with the change of the potential difference. By detecting the amount of current flowing between the opposite electrodes of the image sensor 821, information of the object 822 can be obtained, and the information obtained is displayed by the light-emitting element 806. That is, the light-emitting element 806 functions as both a light source for reading out the information of the object 822 and a display medium for displaying an image. Thus, the light-emitting device of the invention has two functions of an image sensor for reading information of the object 822 and a display function of displaying an image. Notwithstanding the foregoing two functions, a light source and a light-scattering plate, which are usually required in using an image sensor function, are not required. Therefore, drastic reduction in size, thickness, and weight can be realized.

Note that the description has been made heretofore of a light-emitting element with a structure where the light emitted from the light-emitting element 806 is emitted only in the direction of the first substrate 803. In the case of forming a light-emitting element to have a structure where the light emitted from the light-emitting element 806 is emitted only in the direction of the second substrate 800, the information of the object 822 is required to be read out by positioning the object 822 to face the second substrate 800.

Note also that this embodiment mode can be implemented in combination with the techniques described in other embodiment modes as appropriate.

Embodiment Mode 5

In this embodiment mode, description is made of an example of a light-emitting device with the first structure of the invention, where an image sensor is additionally formed over the first substrate. That is, description is made of an example of a light-emitting device having a first substrate over which a light-emitting element and an image sensor are formed, and a second substrate over which a pixel circuit for driving the light-emitting element is formed, where the light-emitting element and the pixel circuit for driving the light-emitting element are electrically connected.

Note that the description below shows an example where one pixel has the circuit configuration shown in FIG. 22E as in Embodiment Mode 4.

In the light-emitting device in this embodiment mode having the circuit configuration in FIG. 22E, the light-emitting element 1214 and the image sensor 1218 are provided over the first substrate, while elements included in the pixel 1202 other than the light-emitting element 1214 and the image sensor 1218 are provided over the second substrate. That is, as for the subpixel 1219 including a light-emitting element, the light-emitting element 1214 is formed over the first substrate, while the pixel circuit 1228 for driving the light-emitting element 1214 is formed over the second substrate. Meanwhile, as for the subpixel 1220 including an image sensor, the image sensor 1218 is formed over the first substrate, while the elements included in the subpixel 1220 other than the image sensor 1218 are formed over the second substrate.

Figure 16:
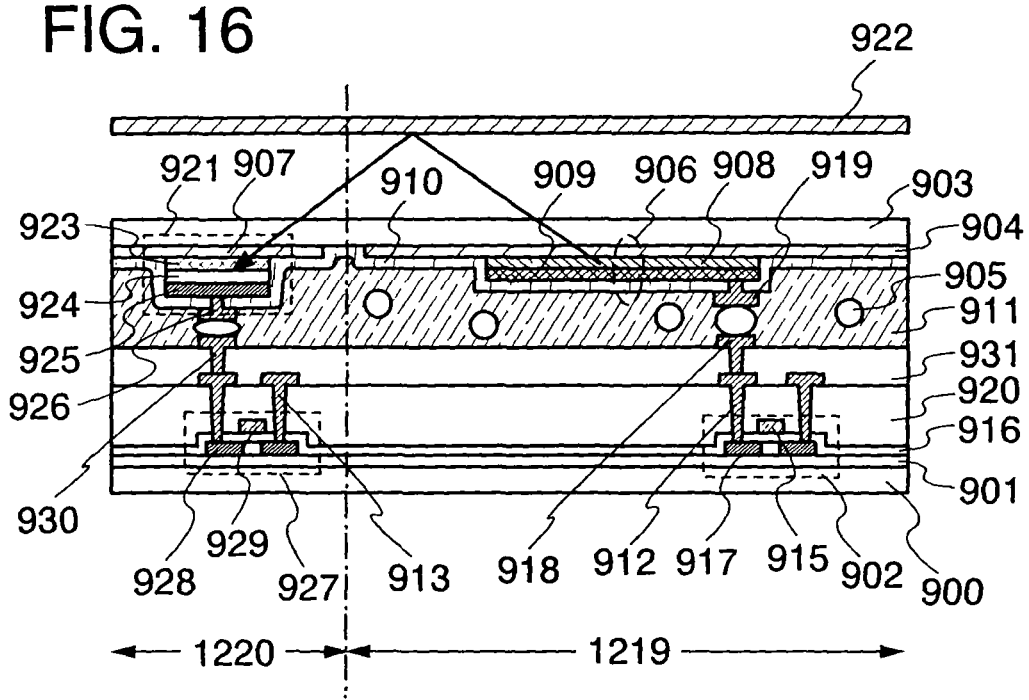
FIG. 16 illustrates Embodiment Mode 5.

FIG. 16 shows a cross section of one pixel of a light-emitting device in this embodiment mode. In FIG. 16, a first substrate 903 over which a light-emitting element 906 and an image sensor 921 are formed and a second substrate 900 over which a thin film transistor 902 and a thin film transistor 927 are formed are provided to face each other. Note that in this embodiment mode, the first substrate 903 and the second substrate 900 are attached to each other so that the second substrate 900 faces a surface of the first substrate 903 where the light-emitting element is formed. Accordingly, the second substrate 900 functions as a sealing substrate.

Although FIG. 16 shows a case where the light-emitting element formed over the first substrate 903 has the same structure as the light-emitting element in Embodiment Mode 1, the structure of the light-emitting element formed over the first substrate 903 is not limited to this, and the structures shown in Embodiment Modes 2 and 3, and the like may be employed.

The light-emitting element 906 in FIG. 16 corresponds to the light-emitting element 1214 in FIG. 22E, and the thin film transistor 902 in FIG. 16 corresponds to the driving transistor 1212 in FIG. 22E. In addition, the image sensor 921 in FIG. 16 corresponds to the image sensor 1218 in FIG. 22E, and the thin film transistor 927 in FIG. 16 corresponds to the reset transistor 1217 in FIG. 22E.

In FIG. 16, a region on the left side corresponds to a region of the subpixel 1220 including an image sensor, while a region on the right side corresponds to a region of the subpixel 1219 including a light-emitting element.

Although FIG. 16 shows only a portion where the reset transistor 1217 (which corresponds to the thin film transistor 927 in FIG. 16) is formed over the second substrate 900 in the region corresponding to the subpixel 1220 including the image sensor, other elements in the subpixel 1220 including an image sensor (the switching transistor 1215 and the buffer transistor 1216 in FIG. 22E) are also formed over the second substrate 900.

In addition, although FIG. 16 only shows a portion where the driving transistor 1212 (which corresponds to the thin film transistor 902 in FIG. 16) is formed over the second substrate 900 in the region corresponding to the subpixel 1219 including a light-emitting element, other elements in the pixel circuit 1228 of the subpixel 1219 including an image sensor (the switching transistor 1221 and the capacitor 1213 in FIG. 22E) are also formed over the second substrate 900.

Each of the first substrate 903 and the second substrate 900 may be a light-transmissive substrate such as a glass substrate, a quartz substrate, or a light-transmissive resin substrate.

Note that in the case of forming the light-emitting element 906 to have a structure where the light emitted from the light-emitting element 906 travels only in the direction of the first substrate 903, the second substrate 900 is not necessarily required to be a light-transmissive substrate. Accordingly, the second substrate 900 may be a substrate which does not transmit light such as a resin substrate having no light transmissivity, a semiconductor substrate, a ceramic substrate, or a metal substrate.

In the case of forming the light-emitting element 906 to have a structure where the light emitted from the light-emitting element 906 travels only in the direction of the second substrate 900, the first substrate 903 is not necessarily required to be a light-transmissive substrate. Accordingly, the first substrate 903 may be a substrate which does not transmit light such as a resin substrate having no light transmissivity, a semiconductor substrate, a ceramic substrate, or a metal substrate.

In addition, the first substrate 903 and the second substrate 900 may be the aforementioned substrates but are formed to be thin enough to have flexibility.

The light-emitting element 906 formed over the first substrate 903 includes a first electrode 904, a layer 908 containing a light-emitting substance, and a second electrode 909.

The first electrode 904 is formed over the first substrate 903. Then, the layer 908 containing a light-emitting substance is formed over the first electrode 904, and the second electrode 909 is formed over the layer 908 containing a light-emitting substance. An insulating film 910 is formed over the second electrode 909, and an electrode 919, which is electrically connected to the second electrode 909, is formed over the insulating film 910.

The image sensor 921 formed over the first substrate 903 is a vertical-junction image sensor, which includes a first electrode 907 formed over the first substrate 903, and also includes a p-type semiconductor 923, an i-type semiconductor 924, and an n-type semiconductor 925 formed over the first electrode 907. An insulating film 910 is formed over the n-type semiconductor 925, and an electrode 926, which is electrically connected to the n-type semiconductor 925, is formed over the insulating film 910.

On the other hand, the thin film transistor 902 (which corresponds to the driving transistor 1212 in FIG. 22E) for driving the light-emitting element 906 and the thin film transistor 927 (which corresponds to the reset transistor 1217 in FIG. 22E) are formed over the second substrate 900 which is provided to face the first substrate 903.

In FIG. 16, the thin film transistor 902 includes a crystalline semiconductor film 917 formed over the second substrate 900 with a base film 901 sandwiched therebetween, a gate insulating film 916, and a gate electrode 915. Although the thin film transistor 902 is an n-channel thin film transistor here, a p-channel thin film transistor may also be employed.

In addition, in FIG. 16, the thin film transistor 927 includes a crystalline semiconductor film 928 formed over the second substrate 900 with the base film 901 sandwiched therebetween, the gate insulating film 916, and the gate electrode 929. The crystalline semiconductor film 928 of the thin film transistor 927 is a crystalline semiconductor film formed in the same layer as the crystalline semiconductor film 917 of the thin film transistor 902.

The light-emitting device in this embodiment mode has a structure where an image sensor and a light-emitting element are formed over the first substrate, while elements in the subpixel other than the image sensor (the switching transistor 1215, the buffer transistor 1216, and the reset transistor 1217 in FIG. 22E), and elements in the subpixel other than the light-emitting element (the switching transistor 1211, the driving transistor 1212, and the capacitor 1213 in FIG. 22E) are formed over the second substrate. Therefore, a semiconductor film which partially constitutes the image sensor may be formed with an amorphous semiconductor film, while semiconductor films which partially constitute the elements in the subpixel other than the image sensor (the switching transistor 1215, the buffer transistor 1216, and the reset transistor 1217 in FIG. 22E), and the elements in the subpixel other than the light-emitting element (the switching transistor 1211, the driving transistor 1212, and the capacitor 1213 in FIG. 22E) are formed over the second substrate may be formed with crystalline semiconductor films. That is, since the image sensor and a transistor included in one pixel are provided over different substrates, a semiconductor film which partially constitutes the image sensor can be formed with an amorphous semiconductor film, while a semiconductor film which partially constitutes the transistor included in the pixel can be formed with a crystalline semiconductor film.

As a semiconductor film for forming the image sensor, it is preferable to use an amorphous semiconductor because it is superior to a crystalline semiconductor in photoconductivity. Meanwhile, as a semiconductor film for forming a transistor, it is preferable to use a crystalline semiconductor film because it is superior to an amorphous semiconductor in mobility. However, in the case of forming an image sensor over the same substrate as a transistor having a crystalline semiconductor film, a semiconductor film in the same layer as the crystalline semiconductor film of the transistor is used; therefore, it is necessary that the crystalline semiconductor film be used for the semiconductor film for forming the image sensor.

However, by using the structure in this embodiment mode, a semiconductor film for forming an image sensor can be formed with an amorphous semiconductor film, while a semiconductor film for forming an element such as a transistor can be formed with a crystalline semiconductor film; therefore, an image sensor with high sensitivity can be provided, and an element such as a transistor for forming one pixel can be provided with high driving speed.

A first interlayer insulating film 920 is formed over the thin film transistor 902 and the thin film transistor 927, and electrodes 912 and 913 are formed over the first interlayer insulating film 920. The electrode 912 is electrically connected to the crystalline semiconductor film 917 of the thin film transistor 902, and the electrode 913 is electrically connected to the crystalline semiconductor film 928 of the thin film transistor 927. A second interlayer insulating film 931 is formed over the electrodes 912 and 913 and the first interlayer insulating film 920. Electrodes 918 and 930, which are electrically connected to the electrodes 912 and 913 respectively, are formed over the second interlayer insulating film 931. Accordingly, the electrode 918 and the thin film transistor 902 are electrically connected, while the electrode 930 and the thin film transistor 927 are electrically connected.

The first substrate 903 and the second substrate 900 having the aforementioned structures are attached to each other with an anisotropic conductive film 911. As the anisotropic conductive film 911, ACP (Anisotropic Conductive Paste), an ACF (Anisotropic Conductive Film), and the like can be given as examples. By attaching the first substrate 903 and the second substrate 900 to each other with the anisotropic conductive film 911, the electrodes 918 and 919 are electrically connected through a conductive particle 905 included in the anisotropic conductive film 911, while the electrodes 930 and 926 are electrically connected through the conductive particle 905 included in the anisotropic conductive film 911. That is, the light-emitting element 906 formed over the first substrate 903 and the thin film transistor 902 formed over the second substrate 900 are electrically connected. In addition, the image sensor 921 formed over the first substrate 903 and the thin film transistor 927 formed over the second substrate 900 are electrically connected.

Although FIG. 16 shows an example where the electrodes 918 and 919 as well as the electrodes 930 and 926 are electrically connected by attaching the first substrate 903 and the second substrate 900 to each other with the anisotropic conductive film 911, the method for electrically connecting the electrodes 918 and 919 and connecting the electrodes 930 and 926 is not particularly limited to this, and any known connection method may be employed. For example, the electrodes 918 and 919 as well as the electrodes 930 and 926 may be electrically connected by using NCP (Non-Conductive Paste) or eutectic bonding with supersonic waves.

In addition, a spacer may be provided between the first substrate 903 and the second substrate 900 as appropriate when attaching the first substrate 903 and the second substrate 900 to each other.

Although FIG. 16 does not specifically show a connection between the first electrode 904 of the light-emitting element 906 and a power source, a counter potential is supplied to the first electrode 904 by providing a connecting terminal electrically connected to the first electrode 904 around the pixel portion 601 or in an outer region of the source signal line driver circuit 602 and the gate signal line driver circuit 603, and connecting the connecting terminal to an external power source provided in an IC or the like.

Although the description has been made heretofore of a case where one pixel 1202 has the pixel configuration shown in FIG. 22E, the circuit configuration in FIG. 22E is illustrative only, and therefore, the circuit configuration of each subpixel is not limited to the aforementioned description, and any known circuit configuration may be employed. Accordingly, the circuit configuration of the pixel circuit 1228 for driving the light-emitting element included in the subpixel is not limited to the aforementioned description either, and any known pixel circuit may be employed.

The pixel circuit 1228 shown in FIG. 22E has a circuit configuration where a source or a drain of the driving transistor 1212 as a thin film transistor for driving the light-emitting element 1214 is connected to one of the electrodes of the light-emitting element 1214. Therefore, the light-emitting element 1214 (which corresponds to the light-emitting element 906 in FIG. 16) and the driving transistor 1212 (which corresponds to the thin film transistor 902 in FIG. 16) are electrically connected through the anisotropic conductive film 911. Thus, when applying the invention to other pixel circuit configurations, it is only required that an element that is to be connected to a light-emitting element be electrically connected to the light-emitting element through an anisotropic conductive film. In most of the pixel circuits, an element connected to a light-emitting element is a transistor for driving the light-emitting element (driving transistor). Thus, in most cases, a light-emitting element and a transistor for driving the light-emitting element are electrically connected through an anisotropic conductive film.

The subpixel 1220 including an image sensor shown in FIG. 22E has a circuit configuration where the image sensor 1218 is connected to a source or a drain of the reset transistor 1217. Therefore, the image sensor 1218 (which corresponds to the image sensor 921 in FIG. 16) and the reset transistor 1217 (which corresponds to the thin film transistor 927 in FIG. 16) are electrically connected through the anisotropic conductive film 911. Accordingly, when applying the invention to other configurations of a subpixel including an image sensor, it is only required that an element that is to be connected to an image sensor be electrically connected to the image sensor through an anisotropic conductive film. Note that although not shown in the cross section in FIG. 16, one of the electrodes of the image sensor 1218 is also connected to a gate electrode of the buffer transistor 1216.

Description is made below of an operation of the light-emitting device in accordance with this embodiment mode described above. Although FIG. 16 shows a case of a light-emitting element with a structure where the light emitted from the light-emitting element 906 is emitted only in the direction of the first substrate 903, the invention is not limited to this. For example, a light-emitting element with a structure where the light emitted from the light-emitting element 906 is emitted only in the direction of the second substrate 900 may be employed as well. However, the structure of a light-emitting element where the light emitted from the light-emitting element 906 is emitted only in the direction of the first substrate 903 is preferable because this structure requires less number of layers through which the light emitted from the light-emitting element 906 travels, and thus the light emitted from the light-emitting element 906 can be effectively utilized. In addition, in the case of a light-emitting element with a structure where the light emitted from the light-emitting element 906 is emitted only in the direction of the first substrate 903 as shown in FIG. 16, a circuit can be formed over the second substrate without taking into account an aperture ratio. Accordingly, the pixel circuit 1228 and the subpixel 1220 formed over the second substrate may have a circuit configuration with more elements.

The light emitted from the light-emitting element 906 is reflected by an object 922 and the light reflected enters the image sensor 921. Then, a potential difference between the opposite electrodes of the image sensor 921 changes, and a current flows between the opposite electrodes in accordance with the change of the potential difference. By detecting the amount of current flowing between the opposite electrodes of the image sensor 921, information of the object 922 can be obtained, and the information obtained is displayed by the light-emitting element 906. That is, the light-emitting element 906 functions as both a light source for reading out the information of the object 922 and a display medium for displaying an image. Thus, the light-emitting device of the invention has two functions of an image sensor for reading information of the object 922 and a display function of displaying an image. Notwithstanding the foregoing two functions, a light source and a light-scattering plate, which are usually required in using an image sensor function, are not required. Therefore, drastic reduction in size, thickness, and weight can be realized.

Note that the description has been made heretofore of a light-emitting element with a structure where the light emitted from the light-emitting element 906 is emitted only in the direction of the first substrate 903. In the case of forming a light-emitting element to have a structure where the light emitted from the light-emitting element 906 is emitted only in the direction of the second substrate 900, the information of the object 922 is required to be read out by positioning the object 922 to face the second substrate 900.

Note also that this embodiment mode can be implemented in combination with the techniques described in other embodiment modes as appropriate.

Embodiment Mode 6

In this embodiment mode, description is made of the first example of the light-emitting element with the second structure of the invention.

Manufacturing steps of a first substrate over which a light-emitting element is formed are similar to those described in Embodiment Modes 1 to 3. Here, description is made first of manufacturing steps of a film including a driver circuit of a light-emitting element.

Figure 4A:
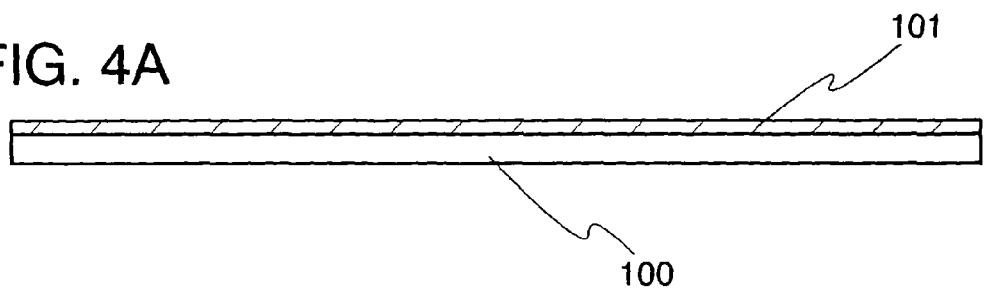
FIGS. 4A to 4C illustrate Embodiment Mode 6.

As shown in FIG. 4A, a separation layer 101 is formed over a substrate 100. As the separation layer 101, a layer formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si), or an alloy or compound material containing such elements as a main component can be formed to have either a single-layer structure or a stacked-layer structure, by plasma CVD, sputtering, or the like. The crystalline structure of a layer containing silicon may be any one of an amorphous, microcrystalline, or polycrystalline structure.

As the substrate 100, a quartz substrate, a semiconductor substrate, a glass substrate, a metal substrate, or the like may be employed.

In the case where the separation layer 101 has a single-layer structure, it is preferably formed with a layer containing any one of tungsten, molybdenum, a mixture of tungsten and molybdenum, oxide of tungsten, oxynitride of tungsten, nitride oxide of tungsten, oxide of molybdenum, oxynitride of molybdenum, nitride oxide of molybdenum, oxide of a mixture of tungsten and molybdenum, oxynitride of a mixture of tungsten and molybdenum, or nitride oxide of a mixture of tungsten and molybdenum. Note that the mixture of tungsten and molybdenum corresponds to, for example, an alloy of tungsten and molybdenum.

In the case where the separation layer 101 has a stacked-layer structure, a layer containing tungsten, molybdenum, or a mixture of tungsten and molybdenum is formed as a first layer, and a layer containing oxide of tungsten, oxide of molybdenum, oxide of a mixture of tungsten and molybdenum, oxynitride of tungsten, oxynitride of molybdenum, or oxynitride of a mixture of tungsten and molybdenum is formed as a second layer. In this manner, in the case of forming the separation layer 101 to have a stacked-layer structure, it is preferable to form a stacked-layer structure of a metal film and a metal oxide film. As examples of a method for forming a metal oxide layer, there are a method of forming a metal oxide film directly by sputtering, a method of forming a metal oxide film by oxidizing a surface of a metal film formed over the substrate 100 by thermal treatment or plasma treatment under an oxygen atmosphere, and the like.

As the metal film, a film made of an element selected from titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), or iridium (Ir), or an alloy or compound material containing such elements as a main component can be used, in addition to the aforementioned tungsten (W) and molybdenum (Mo).

Note that an insulating film such as a silicon oxide film, a silicon nitride film, a silicon oxynitride film, or a silicon nitride oxide film may be formed over the substrate 100 before forming the separation layer 101, so that the separation layer 101 is formed over the insulating film. By providing such an insulating film between the substrate 100 and the separation layer 101, impurities contained in the substrate 100 can be prevented from entering an upper layer. In addition, the substrate 100 can be prevented from being etched at a laser irradiation step later. Note that a silicon oxynitride film and a silicon nitride oxide film are distinguished herein according to the ratio of oxygen to nitrogen; the silicon oxynitride film contains more oxygen than nitrogen, while the silicon nitride oxide film contains more nitrogen than oxygen.

Figure 4B:
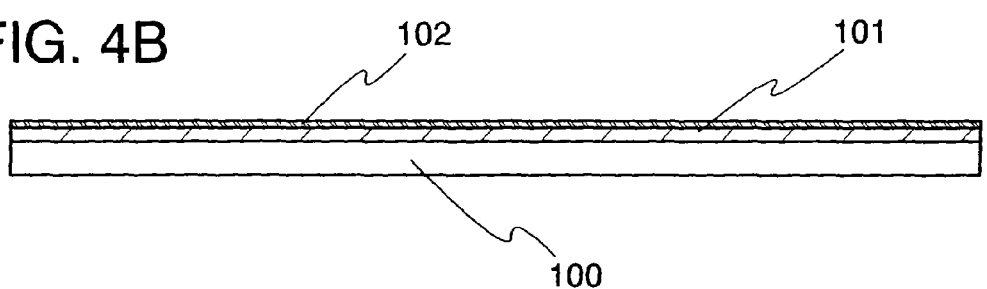

Next, as shown in FIG. 4B, a first insulating film 102 is formed on the separation layer 101. The first insulating film 102 is a film functioning as a base film. As the first insulating film 102, oxide of silicon, nitride of silicon, oxide of silicon containing nitrogen, nitride of silicon containing oxygen, or the like is formed by plasma CVD, sputtering, or the like.

Figure 4C:
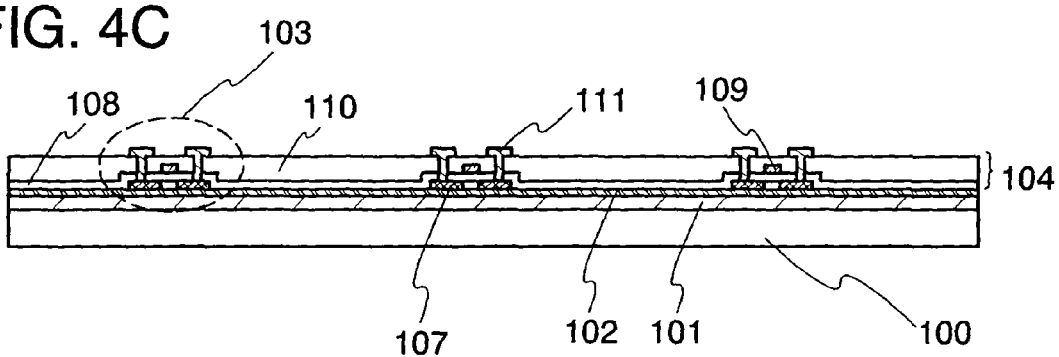

As shown in FIG. 4C, a stacked layer 104 including a driver circuit of a light-emitting element is formed over the first insulating film 102 by a known method. Hereinafter, description will be made of a case where the driver circuit of a light-emitting element is a pixel circuit for driving a light-emitting element.

As the stacked layer 104 including a driver circuit of a light-emitting element, for example, a plurality of thin film transistors 103, a second insulating film 110 covering the plurality of thin film transistors 103, and an electrode 111 which makes a contact with the second insulating film 110 and is electrically connected to a source or drain region of the plurality of thin film transistors 103 are formed. Each thin film transistor 103 includes an island-shaped semiconductor film 107, a gate insulating film 108, a gate electrode 109, and the like.

Note that the structure of the thin film transistor 103 is not limited to the one shown in FIG. 4C, and a thin film transistor with a structure other than the structure shown in FIG. 4C may be employed. For example, the thin film transistor 103 may have a structure of a known thin film transistor, such as a top-gate thin film transistor which is formed to have LDD regions (Lightly Doped Drain regions) by providing sidewalls on opposite sides of a gate electrode, a bottom-gate thin film transistor, or a thin film transistor having a silicide region.

Figure 5A:
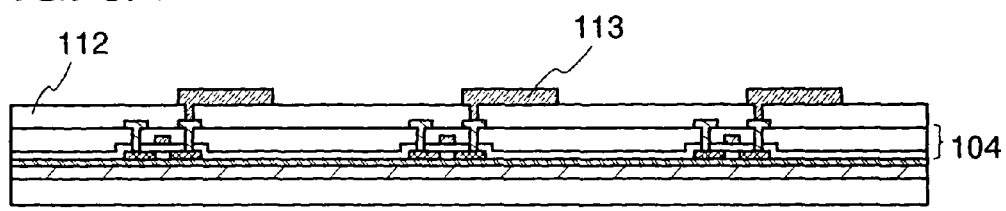
FIGS. 5A to 5C illustrate Embodiment Mode 6.

Then, as shown in FIG. 5A, a third insulating film 112 is formed over the stacked layer 104 including a driver circuit of a light-emitting element, and an electrode 113, which is electrically connected to the electrode 111 electrically connected to the source or drain region of the thin film transistor 103, is formed over the third insulating film 112 by using a metal film or the like. Here, the electrode 113 is formed with a TiN film by sputtering.

The third insulating film 112 is formed by a known method, using an inorganic material such as a silicon oxide film, a silicon nitride film, a silicon oxynitride film, or a silicon nitride oxide film; an organic material such as polyimide, polyamide, benzocyclobutene, acrylic, or epoxy; siloxane; or the like, to have either a single-layer structure or stacked-layer structure.

Although the electrode 113 is formed to be connected to the electrode 113 in FIG. 5A, the invention is not specifically limited to this case. It is only required to form an electrode to be electrically connected to an element that is to be electrically connected to a light-emitting element, in the pixel circuit.

Figure 5B:
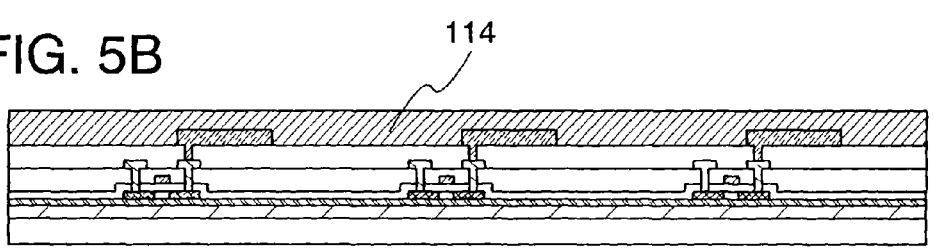

After forming the electrode 113, as shown in FIG. 5B, a resin film is formed as a reinforcing layer 114 over the electrode 113 to have a thickness of 20 to 30 μm. Here, the resin film is formed by coating the electrode 113 with a resin material such as a heat curable resin, a UV (UltraViolet) curable resin, or a thermoplastic resin by screen printing, and then baking the coating.

Figure 5C:
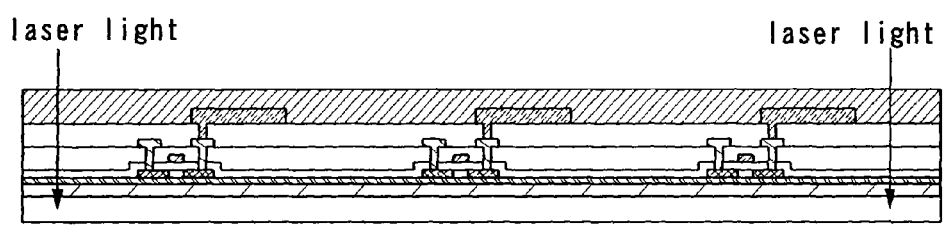
Figure 6A:
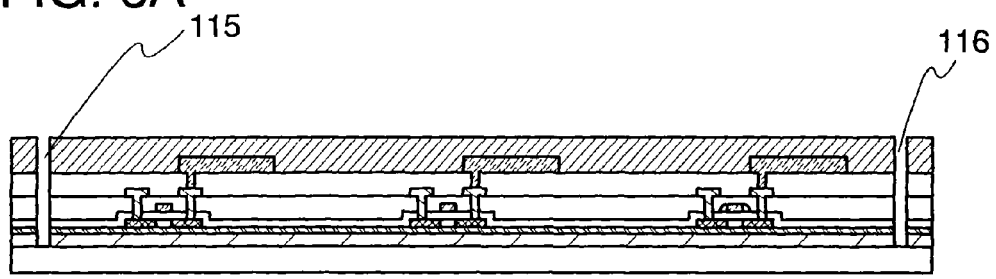
FIGS. 6A to 6C illustrate Embodiment Mode 6.

Next, as shown in FIG. 5C, the reinforcing layer 114 is irradiated with UV laser to form openings 115 and 116 as shown in FIG. 6A. By forming the openings 115 and 116 in this manner, the separation layer 101 is partially removed, which in turn allows a stack 118 having the first insulating film 102, the stacked layer 104 including a driver circuit of a light-emitting element, the third insulating film 112, the electrode 113, and the reinforcing layer 114 to be easily separated from the substrate 100. This separation is carried out at the inner side of the separation film 101, or at a boundary between the separation layer 101 and the first insulating film 102.

Although UV laser is used in this embodiment mode, the kind of laser used in the invention is not specifically limited as long as the opening 115 can be formed. A laser oscillator is composed of a laser medium, an excitation source, and a resonator. The laser can be categorized according to a medium used, into a gas laser, a liquid laser, and a solid-state laser. When categorizing lasers according to the feature of oscillation, there can be a free electron laser, a semiconductor laser, and an x-ray laser, and the invention can employ any of the aforementioned lasers. Note that a gas laser or a solid-state laser is preferably used, and it is more preferable to use a solid-state laser.

A gas laser includes a helium-neon laser, a carbon dioxide laser, an excimer laser, and an argon ion laser. An excimer laser includes a rare gas excimer laser and a rare gas halide excimer laser. A rare gas excimer laser oscillates by three kinds of excited molecules: argon, krypton, or xenon. An argon iron laser includes a rare gas ion laser and a metal vapor ion laser.

A liquid laser includes an inorganic liquid laser, an organic chelate laser, and a dye laser. As for the inorganic liquid laser and the organic chelate laser, rare earth ions such as neodymium, which are utilized for a solid-state laser, are used as laser media.

A laser medium used in a solid-state laser is a solid base doped with active species which can cause laser action. The solid base is a crystal or glass. The crystal is YAG (yttrium aluminum garnet crystal), YLF, YVO$_4$, YAlO$_3$, sapphire, ruby, or alexandrite. In addition, the active species which can cause laser action are, for example, trivalent irons such as Cr$^{3+}$, Nd$^{3+}$, Yb$^{3+}$, Tm$^{3+}$, Ho$^{3+}$, Er$^{3+}$, and Ti$^{3+}$.

When ceramic (polycrystal) is used as a medium, the medium can be formed into a free shape in a short time at low cost. In the case of using a single crystal as a medium, a columnar medium with several mm in diameter and several ten mm in length is usually used. Whereas, in the case of using ceramic (polycrystal) as a medium, a medium bigger than the case of using the single crystal can be formed. The concentration of a dopant such as Nd or Yb in a medium, which directly contributes to light emission, cannot be changed largely in either case of using a single crystal or a polycrystal, and therefore, there is some limitation in improvement in output of a laser by increasing the concentration of the dopant. However, when ceramic is used as a medium, the size of the medium can be significantly increased as compared with the case of using a single crystal, and therefore, drastic improvement in output of a laser can be expected. Further, when ceramic is used as a medium, the medium can be easily formed into a parallelepiped shape or a rectangular parallelepiped shape. When a medium having such a shape is used, and light is made travel in a zig-zag manner inside the medium, a path of the traveling light can be made long. Therefore, amplitude is increased and a laser beam can be oscillated at high output. Furthermore, since a laser beam emitted from a medium having such a shape has a cross section with a quadrangular shape, it is advantageous to be shaped into a linear beam, unlike a laser beam with a circular shape. By shaping a laser beam emitted in the aforementioned manner using an optical system, a linear beam with a short side of 1 mm or less and a long side of several mm to several m can be easily obtained. In addition, when the medium is uniformly irradiated with excited light, a linear beam is emitted with a uniform energy distribution in a lengthwise direction. By irradiating a semiconductor film with such a linear beam, the entire surface of the semiconductor film can be annealed uniformly. In the case where a linear beam that is uniform across its width is required to be used for annealing, each side of the beam is provided with a slit so as to block light of a portion where a linear beam is attenuated.

As a laser used in the present invention, a continuous wave (CW) laser or a pulsed laser can be used. Note that the laser irradiation conditions such as frequency, power density, energy density, and beam profile are controlled as appropriate in consideration of the thickness and materials of the first insulating film 102, the stacked layer 104 including a driver circuit of a light-emitting element, the third insulating film 112, the electrode 113, and the reinforcing layer 114.

Figure 6B:
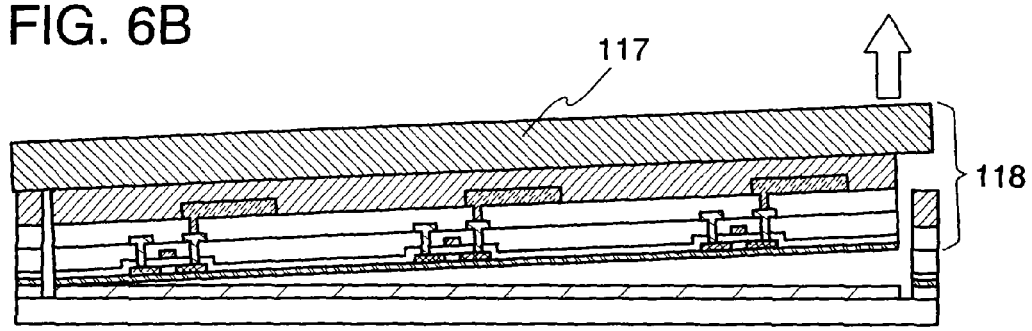

Note that at the time of separating the stack 118 having the first insulating film 102, the stacked layer 104 including a driver circuit of a light-emitting element, the third insulating film 112, the electrode 113, and the reinforcing film 114 from the substrate 100, the stack 118 having the first insulating film 102, the stacked layer 104 including a driver circuit of a light-emitting element, the third insulating film 112, the electrode 113, and the reinforcing film 114 is separated from the substrate 100 by attaching the surface of the reinforcing layer 114 to a first film 117 and pulling the first film 117 in the direction of the hollow arrow as shown in FIG. 6B. At this time, the substrate 100 and the stack 118 are separated from each other at the inner side of the separation film 101, or at a boundary between the separation layer 101 and the first insulating film 102. The stack 118 after separated from the substrate 100 has the first insulating film 102 as its outermost surface. The reinforcing layer 114 is a film for securing reinforcement at the time of separating the substrate 100 and the stack 118 from each other by pulling the first film 117. By providing the reinforcing layer 114, the stack 118 can be prevented from breaking in this step.

The first film 117 is a film with a structure where an adhesive layer is provided over a base film made of a resin material. For example, a holt-melt film, a UV (UltraViolet) separation film, a thermal separation film, and the like can be given as examples. As a material used for a base film, there are polyester, PET (polyethylene terephthalate), PEN (polyethylene naphthalate), and the like.

The hot-melt film has a structure where an adhesive layer made of a resin material is formed over the base film, with the condition that the resin material has a lower softening point than a base film. As examples of a material used for the adhesive layer, there are a polyethylene resin, polyester, EVA (ethylene vinyl acetate), and the like. In addition, the UV (UltraViolet) separation film has a structure where an adhesive layer made of a resin material, the viscosity of which becomes weak when irradiated with UV (UltraViolet), is formed over a base film. In addition, the thermal separation film has a structure where an adhesive layer made of a resin material, the viscosity of which becomes weak when heated, is formed over a base film.

Figure 6C:
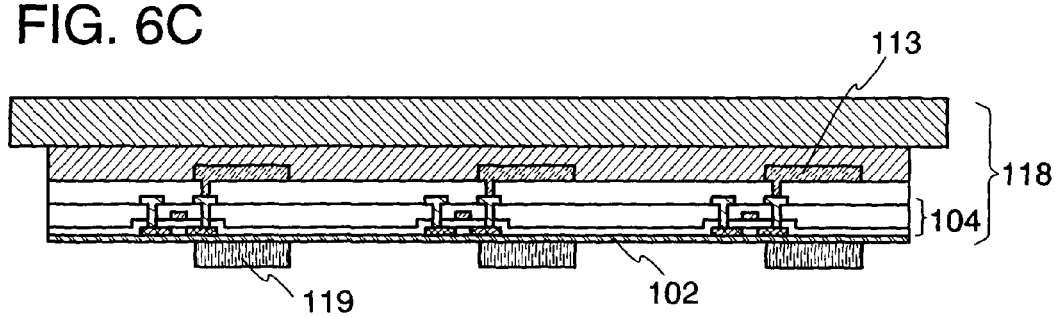

Then, as shown in FIG. 6C, a conductive film 119 is formed to have a thickness of 1 to several ten μm, or preferably 10 to 20 μm over a surface of the first insulating film 102 (i.e., rear surface of the thin film circuit), that is a surface of the first insulating film 102 where the stacked layer 104 including a driver circuit of a light-emitting element is not formed, in a position overlapping the electrode 113. The conductive film 119 may be formed by, for example, screen printing, using solder or a conductive material such as Au paste, Ag paste, Cu paste, Ni paste, or Al paste. When the conductive film 119 is formed to be as thin as 0.1 µm or less, it cannot easily make an electrical connection with the electrode 113 in the later step; therefore, the conductive film 119 is preferably formed to have a thickness of 0.1 µm or more.

Figure 7A:
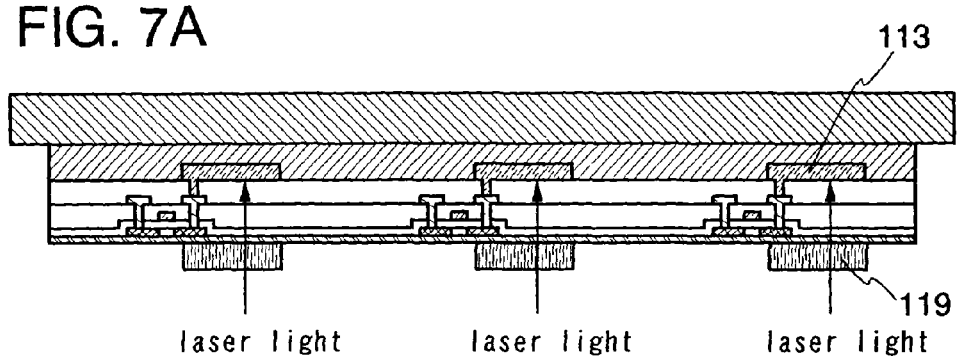
FIGS. 7A to 7C illustrate Embodiment Mode 6.
Figure 7B:
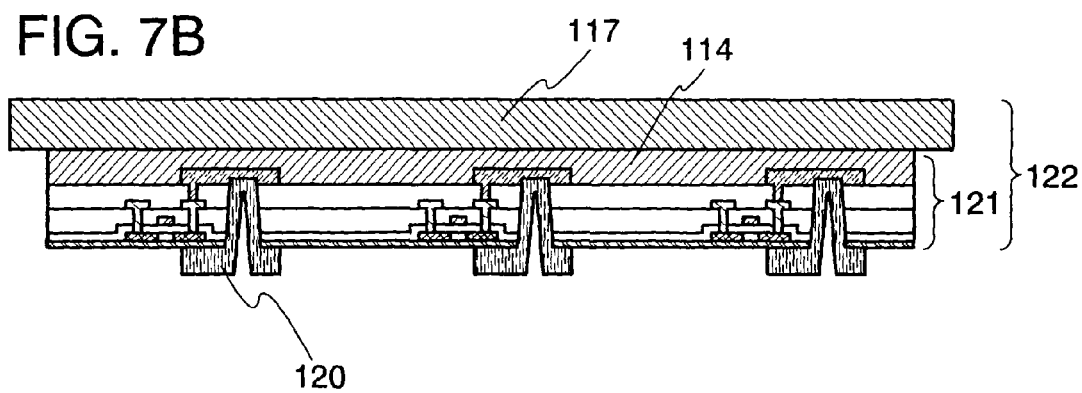

Then, as shown in FIG. 7A, the conductive film 119 is irradiated with laser. At this time, the laser output is adjusted so that the conductive film 119 penetrates the first insulating film 102, the stacked layer 104 including a driver circuit of a light-emitting element, and the third insulating film 112, so as to reach the electrode 113. Accordingly, the conductive film 119 and the electrode 113 are electrically connected in a manner as shown in FIG. 7B. In FIG. 7B, reference numeral 120 denotes an electrode electrically connected to the electrode 113.

As shown in FIG. 7B, a hole is formed in the first insulating film 102, the stacked layer 104 including a driver circuit of a light-emitting element, and the third insulating film 112 in a position irradiated with laser, and the material forming the conductive film 119 reaches the inside of the electrode 113 along sidewalls of the hole.

Note that although the example shown herein is the case where the laser output is adjusted so that the conductive film 119 is transformed to reach the electrode 113, the laser output may be adjusted so that a hole penetrating the reinforcing layer 114 and the first film 117 is formed.

In the aforementioned manner, a stack 122 having the first film 117 and a film 121 including a driver circuit of a light-emitting element in accordance with the second structure of the invention is manufactured. Hereinafter, description will be made of a step of attaching the first substrate to the stack 122 which is manufactured in the aforementioned manner to have the first film 117 and the film 121 including a driver circuit of a light-emitting element.

Although description will be made of a case where the stack is attached to the first substrate over which a light-emitting element is formed, which has the structure described in Embodiment Mode 1, the light-emitting element formed over the first substrate is not limited to this structure. The light-emitting element formed over the first substrate may have a similar structure to that described in Embodiment Mode 2 or 3.

Figure 7C:
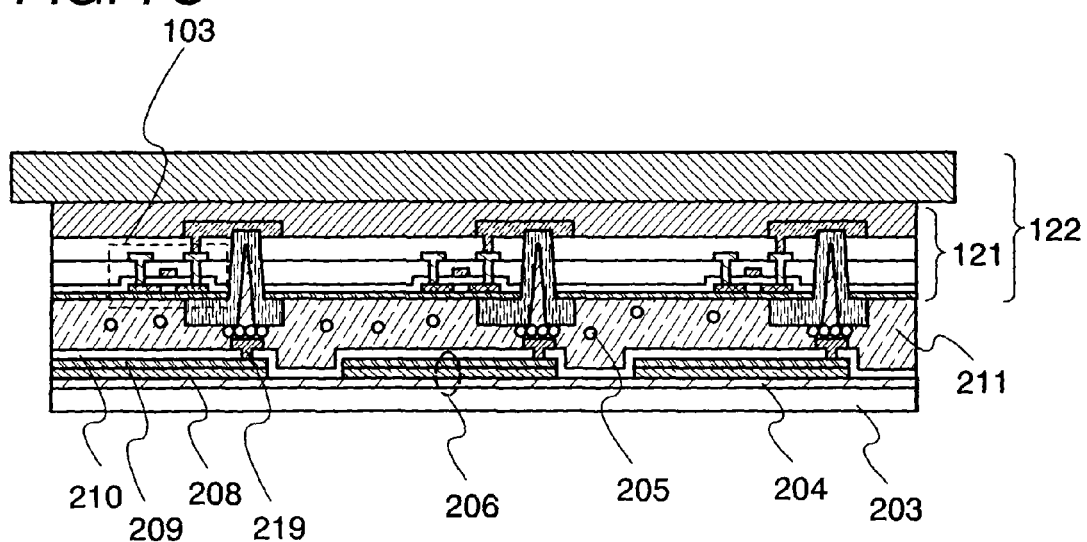

As shown in FIG. 7C, the first substrate 203 and the film 121 including a driver circuit of a light-emitting element are attached to each other with an anisotropic conductive film 211 so that a surface of the film 121 including a driver circuit of a light-emitting element, where the electrode 120 is formed, faces a surface of the first substrate 203 where a light-emitting element is formed. The anisotropic conductive film 211 is a material containing a conductive particle 205. As the anisotropic conductive film 211, ACP (Anisotropic Conductive Paste), an ACF (Anisotropic Conductive Film), and the like can be given as examples. By attaching the first substrate 203 and the film 121 including a driver circuit of a light-emitting element to each other with the anisotropic conductive film 211, the electrodes 120 and 219 are electrically connected through a conductive particle 205 included in the anisotropic conductive film 211.

Figure 8:
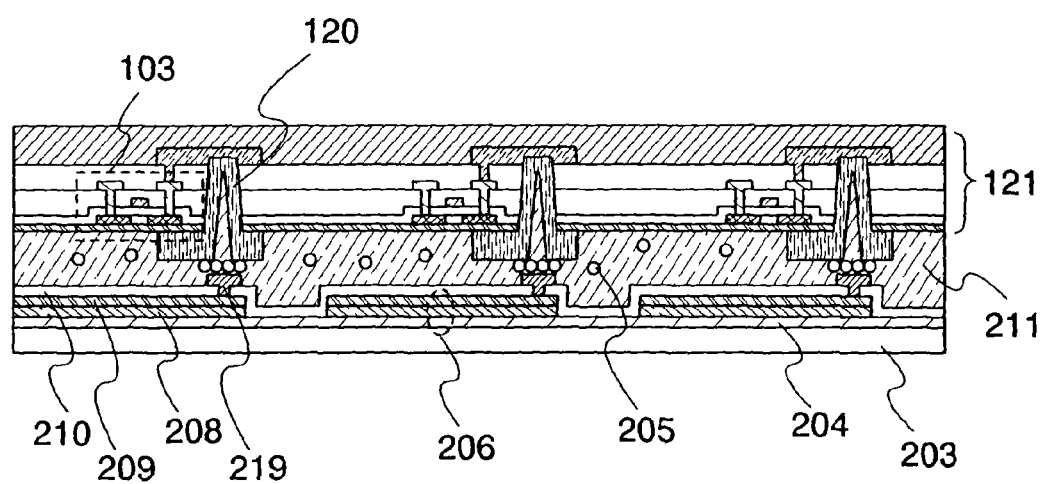
FIG. 8 illustrates Embodiment Mode 6.

Then, thermal treatment is applied to harden the anisotropic conductive film 211. In the case where a thermal separation film is used as the first film 117, the first film 117 can be separated from the reinforcing layer 114 by this thermal treatment. FIG. 8 shows a state after the first film 117 is separated from the reinforcing layer 114.

Although the description has been made heretofore of a case where the first film 117 is separated from the reinforcing layer 114 in the thermal treatment for hardening the anisotropic conductive film 211, the invention is not limited to this. For example, a UV (UltraViolet) separation film may be used as the first film 117, and in that case, after thermal treatment for hardening the anisotropic conductive film 211 is applied, the first film 117 may be separated from the reinforcing layer 114 by UV (UltraViolet) irradiation.

In addition, although FIG. 8 shows a case where the first film 117 is separated from the reinforcing layer 114, the first substrate 203 and the film 121 including a driver circuit of a light-emitting element can be attached to each other without separating the first film 117, that is, without detaching the first film from the reinforcing layer 114. In that case, a film (e.g., a hot-melt film) other than the thermal separation film and the UV (UltraViolet) separation film can be used as the first film 117.

Although the above description shows an example where the electrodes 120 and 219 are electrically connected by attaching the first substrate 203 and the film 121 including a driver circuit of a light-emitting element to each other, the method for electrically connecting the electrodes 120 and 219 is not limited to this, and any known connection method can be used. For example, the electrodes 120 and 219 may be electrically connected by using NCP (Non-Conductive Paste), or eutectic bonding with supersonic waves.

Description is made below of the cross-sectional structure of the light-emitting device shown in FIG. 8.

Note that description will be made by using the pixel circuit 609 shown in FIG. 12 as an illustrative configuration of a pixel circuit as in Embodiment Mode 1. In addition, a light-emitting element formed over the first substrate has the same structure as that in Embodiment Mode 1; therefore, portions common to Embodiment Mode 1 are denoted by common reference numerals, and thus their description will be omitted.

In FIG. 8, the first substrate 203 over which a plurality of light-emitting elements 206 are formed, and the film 121 including a driver circuit of a light-emitting element are provided to face each other. Note that in this embodiment mode, the first substrate 203 and the film 121 including a driver circuit of a light-emitting element are attached to each other so that the film 121 including a driver circuit of a light-emitting element faces a surface of the first substrate 203 where the light-emitting elements are formed. Accordingly, the film 121 including a driver circuit of a light-emitting element functions as a sealing substrate.

The light-emitting element 206 in FIG. 8 corresponds to the light-emitting element 607 in FIG. 12. In addition, the thin film transistor 103 in FIG. 8 corresponds to the driving transistor 606 in FIG. 12.

Although the cross section in FIG. 8 shows only a portion where the thin film transistor 103 (which corresponds to the driving transistor 606) is formed in the film 121 including a driver circuit of a light-emitting element, elements included in the pixel circuit 609 other than the driving transistor 606 (e.g., the switching transistor 605 and the capacitor 608) are also formed in the film 121 including a driver circuit of a light-emitting element.

As the first substrate 203, a light-transmissive substrate such as a glass substrate, a quartz substrate, or a light-transmissive resin substrate may be used.

The film 121 including a driver circuit of a light-emitting element is formed to have a structure including an organic insulating film, an inorganic insulating film, or the like.

Note that in the case of forming the light-emitting element 206 to have a structure where the light emitted from the light-emitting element 206 travels only in the direction of the first substrate 203, the film 121 including a driver circuit of a light-emitting element is not necessarily required to be a light-transmissive substrate. Accordingly, the film 121 including a driver circuit of a light-emitting element may include an organic insulating film or an inorganic insulating film which does not transmit light.

In the case of forming the light-emitting element 206 to have a structure where the light emitted from the light-emitting element 206 travels only in the direction of the film 121 including a driver circuit of a light-emitting element, the first substrate 203 is not necessarily required to be a light-transmissive substrate. Accordingly, the first substrate 203 may be a substrate which does not transmit light such as a resin substrate having no light transmissivity, a semiconductor substrate, a ceramic substrate, or a metal substrate. In this case, positions of the thin film transistor 103 and the light-emitting element 206 are required to be designed so as not to overlap with each other as much as possible.

The first substrate 203 and the film 121 including a driver circuit of a light-emitting element, which have the aforementioned structures, are attached to each other with an anisotropic conductive film 211. As the anisotropic conductive film 211, ACP (Anisotropic Conductive Paste), an ACF (Anisotropic Conductive Film), and the like can be given as examples. By attaching the first substrate 203 and the film 121 including a driver circuit of a light-emitting element to each other with the anisotropic conductive film 211, the electrodes 120 and 219 are electrically connected through a conductive particle 205 included in the anisotropic conductive film 211. That is, the light-emitting element 206 formed over the first substrate 203 and the thin film transistor 103 formed in the film 121 including a driver circuit of a light-emitting element are electrically connected.

Although FIG. 8 shows an example where the electrodes 120 and 219 are electrically connected by attaching the first substrate 203 and the film 121 including a driver circuit of a light-emitting element to each other with the anisotropic conductive film 211, the method for electrically connecting the electrodes 120 and 219 is not limited to this, and any known connection method can be used. For example, the electrodes 120 and 219 may be electrically connected by using NCP (Non-Conductive Paste), or eutectic bonding with supersonic waves.

In addition, a spacer may be provided between the first substrate 203 and the film 121 including a driver circuit of a light-emitting element as appropriate, when attaching the first substrate 203 and the film 121 including a driver circuit of a light-emitting element to each other.

Although FIG. 8 does not specifically show a connection between the first electrode 204 of the light-emitting element 206 and a power source, a counter potential is supplied to the first electrode 204 by providing a connecting terminal electrically connected to the first electrode 204 around the pixel portion 601 or in an outer region of the source signal line driver circuit 602 and the gate signal line driver circuit 603, and connecting the connecting terminal to an external power source provided in an IC or the like.

Although the description has been made heretofore of a case where the pixel circuit 609 shown in FIG. 12 is used as an example of a pixel circuit for driving a light-emitting element provided in each pixel, the structure thereof is not limited to this. The structure of the pixel circuit 609 shown in FIG. 12 is illustrative only, and therefore, this embodiment mode can be implemented in various other pixel circuits.

The pixel circuit 609 shown in FIG. 12 has a circuit configuration where the light-emitting element 607 is connected to the driving transistor 606 as a transistor for driving the light-emitting element 607. Accordingly, the light-emitting element 607 and the driving transistor 606 are electrically connected through an anisotropic conductive film. Thus, when applying the invention to other pixel circuit configurations, it is only required that an element that is to be connected to a light-emitting element be electrically connected to the light-emitting element through an anisotropic conductive film. In most of the pixel circuits, an element connected to a light-emitting element is a thin film transistor for driving the light-emitting element. Thus, in most cases, a light-emitting element and a transistor for driving the light-emitting element are electrically connected through an anisotropic conductive film.

The light-emitting device described in this embodiment mode is manufactured by forming a film including a pixel circuit for driving a light-emitting element through the process of: forming a pixel circuit for driving a light-emitting element over a substrate, and then separating the pixel circuit for driving a light-emitting element from the substrate. Thus, the thickness of the light-emitting device can be reduced. Accordingly, by using the light-emitting device in this embodiment mode for an electronic device and the like, the dimension of the electronic device in the thickness direction can be further reduced. Thus, the invention is advantageous in that downsizing can be achieved when applied to an electric device that is required to be reduced in size (a portable electronic device, in particular) such as a portable phone, a portable game machine, a mobile computer, a personal computer, and a camera (e.g., a digital camera and a video camera).

In addition, when the first substrate over which a light-emitting element is formed as a flexible substrate, a flexible light-emitting device can be provided. In that case, a resin substrate or the like can be used as the substrate over which a light-emitting element is formed. Further, a light-emitting element may be formed over the resin substrate by ink-jet method, printing, or the like.

Note that this embodiment mode can be implemented in combination with the techniques described in other embodiment modes as appropriate. Accordingly, for example, a structure where an image sensor is provided over a second substrate as in Embodiment Mode 4, or a structure where an image sensor is provided over a first substrate as in Embodiment Mode 5 can be used.

Embodiment Mode 7

In this embodiment mode, description is made of an example where the second substrate over which a driver circuit of a light-emitting element is formed is made thin, in the first structure of the invention.

Manufacturing steps of the first substrate over which a light-emitting element is formed is similar to those described in Embodiment Modes 1 to 3; therefore, manufacturing steps of the second substrate over which a driver circuit of a light-emitting element is formed is described first herein.

Figure 17A:
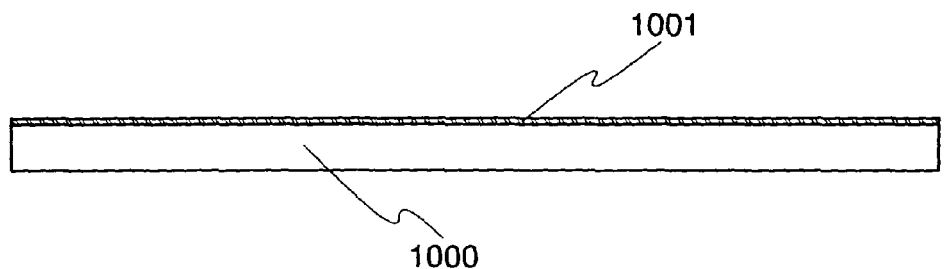
FIGS. 17A to 17C illustrate Embodiment Mode 7.

As shown in FIG. 17A, a first insulating film 1001 is formed over a substrate 1000. The first insulating film 1001 is a film functioning as a base film. As the first insulating film 1001, oxide of silicon, nitride of silicon, oxide of silicon containing nitrogen, nitride of silicon containing oxygen, or the like is formed by plasma CVD or sputtering.

Note that the substrate 1000 may be a quartz substrate, a semiconductor substrate, a glass substrate, a metal substrate, or the like.

Figure 17B:
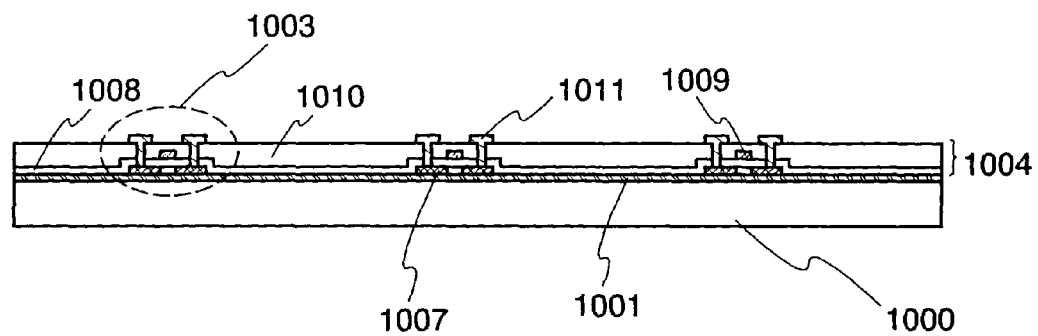

As shown in FIG. 17B, a stacked layer 1004 including a driver circuit of a light-emitting element is formed over the first insulating film 1001 by a known method. Hereinafter, description will be made of a case where the driver circuit of a light-emitting element is a pixel circuit for driving a light-emitting element.

As the stacked layer 1004 including a driver circuit of a light-emitting element, for example, a plurality of thin film transistors 1003, a second insulating film 1010 covering the plurality of thin film transistors 1003, and an electrode 1011 which makes a contact with the second insulating film 1010 and is electrically connected to a source or drain region of the plurality of thin film transistors 1003 are formed. Each thin film transistor 1003 includes an island-shaped semiconductor film 1007, a gate insulating film 1008, a gate electrode 1009, and the like.

As a method for forming the stacked layer 1004 including a driver circuit of a light-emitting element, a method similar to the formation method described in Embodiment Mode 6 can be used.

Note that the structure of the thin film transistor 1003 is not limited to the structure shown in FIG. 17B, and a thin film structure with a structure other than that shown in FIG. 17B may be employed. For example, the thin film transistor 1003 may have a structure of a known thin film transistor, such as a top-gate thin film transistor which is formed to have LDD regions (Lightly Doped Drain regions) by providing sidewalls on opposite sides of a gate electrode, a bottom-gate thin film transistor, or a thin film transistor having a silicide region.

Figure 17C:
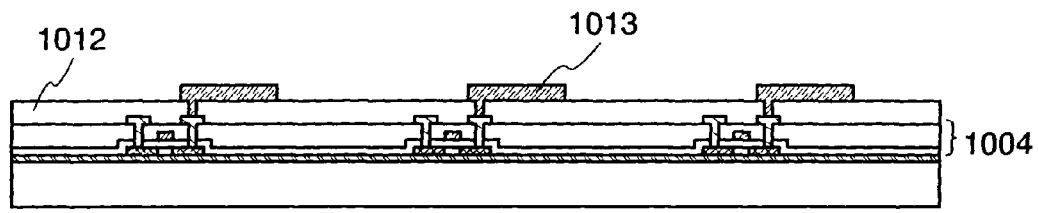

Then, as shown in FIG. 17C, a third insulating film 1012 is formed over the stacked layer 1004 including a driver circuit of a light-emitting element, and an electrode 1013, which is electrically connected to the electrode 1011, is formed over the third insulating film 1012.

The third insulating film 1012 is formed by a known method, using an inorganic material such as a silicon oxide film, a silicon nitride film, a silicon oxynitride film, or a silicon nitride oxide film; an organic material such as polyimide, polyamide, benzocyclobutene, acrylic, or epoxy; siloxane; or the like, to have either a single-layer structure or stacked-layer structure.

Although the electrode 1013 is formed to be connected to the electrode 1011 in FIG. 17C, the invention is not specifically limited to this case. It is only required to form an electrode at a portion of a thin film circuit that is to be electrically connected to an external circuit.

Figure 18A:
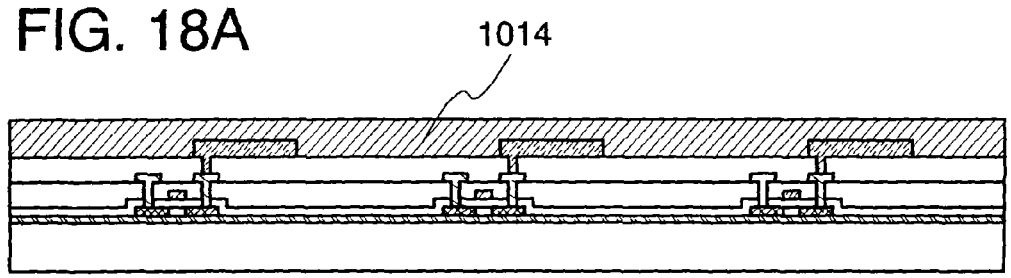
FIGS. 18A to 18C illustrate Embodiment Mode 7.

Next, as shown in FIG. 18A, a fourth insulating film 1014 is formed over the electrode 1013. The fourth insulating film 1014 is formed by a known method, using an inorganic material such as a silicon oxide film, a silicon nitride film, a silicon oxynitride film, or a silicon nitride oxide film; an organic material such as polyimide, polyamide, benzocyclobutene, acrylic, or epoxy; siloxane; or the like, to have either a single-layer structure or stacked-layer structure.

Figure 18B:
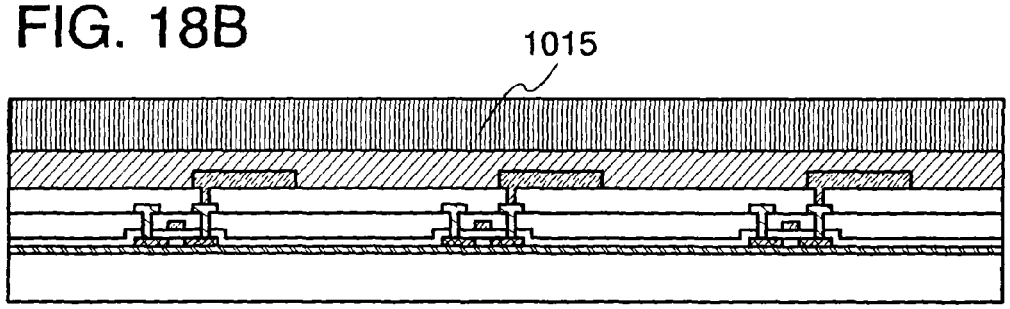

Then, as shown in FIG. 18B, a substrate 1015 is attached to the fourth insulating film 1014 by using an adhesive. As the substrate 1015, a quartz substrate, a semiconductor substrate, a glass substrate, a metal substrate, a resin substrate, or the like can be employed. As an adhesive, it is preferable to use an adhesive of which viscosity becomes weak when heat is applied thereto, or an adhesive of which viscosity becomes weak when irradiated with UV (UltraViolet). In addition, the substrate 1015 may be a film having a structure where an adhesive layer such as a holt-melt film, a UV (UltraViolet) separation film, or a thermal separation film is provided over a base film. In this case, an adhesive is not required in attaching the substrate 1015 to the fourth insulating film 1014.

In the case where the substrate 1015 is not attached to the fourth insulating film 1014, a stack having the stacked layer 1004 including a driver circuit of a light-emitting element, the third insulating film 1012, the electrode 1013, and the fourth insulating film 1014 is curled as the substrate 1000 is made thinner in the later step of thinning the substrate 1000 (thinning process). However, by attaching the substrate 1015, the stack having the stacked layer 1004 including a driver circuit of a light-emitting element, the third insulating film 1012, the electrode 1013, and the fourth insulating film 1014 can be prevented from being curled in the later step of thinning the substrate 1000.

Figure 18C:
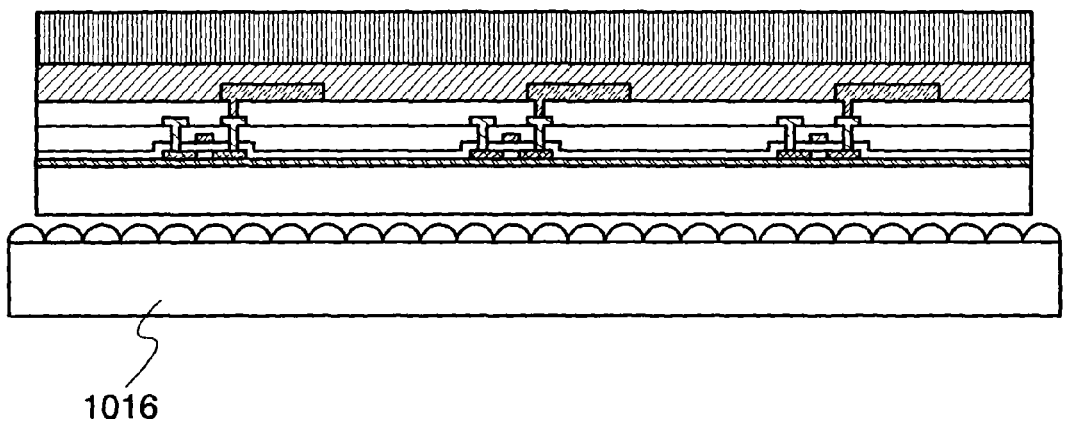

After the substrate 1015 is attached to the fourth insulating film 1014, a step of thinning the substrate 1000 is performed. This step allows the substrate 1000 to have a thickness of 100 μm or less, or preferably 20 to 50 μm. Here, the substrate 1000 is thinned with a grinder or a polisher 1016 as shown in FIG. 18C. In this case, the substrate 1000 may be thinned either by a grounding process using only a grinder, or by a polishing process using only a polisher; however, it is preferable to grind the substrate with a grinder first, and subsequently polish it with a polisher.

Note that in the case of performing the step of thinning the substrate 1000 by grinding or polishing, the first insulating film 1001 can be prevented from being ground or polished by forming a layer with higher Vickers hardness than the substrate 1000, between the substrate 1000 and the first insulating film 1001.

In addition, although a grinder or a polisher is used for thinning the substrate 1000 here, the invention is not limited to this. Wet etching may be used as a method for thinning the substrate 1000 as well. In this case, it is preferable to provide a film, which is resistant to an etchant used for etching the substrate 1000, between the substrate 1000 and the first insulating film 1001, so that it can prevent the first insulating film 1001 from being etched.

Note that the substrate 1000 may be thinned by combining grinding with wet etching, combining polishing with wet etching, or combining grinding and polishing with wet etching.

Figure 19A:
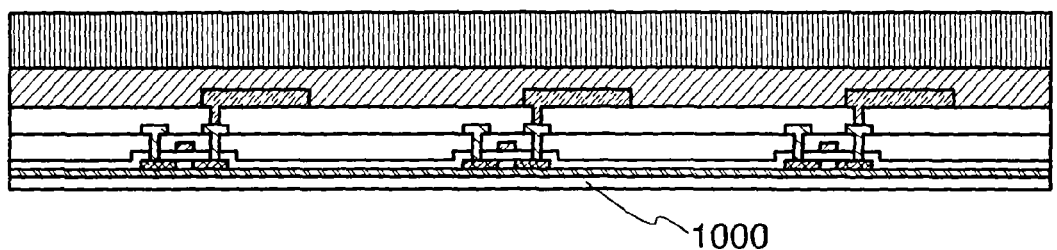
FIGS. 19A to 19C illustrate Embodiment Mode 7.

FIG. 19A shows a state in which the substrate 1000 is made thin through the thinning process of the substrate 1000. Although FIG. 19A shows a state in which the substrate 1000 remains, the substrate 1000 may be in the state of being completely removed or a part of the substrate 1000 may remain on the surface of the first insulating film 1001. Note that in the case where the substrate 1000 is in the state of being completely removed in this embodiment mode, a structure similar to the structure of a film including a driver circuit of a light-emitting element, which is manufactured in Embodiment Mode 6, is provided. Accordingly, in the case where the substrate 1000 is in the state of being completely removed in the structure of the second substrate side in this embodiment mode, it is to be called a film including a driver circuit of a light-emitting element.

Figure 19B:
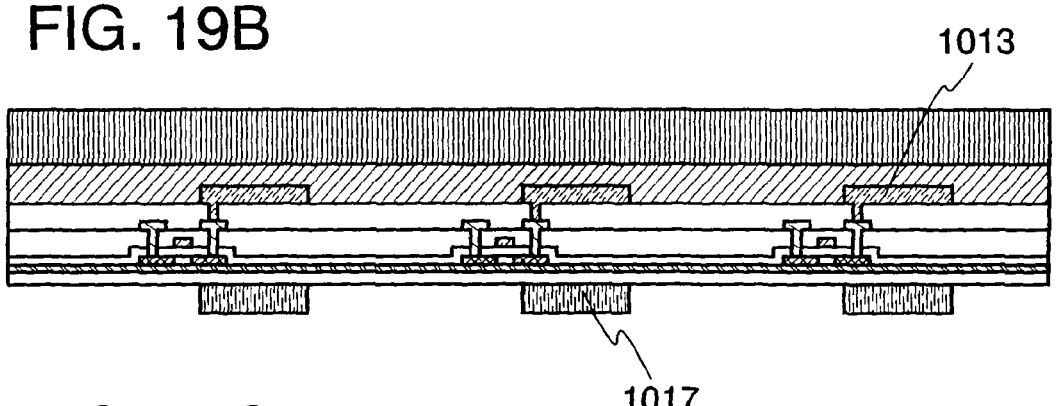

Then, as shown in FIG. 19B, a conductive film 1017 is formed to have a thickness of 1 to several ten μm, or preferably 10 to 20 μm over a surface of the substrate 1000 where the first insulating film 1001 is not formed, that is a rear surface of the thin film circuit, in a position overlapping the electrode 1013. The conductive film 1017 may be formed by, for example, screen printing, using solder or a conductive material such as Au paste, Ag paste, Cu paste, Ni paste, or Al paste. When the conductive film 1017 is formed to be as thin as 0.1 μm or less, it cannot easily make an electrical connection with the electrode 1013 in the later step; therefore, the conductive film 1017 is preferably formed to have a thickness of 0.1 μm or more.

Figure 19C:
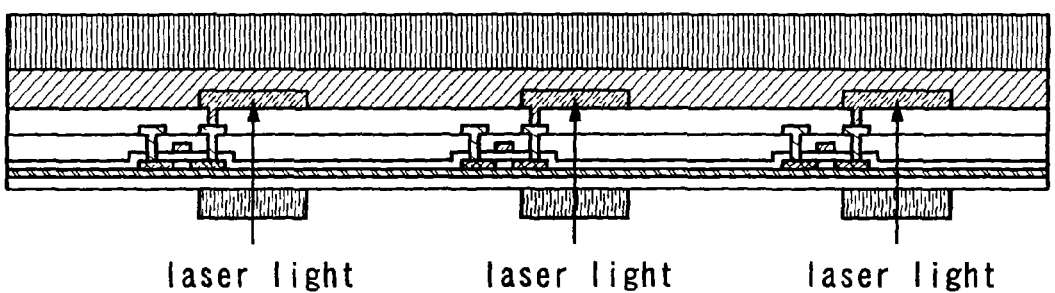
Figure 20A:
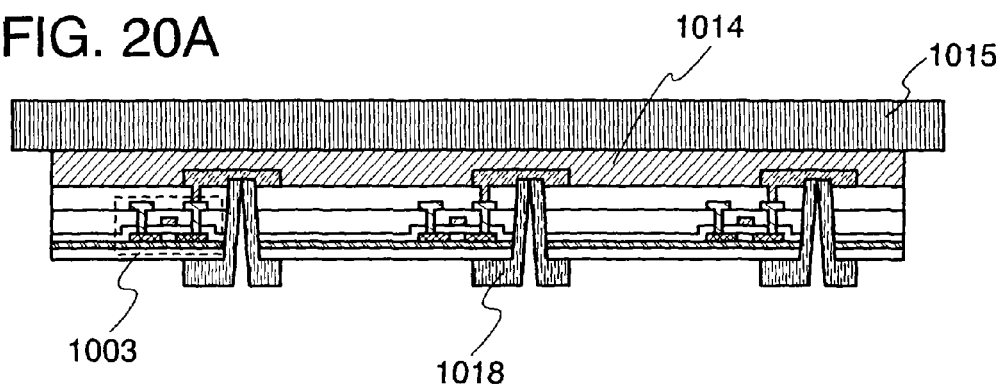
FIGS. 20A and 20B illustrate Embodiment Mode 7.

Then, as shown in FIG. 19C, the conductive film 1017 is irradiated with laser. At this time, the laser output is adjusted so that the conductive film 1017 penetrates the substrate 1000, the first insulating film 1001, the stacked layer 1004 including a driver circuit of a light-emitting element, and the third insulating film 1012, so as to reach the electrode 1013. Accordingly, the conductive film 1017 and the electrode 1013 are electrically connected in a manner as shown in FIG. 20A. In FIG. 20A, reference numeral 1018 denotes an electrode electrically connected to the electrode 1013.

As shown in FIG. 20A, a hole is formed in the substrate 1000, the first insulating film 1001, the stacked layer 1004 including a driver circuit of a light-emitting element, and the third insulating film 1012 in a position irradiated with laser, and the material forming the conductive film 1017 reaches the inside of the electrode 1013 along sidewalls of the hole.

Note that although the example shown herein is the case where the laser output is adjusted so that the conductive film 1017 is transformed to reach the electrode 1013, the laser output may be adjusted so that a hole penetrating the fourth insulating film 1014 and the substrate 1015 is formed.

In the aforementioned manner, the second substrate 1000 with the first structure of the invention, over which a driver circuit of a light-emitting element is formed, is manufactured. Hereinafter, description will be made of a step of attaching the first substrate to the second substrate 1000 which is manufactured in the aforementioned manner to have a driver circuit of a light-emitting element. Note that although the description will be made of a case of attaching the second substrate 1000 to the first substrate with the structure described in Embodiment Mode 1, the light-emitting element formed over the first substrate is not limited to this structure. The light-emitting element formed over the first substrate may have a similar structure to that described in Embodiment Mode 2 or 3.

Figure 20B:
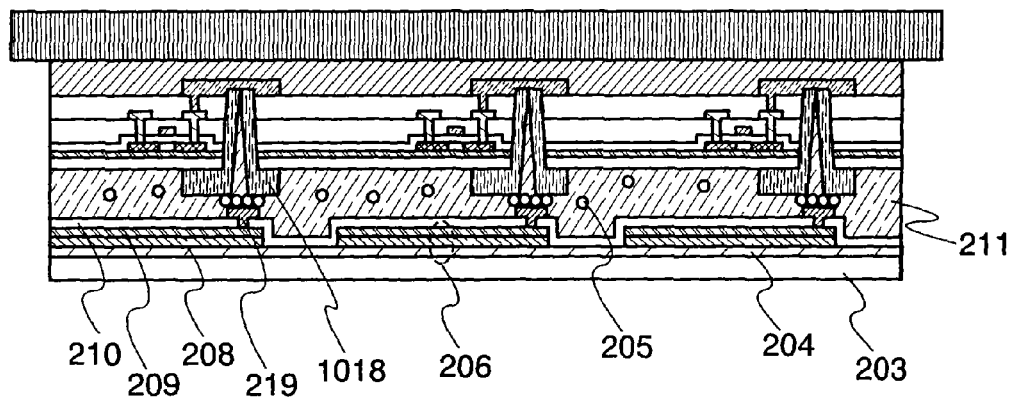

As shown in FIG. 20B, the first substrate 203 and the second substrate 1000 over which a driver circuit of a light-emitting element is formed, are attached to each other with an anisotropic conductive film 211 so that a surface of the second substrate 1000 having a driver circuit of a light-emitting element, where the electrode 1018 is formed, faces a surface of the first substrate 203 where a light-emitting element is formed. The anisotropic conductive film 211 is a material containing a conductive particle 205. As the anisotropic conductive film 211, ACP (Anisotropic Conductive Paste), an ACF (Anisotropic Conductive Film), and the like can be given as examples. By attaching the first substrate 203 and the second substrate 1000 over which a driver circuit of a light-emitting element is formed to each other with the anisotropic conductive film 211, the electrodes 219 and 1018 are electrically connected through a conductive particle 205.

Figure 21:
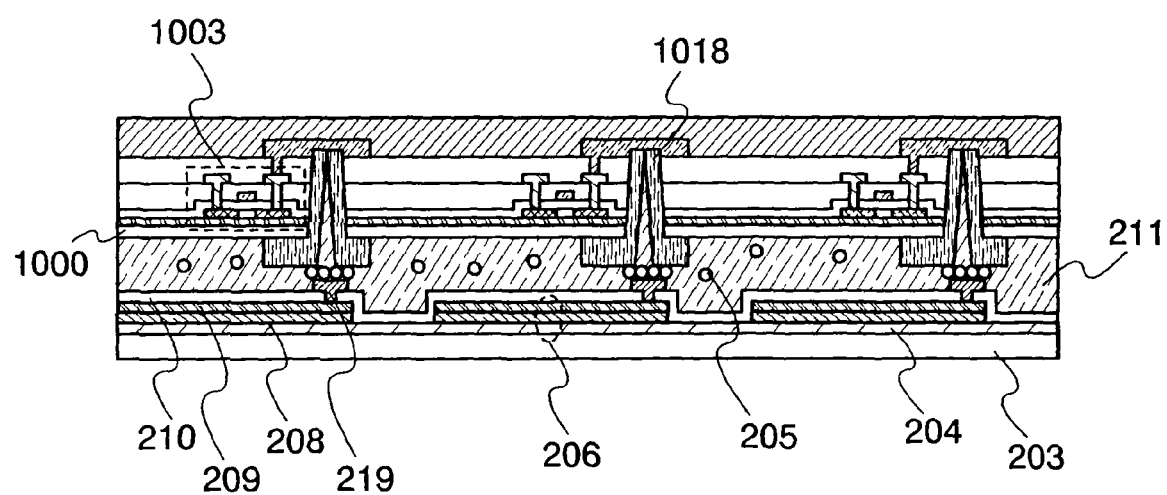
FIG. 21 illustrates Embodiment Mode 7.

Then, thermal treatment is applied to harden the anisotropic conductive film 211. In the case where the substrate 1015 and the fourth insulating film 1014 are attached to each other with the use of an adhesive of which viscosity becomes weak when heat is applied thereto, in attaching the substrate 1015 to the fourth insulating film 1014, the substrate 1015 can be separated from the fourth insulating film 1014 in this thermal treatment step. In addition, in the case where a thermal separation film is used as the substrate 1015, the thermal separation film can be separated from the fourth insulating film 1014 in this thermal treatment step. FIG. 21 shows a state after the substrate 1015 is separated from the fourth insulating film 1014.

Although the description has been made heretofore of a case where the substrate 1015 is separated in the thermal treatment for hardening the anisotropic conductive film 211, the invention is not limited to this. In attaching the substrate 1015 to the fourth insulating film 1014, attachment may be carried out by using an adhesive of which viscosity becomes weak when irradiated with UV (UltraViolet). Then, after applying thermal treatment for hardening the anisotropic conductive film 211, the substrate 1015 may be separated from the fourth insulating film 1014 by UV (UltraViolet) irradiation. Alternatively, a UV (UltraViolet) separation film may be used as the substrate 1015, and in that case, after thermal treatment for hardening the anisotropic conductive film 211 is applied, the substrate 1015 (UV (UltraViolet) separation film) may be separated from the fourth insulating film 1014 by UV (UltraViolet) irradiation.

In addition, although FIG. 21 shows a case where the substrate 1015 is separated from the fourth insulating film 1014, the first substrate 203 and the second substrate 1000 may be attached to each other without separating the substrate 1015 from the fourth insulating film 1014, that is, without detaching the fourth insulating film 1014 from the fourth insulating film 1014. In that case, a film (e.g., a hot-melt film) other than the thermal separation film and the UV (UltraViolet) separation film can be used as the substrate 1015.

Although the above description shows an example where the electrodes 219 and 1018 are electrically connected by attaching the first substrate 203 and the second substrate 1000 to each other with the anisotropic conductive film 211, the method for electrically connecting the electrodes 219 and 1018 is not limited to this, and any known connection method can be used. For example, the electrodes 219 and 1018 may be electrically connected by using NCP (Non-Conductive Paste), or eutectic bonding with supersonic waves.

Description is made below of the cross-sectional structure of the light-emitting device shown in FIG. 21.

Note that description will be made by using the pixel circuit 609 shown in FIG. 12 as an illustrative configuration of a pixel circuit as in Embodiment Mode 1. In addition, a light-emitting element formed over the first substrate has the same structure as that in Embodiment Mode 1; therefore, portions common to Embodiment Mode 1 are denoted by common reference numerals, and thus their description will be omitted.

In FIG. 21, the first substrate 203 over which a plurality of light-emitting elements 206 are formed, and the second substrate 1000 are provided to face each other. Note that in this embodiment mode, the first substrate 203 and the second substrate 1000 are attached to each other so that the second substrate 1000 faces a surface of the first substrate 203 where the light-emitting elements are formed. Accordingly, the second substrate 1000 functions as a sealing substrate.

The light-emitting element 206 in FIG. 21 corresponds to the light-emitting element 607 in FIG. 12. In addition, the thin film transistor 1003 in FIG. 21 corresponds to the driving transistor 606 in FIG. 12.

Although the cross section in FIG. 21 shows only a portion where the thin film transistor 1003 (which corresponds to the driving transistor 606) is formed over the second substrate 1000, elements included in the pixel circuit 609 other than the driving transistor 606 (e.g., the switching transistor 605 and the capacitor 608) are also formed over the second substrate 1000.

As the first substrate 203, a light-transmissive substrate such as a glass substrate, a quartz substrate, or a light-transmissive resin substrate may be used.

Note that in the case of forming the light-emitting element 206 to have a structure where the light emitted from the light-emitting element 206 travels only in the direction of the first substrate 203, the second substrate 1000 is not required to have light transmissivity.

In addition, in the case of forming the light-emitting element 206 to have a structure where the light emitted from the light-emitting element 206 travels only in the direction of the second substrate 1000, the first substrate 203 is not necessarily required to be a light-transmissive substrate. Accordingly, the first substrate 203 may be a substrate which does not transmit light such as a resin substrate having no light transmissivity, a semiconductor substrate, a ceramic substrate, or a metal substrate.

The first substrate 203 and the second substrate 1000 having the aforementioned structures are attached to each other with an anisotropic conductive film 211. As the anisotropic conductive film 211, ACP (Anisotropic Conductive Paste), an ACF (Anisotropic Conductive Film), and the like can be given as examples. By attaching the first substrate 203 and the second substrate 1000 to each other with the anisotropic conductive film 211, the electrodes 219 and 1018 are electrically connected through a conductive particle 205 included in the anisotropic conductive film 211. That is, the light-emitting element 206 formed over the first substrate 203 and the thin film transistor 1003 formed over the second substrate 1000 are electrically connected.

Although FIG. 21 shows an example where the electrodes 219 and 1018 are electrically connected by attaching the first substrate 203 and the second substrate 1000 to each other with the anisotropic conductive film 211, the method for electrically connecting the electrodes 219 and 1018 is not limited to this, and any known connection method can be used. For example, the electrodes 219 and 1018 may be electrically connected by using NCP (Non-Conductive Paste), or eutectic bonding with supersonic waves.

In addition, a spacer may be provided between the first substrate 203 and the second substrate 1000 as appropriate when attaching the first substrate 203 and the second substrate 1000 to each other.

Although FIG. 21 does not specifically show a connection between the first electrode 204 of the light-emitting element 206 and a power source, a counter potential is supplied to the first electrode 204 by providing a connecting terminal electrically connected to the first electrode 204 around the pixel portion 601 or in an outer region of the source signal line driver circuit 602 and the gate signal line driver circuit 603, and connecting the connecting terminal to an external power source provided in an IC or the like.

Although the description has been made heretofore of a case where the pixel circuit 609 shown in FIG. 12 is used as an example of a pixel circuit for driving a light-emitting element provided in each pixel, the structure thereof is not limited to this. The structure of the pixel circuit 609 shown in FIG. 12 is illustrative only, and therefore, this embodiment mode can be implemented in various other pixel circuits.

The pixel circuit 609 shown in FIG. 12 has a circuit configuration where the light-emitting element 607 is connected to the driving transistor 606 as a thin film transistor for driving the light-emitting element 607. Accordingly, the light-emitting element 607 and the driving transistor 606 are electrically connected through an anisotropic conductive film. Thus, when applying the invention to other pixel circuit configurations, it is only required that an element that is to be connected to a light-emitting element be electrically connected to the light-emitting element through an anisotropic conductive film. In most of the pixel circuits, an element connected to a light-emitting element is a thin film transistor for driving the light-emitting element. Thus, in most cases, a light-emitting element and a transistor for driving the light-emitting element are electrically connected through an anisotropic conductive film.

Since the light-emitting device described in this embodiment mode is formed through a process of thinning a substrate over which a pixel circuit for driving a light-emitting element is formed (thinning process), the thickness of the light-emitting device itself can be reduced. Accordingly, by using the light-emitting device in this embodiment mode for an electronic device and the like, the dimension of the electronic device in the thickness direction can be further reduced. Thus, the invention is advantageous in that downsizing can be achieved when applied to an electric device that is required to be reduced in size (a portable electronic device, in particular) such as a portable phone, a portable game machine, a mobile computer, a personal computer, and a camera (e.g., a digital camera and a video camera).

In addition, when the substrate over which a pixel circuit for driving a light-emitting element is formed to be thin enough to have flexibility, and the substrate over which a light-emitting element is formed as a flexible substrate, a flexible light-emitting device can be provided. In this case, a resin substrate or the like can be used as the substrate over which a light-emitting element is formed. Further, a light-emitting element may be formed over the resin substrate by ink-jet method, printing, or the like.

Note that this embodiment mode can be implemented in combination with the techniques described in other embodiment modes as appropriate. Accordingly, for example, a structure where an image sensor is provided over a second substrate as in Embodiment Mode 4, or a structure where an image sensor is provided over a first substrate as in Embodiment Mode 5 can be used.

Embodiment Mode 8

In this embodiment mode, description is made of an example of a passive matrix light-emitting element, where a light-emitting element formed over a first substrate and a transistor formed over a second substrate are electrically connected. That is, description is made of an example of a case where the light-emitting device with the first structure of the invention is a passive matrix light-emitting device.

Figure 13:
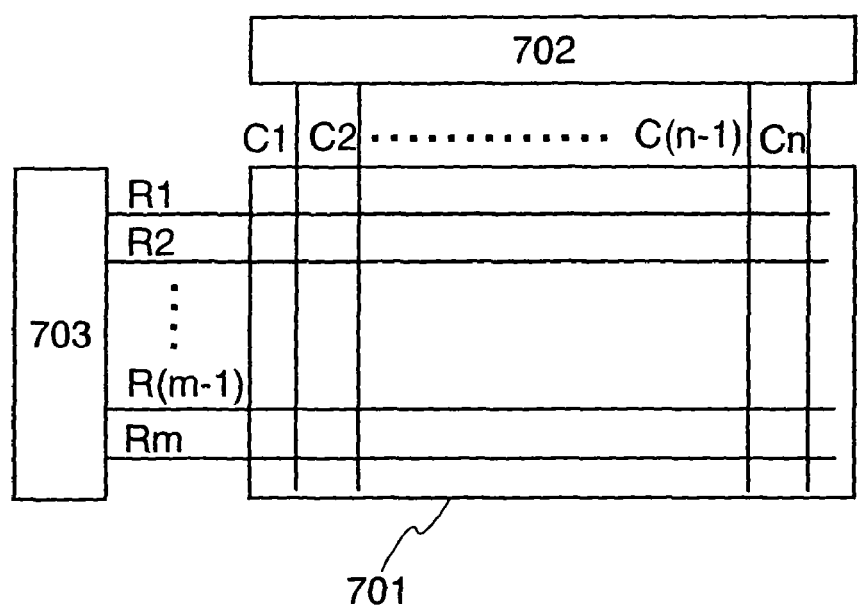
FIG. 13 illustrates a passive matrix light-emitting device.

FIG. 13 shows a schematic view of a passive matrix light-emitting device. As shown in FIG. 13, the passive matrix light-emitting device includes a pixel portion 701, a first driver circuit (hereinafter called a "column driver") 702, a second driver circuit (hereinafter called a "row driver") 703, signal lines (C1 to Cn) connected to the column driver, and signal lines (R1 to Rm) connected to the row driver.

Figure 14:
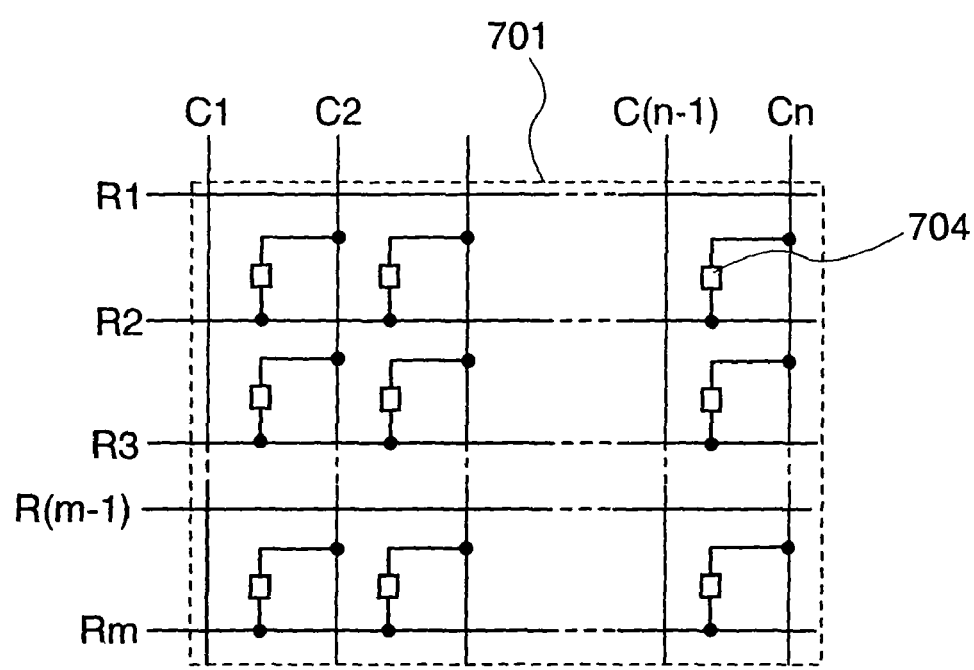
FIG. 14 illustrates a pixel portion of a passive matrix light-emitting device.

FIG. 14 shows an equivalent circuit diagram of the pixel portion 701. The signal lines C1 to Cn and the signal lines R1 to Rm are formed to cross at right angles with each other. A light-emitting element 704 is formed at each intersection of the signal lines C1 to Cn and the signal lines R1 to Rm.

In the passive matrix light-emitting device with the aforementioned structure in accordance with this embodiment mode, the signal lines C1 to Cn, the signal lines R1 to Rm, and the light-emitting element 704 are formed over a first substrate, while the column driver 702 and the row driver 703 are formed over the second substrate. Then, the column driver 702 is electrically connected to the signal lines C1 to Cn, and the row driver 703 is electrically connected to the signal lines R1 to Rm.

Figure 9A:
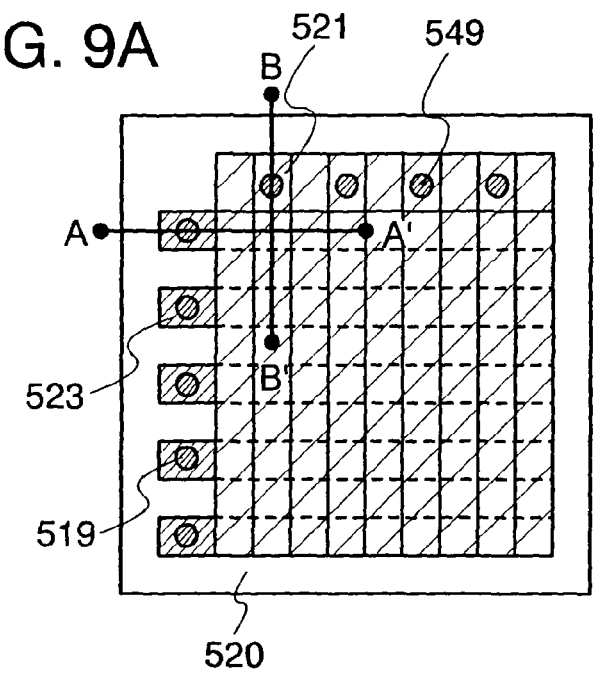
FIGS. 9A to 9C illustrate Embodiment Mode 8.

FIG. 9A shows a top view of the first substrate of the light-emitting device in this embodiment mode. Wires 521 corresponding to the signal lines C1 to Cn, wires 523 corresponding to the signal lines R1 to Rm, and a layer 522 containing a light-emitting substance are formed over a first substrate 520. The wires 521 and 523 are formed to cross at right angles with each other.

Figure 9B:
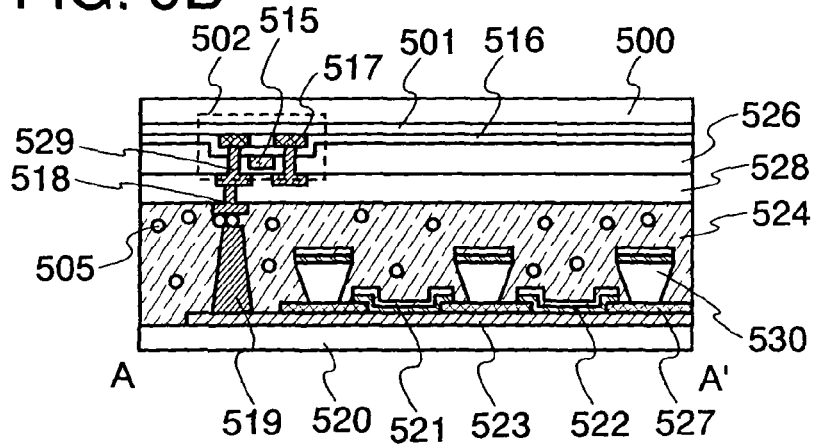
Figure 9C:
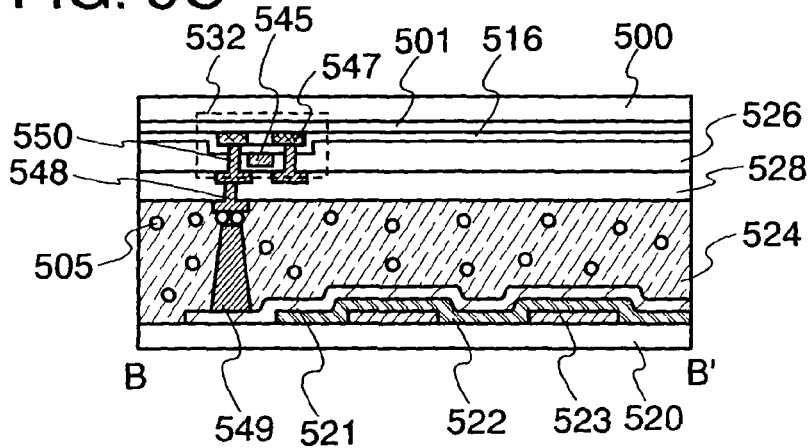

FIG. 9B shows a cross section along a line A-A' in FIG. 9A, while FIG. 9C shows a cross section along a line B-B' in FIG. 9A. Note that each of FIGS. 9B and 9C shows a cross section in the state where the second substrate is provided to face the first substrate.

The cross-sectional structure along a line A-A' in FIG. 9A will be described with reference to FIG. 9B. The wire 523 corresponding to the signal lines R1 to Rm is formed over the first substrate 520, and insulating films 527 are formed in stripes over the wire 523 corresponding to the signal lines R1 to Rm. Then, a partition wall 530 having a narrower width than the insulating film 527 is formed over each insulating film 527. The partition wall 530 is formed to have a top wider than its bottom. Then, the layer 522 containing a light-emitting substance is formed over the wire 523 corresponding to the signal lines R1 to Rm and the partition wall 530, and further, the wire 521 corresponding to the signal lines C1 to Cn is formed over the layer 522 containing a light-emitting substance.

An electrode 519 is formed over the wire 523 corresponding to the signal lines R1 to Rm, so as to be electrically connected to the wire 523 corresponding to the signal lines R1 to Rm.

A thin film transistor 502 included in the row driver 703 is formed over a second substrate 500 which is provided to face the first substrate 520. In FIG. 9B, the thin film transistor 502 includes a semiconductor film 517, a gate insulating film 516, and a gate electrode 515 which are formed over the second substrate with a base film 501 sandwiched therebetween.

A first interlayer insulating film 526 is formed over the thin film transistor 502, and an electrode 529 is formed over the first interlayer insulating film 526, in manner electrically connected to the semiconductor film 517 of the thin film transistor 502. Then, a second interlayer insulating film 528 is formed over the electrode 529 and the first interlayer insulating film 526, and further, an electrode 518, which is electrically connected to the electrode 529, is formed over the second interlayer insulating film 528. Accordingly, the thin film transistor 502 and the electrode 518 are electrically connected.

The first substrate 520 and the second substrate 500 having the aforementioned structures are attached to each other with an anisotropic conductive film 524. As the anisotropic conductive film 524, ACP (Anisotropic Conductive Paste), an ACF (Anisotropic Conductive Film), and the like can be given as examples. By attaching the first substrate 520 and the second substrate 500 to each other with the anisotropic conductive film 524, the electrodes 518 and 519 are electrically connected through a conductive particle 505 included in the anisotropic conductive film 524. That is, the wire 523 formed over the first substrate 520 and the thin film transistor 502 formed over the second substrate 500 are electrically connected.

Next, the cross-sectional structure along a line B-B' in FIG. 9A is described with reference to FIG. 9C. The wire 523 corresponding to the signal lines R1 to Rm is formed over the first substrate 520, the layer 522 containing a light-emitting substance is formed over the wire 523 corresponding to the signal lines R1 to Rm, and the wire 521 corresponding to the signal line C1 to Cn is formed over the layer 522 containing a light-emitting substance.

An electrode 549 is formed over the wire 521 corresponding to the signal lines C1 to Cn, so as to be electrically connected to the wire 521 corresponding to the signal lines C1 to Cm.

A thin film transistor 532 included in the column driver 702 is formed over the second substrate 500 which is provided to face the first substrate 520. In FIG. 9C, the thin film transistor 532 includes a semiconductor film 547, the gate insulating film 516, and the gate electrode 515 which are formed over the second substrate with the base film 501 sandwiched therebetween.

The first interlayer insulating film 526 is formed over the thin film transistor 532, and an electrode 550, which is electrically connected to the semiconductor film 547 of the thin film transistor 532, is formed over the first interlayer insulating film 526. Then, the second interlayer insulating film 528 is formed over the electrode 550 and the first interlayer insulating film 526, and further an electrode 548, which is electrically connected to the electrode 550, is formed over the second interlayer insulating film 528.

The first substrate 520 and the second substrate 500 having the aforementioned structures are attached to each other with the anisotropic conductive film 524. As the anisotropic conductive film 524, ACP (Anisotropic Conductive Paste), an ACF (Anisotropic Conductive Film), and the like can be given as examples. By attaching the first substrate 520 and the second substrate 500 to each other with the anisotropic conductive film 524, the electrodes 548 and 549 are electrically connected through the conductive particle 505 included in the anisotropic conductive film 524. That is, the wire 521 formed over the first substrate 520 and the thin film transistor 532 formed over the second substrate 500 are electrically connected.

Although FIGS. 9A to 9C show an example where the electrodes 518 and 519, and the electrodes 548 and 549 are electrically connected by attaching the first substrate 520 and the second substrate 500 to each other with the anisotropic conductive film 524, the method for electrically connecting the electrodes 518 and 519, and the electrodes 548 and 549 is not limited to this, and any known connection method can be used. For example, the electrodes 518 and 519, and the electrodes 548 and 549 are may be electrically connected by using NCP (Non Conductive-Paste), or eutectic bonding with supersonic waves.

In addition, a spacer may be provided between the first substrate 520 and the second substrate 500 as appropriate when attaching the first substrate 520 and the second substrate 500 to each other.

By forming the light-emitting device in this embodiment mode to have the aforementioned structure, the column driver 702 and the row driver 703 for driving a light-emitting element can be formed over a different substrate than the light-emitting element.

By employing such a structure, the driver circuits can be formed over a sealing substrate; therefore, the light-emitting device can be reduced in size.

Note that this embodiment mode can be implemented in combination with the techniques described in other embodiment modes as appropriate. Accordingly, for example, a structure where a driver circuit of a light-emitting element is formed using a film including a pixel circuit for driving a light-emitting element instead of using a second substrate as in Embodiment Mode 6, or a structure where a second substrate is thinned as in Embodiment Mode 7 can be used.

Embodiment Mode 9

In this embodiment mode, description is made of the fourth example of an active matrix light-emitting device, where a light-emitting element formed over a first substrate and a transistor formed over a second substrate are electrically connected. That is, description is made of the fourth example of a case where the light-emitting device with the first structure of the invention is an active matrix light-emitting device.

Note that description will be made by using the pixel circuit 609 shown in FIG. 12 as an illustrative configuration of a pixel circuit as in Embodiment Mode 1.

Note also that in this embodiment mode, transistors included in the pixel circuit 609 may be transistors other than thin film transistors as in Embodiment Mode 1. For example, the pixel circuit over the second substrate may be formed by using a semiconductor substrate as the second substrate and by forming a MOS transistor and the like on the semiconductor substrate.

Figure 33A:
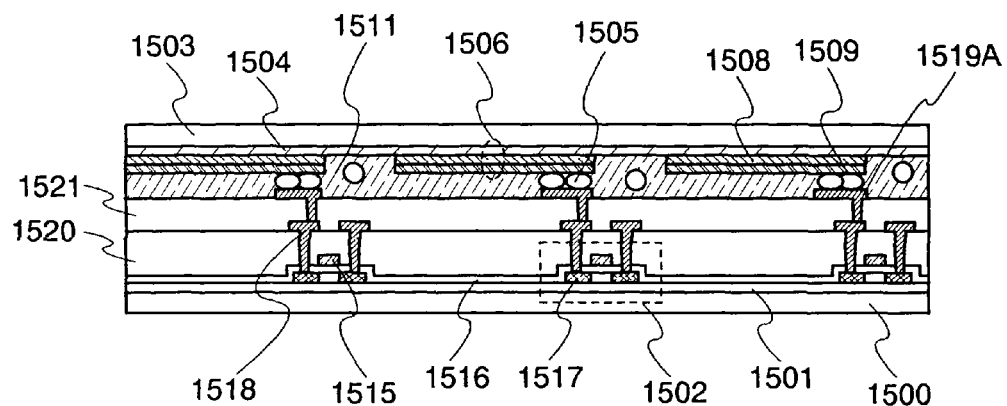
FIGS. 33A and 33B illustrate Embodiment Mode 10.

FIG. 33A shows a partial cross section of a light-emitting element in this embodiment mode.

In FIG. 33A, a first substrate 1503 over which a plurality of light-emitting elements 1506 are formed is provided to face a second substrate 1500 over which a plurality of thin film transistors 1502 are formed. Note that in FIG. 33A, the first substrate 1503 and the second substrate 1500 are attached to each other so that the second substrate 1500 faces a surface of the first substrate 1503 where the light-emitting elements are formed. Accordingly, the second substrate 1500 functions as a sealing substrate.

The light-emitting element 1506 in FIG. 33A corresponds to the light-emitting element 607 in FIG. 12. In addition, the thin film transistor 1502 in FIG. 33A corresponds to the driving transistor 606 in FIG. 12.

Each of the first substrate 1503 and the second substrate 1500 may be a light-transmissive substrate such as a glass substrate, a quartz substrate, or a light-transmissive resin substrate. Note that in the case where the light-emitting element 1506 is formed to have a structure where the light emitted from the light-emitting element 1506 travels only in the direction of the first substrate 1503, the second substrate 1500 is not necessarily required to be a light-transmissive substrate. Accordingly, the second substrate 1500 may be a substrate which does not transmit light such as a resin substrate having no light transmissivity, a semiconductor substrate, a ceramic substrate, or a metal substrate.

In the case where the light-emitting element 1506 is formed to have a structure where the light emitted from the light-emitting element 1506 travels only in the direction of the second substrate 1500, the first substrate 1503 is not necessarily required to be a light-transmissive substrate. Accordingly, the first substrate 1503 may be a substrate which does not transmit light such as a resin substrate having no light transmissivity, a semiconductor substrate, a ceramic substrate, or a metal substrate.

In addition, the first substrate 1503 and the second substrate 1500 may be the aforementioned substrates but are formed to be thin enough to have flexibility.

The light-emitting element 1506 formed over the first substrate 1503 includes a first electrode 1504, a layer 1508 containing a light-emitting substance, and a second electrode 1509.

The first electrode 1504 is formed over the first substrate 1503. Then, the layer 1508 containing a light-emitting substance is formed over the first electrode 1504 of the light-emitting element, and the second electrode 1509 of the light-emitting element is formed over the layer 1508 containing a light-emitting substance.

The materials used for the first electrode 1504 and the second electrode 1509 of the light-emitting element and the like may be selected from those described in Embodiment Mode 1. In addition, the layer 1508 containing a light-emitting substance may have a known layer structure as has been described in Embodiment Mode 1.

On the other hand, the thin film transistor (driving transistor) 1502 for driving the light-emitting element 1506 is formed over the second substrate 1500 which is provided to face the first substrate 1503. In FIG. 33A, the thin film transistor 1502 includes a semiconductor film 1517, a gate insulating film 1516, and a gate electrode 1515 formed over the second substrate 1500 with the base film 1501 sandwiched therebetween.

A first interlayer insulating film 1520 is formed over the thin film transistor 1502, and an electrode 1518, which is electrically connected to a source or drain region of the semiconductor film 1517 of the thin film transistor 1502, is formed over the first interlayer insulating film 1520.

Then, a second interlayer insulating film 1521 is formed over the electrode 1518 and the first interlayer insulating film 1520, and an electrode 1519A, which is electrically connected to one of the electrodes 1518, is formed over the second interlayer insulating film 1521.

The first substrate 1503 and the second substrate 1500 having the aforementioned structures are attached to each other with an anisotropic conductive film 1511. As the anisotropic conductive film 1511, ACP (Anisotropic Conductive Paste), an ACF (Anisotropic Conductive Film), and the like can be given as examples. By attaching the first substrate 1503 and the second substrate 1500 to each other with the anisotropic conductive film 1511, the electrodes 1509 and 1519A are electrically connected through a conductive particle 1505 included in the anisotropic conductive film 1511. That is, the light-emitting element 1506 formed over the first substrate 1503 and the thin film transistor 1502 formed over the second substrate 1500 are electrically connected.

Although FIG. 33A shows an example where the electrodes 1509 and 1519A are electrically connected by attaching the first substrate 1503 and the second substrate 1500 to each other with the anisotropic conductive film 1511, the method for electrically connecting the electrodes 1509 and 1519A is not particularly limited to this, and any known connection method may be employed. For example, the electrodes 1509 and 1519A may be electrically connected by using NCP (Non-Conductive Paste) or eutectic bonding with supersonic waves.

In addition, a spacer may be provided between the first substrate 1503 and the second substrate 1500 as appropriate when attaching the first substrate 1503 and the second substrate 1500 to each other.

Although FIG. 33 does not specifically show a connection between the first electrode 1504 of the light-emitting element 1506 and a power source, a counter potential is supplied to the first electrode 1504 by providing a connecting terminal electrically connected to the first electrode 1504 around the pixel portion 601 or in an outer region of the source signal line driver circuit 602 and the gate signal line driver circuit 603, and connecting the connecting terminal to an external power source provided in an IC or the like.

Figure 33B:
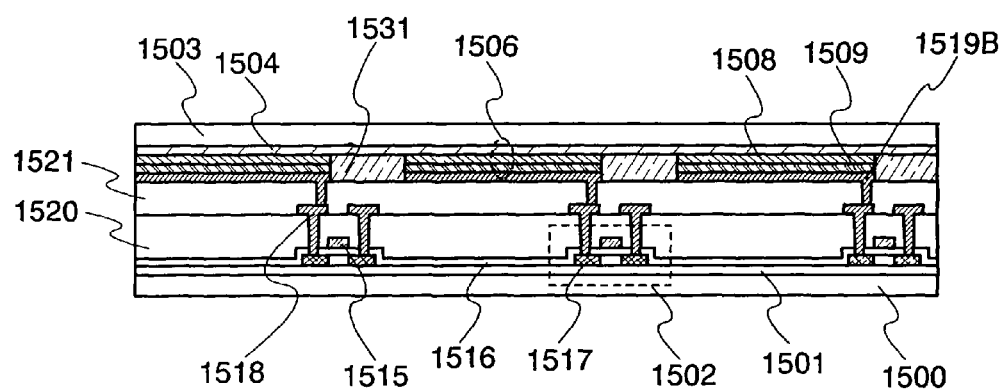

FIG. 33B shows an example where the second electrode 1509 of the light-emitting element and an electrode 1519B are electrically connected by using NCP (Non-Conductive Paste).

In the structure shown in FIG. 33B, the first substrate 1503 and the second substrate 1500 are attached to each other with the NCP 1531 so that the second electrode 1509 and the electrode 1519B are connected.

In this case, it is preferable to form an electrode larger than the electrode 1519A in FIG. 33A, over the second interlayer insulating film 1521 as shown by 1519B, so as to be easily connected to the second electrode 1509 of the light-emitting element. In addition, in this case, the first substrate 1503 and the second substrate 1500 are preferably attached to each other in vacuum.

In the structure shown in FIG. 33B, in the case where the light-emitting element 1506 is formed to have a structure where the light emitted from the light-emitting element 1506 travels only in the direction of the second substrate 1500, the electrode 1519B is formed with a light-transmissive conductive film.

In addition, in the structure shown in FIG. 33B, in the case where the light-emitting element 1506 is formed to have a structure where the light emitted from the light-emitting element 1506 travels in both directions of the first substrate 1503 and the second substrate 1500, the electrode 1519B is formed with a metal film having a reflecting function or a light-transmissive conductive film. In the case where the electrode 1519B is formed with a metal film having a reflecting function, the light emitted from the light-emitting element 1506 in the direction of the second substrate 1500 is reflected by the electrode 1519B to be redirected to the first substrate 1503; therefore, the light emitted from the light-emitting element 1506 is extracted only from the first substrate 1503 side. In the case where the electrode 1519B is formed with a light-transmissive conductive film, the light emitted from the light-emitting element 1506 can be extracted from both the first substrate 1503 and the second substrate 1500.

In the structure shown in FIGS. 33A and 33B, the steps of providing an insulating film over a second electrode of a light-emitting element, and forming an electrode, which is electrically connected to the second electrode of the light-emitting element, over the insulating film can be omitted, unlike the structures shown in Embodiment Modes 1 to 3. Therefore, the number of the manufacturing steps of the light-emitting device can be reduced than in the structures shown in Embodiment Modes 1 to 3.

In addition, although FIGS. 33A and 33B show the structures where the first electrode 1504 of the light-emitting element, the layer 1508 containing a light-emitting substance, and the second electrode 1509 of the light-emitting element are formed over the first substrate 1503, a structure where the second electrode 1509 of the light-emitting element is not formed over the first substrate 1503 can also be employed.

Figure 34A:
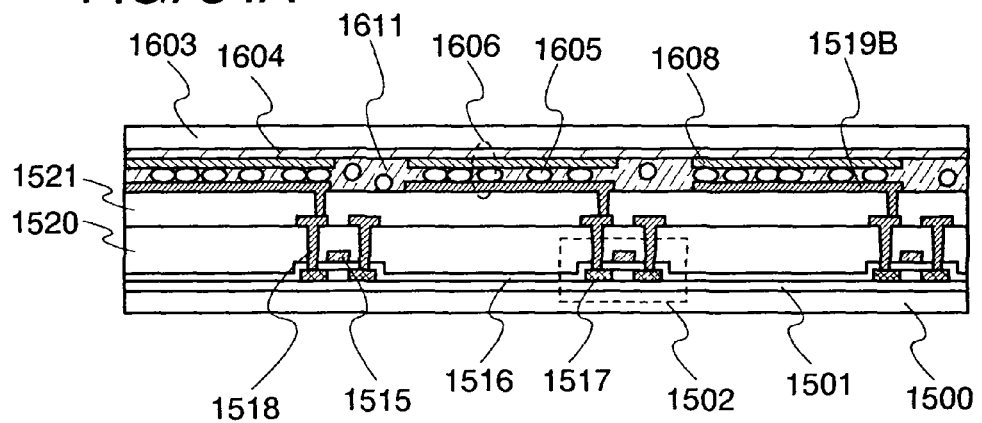
FIGS. 34A and 34B illustrate Embodiment Mode 10.

FIG. 34A shows an example of such a structure. In FIG. 34A, a first substrate 1603 over which a plurality of light-emitting elements 1606 are formed, and the second substrate 1500 over which the plurality of thin film transistors 1502 are formed are provided to face each other.

Figure 34B:
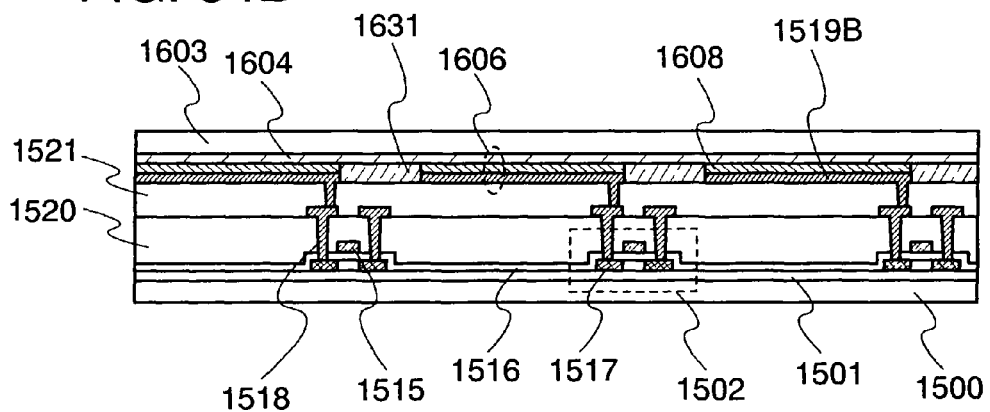

In FIGS. 34A and 34B, the first substrate 1603 and the second substrate 1500 are attached to each other so that the second substrate 1500 faces a surface of the first substrate 1603 where the first electrode 1604 of the light-emitting element and the layer 1608 containing a light-emitting substance 1608 are formed. Accordingly, the second substrate 1500 functions as a sealing substrate.

Note that in FIG. 34A, the structure of the components over the second substrate 1500 is the same as that in FIG. 33B; therefore, the common portions are denoted by common reference numerals, and thus their description will be omitted.

The light-emitting element 1606 in FIG. 34A corresponds to the light-emitting element 607 in FIG. 12. In addition, the thin film transistor 1502 in FIG. 34A corresponds to the driving transistor 606 in FIG. 12.

Each of the first substrate 1603 and the second substrate 1500 may be a light-transmissive substrate such as a glass substrate, a quartz substrate, or a light-transmissive resin substrate. Note that in the case of forming the light-emitting element 1606 to have a structure where the light emitted from the light-emitting element 1606 travels only in the direction of the first substrate 1603, the second substrate 1500 is not necessarily required to be a light-transmissive substrate. Accordingly, the second substrate 1500 may be a substrate which does not transmit light such as a resin substrate having no light transmissivity, a semiconductor substrate, a ceramic substrate, or a metal substrate.

In the case of forming the light-emitting element 1606 to have a structure where the light emitted from the light-emitting element 1606 travels only in the direction of the second substrate 1500, the first substrate 1603 is not necessarily required to be a light-transmissive substrate. Accordingly, the first substrate 1603 may be a substrate which does not transmit light such as a resin substrate having no light transmissivity, a semiconductor substrate, a ceramic substrate, or a metal substrate.

The first electrode 1604 of the light-emitting element is formed over the first substrate 1603. Then, the layer 1608 containing a light-emitting substance is formed over the first electrode 1604 of the light-emitting element.

The materials used for the first electrode 1604 of the light-emitting element and the like may be selected from those described in Embodiment Mode 1. In addition, the layer 1608 containing a light-emitting substance may have a known layer structure as has been described in Embodiment Mode 1.

The first substrate 1603 and the second substrate 1500 having the aforementioned structures are attached to each other with an anisotropic conductive film 1611. As the anisotropic conductive film 1611, ACP (Anisotropic Conductive Paste), an ACF (Anisotropic Conductive Film), and the like can be given as examples. By attaching the first substrate 1603 and the second substrate 1500 to each other with the anisotropic conductive film 1611, the layer 1608 containing a light-emitting substance and the electrode 1519B are electrically connected through a conductive particle 1605 included in the anisotropic conductive film 1611.

In this case, the conductive particle 1605 functions as a second electrode of the light-emitting element 1606. Accordingly, the light-emitting element 1606 is formed to have the first electrode 1604, the layer 1608 containing a light-emitting substance, and the conductive particle 1605. The light-emitting element 1606 having such a structure is electrically connected to the thin film transistor 1502.

Although FIG. 34A shows an example where the layer 1608 containing a light-emitting substance and the electrode 1519B are electrically connected by attaching the first substrate 1603 and the second substrate 1500 to each other with the anisotropic conductive film 1611, the method for electrically connecting the layer 1608 containing a light-emitting substance and the electrode 1519B is not particularly limited to this, and any known connection method may be employed. For example, the layer 1608 containing a light-emitting substance and the electrode 1519B may be electrically connected by using NCP (Non-Conductive Paste) or eutectic bonding with supersonic waves.

In addition, a spacer may be provided between the first substrate 1603 and the second substrate 1500 as appropriate when attaching the first substrate 1603 and the second substrate 1500 to each other.

FIG. 34B shows an example where the layer 1608 containing a light-emitting substance and the electrode 1519B are electrically connected by using NCP (Non-Conductive Paste).

In the structure shown in FIG. 34B, the first substrate 1603 and the second substrate 1500 are attached to each other with NCP 1631 so that the layer 1608 containing a light-emitting substance and the electrode 1519B are connected.

In this case, the electrode 1519B functions as a second electrode of the light-emitting element 1606. Accordingly, the light-emitting element 1606 is formed to have the first electrode 1604, the layer 1608 containing a light-emitting substance, and the electrode 1519B. The light-emitting element 1606 having such a structure is electrically connected to the thin film transistor 1502.

Note that in the structure shown in FIG. 34B, the first substrate 1603 and the second substrate 1500 are preferably attached to each other in vacuum.

In the structures shown in FIGS. 34A and 34B, in the case where the first electrode 1604 is formed with a metal film such as aluminum and the electrode 1519B is formed with a light-transmissive conductive film, the light emitted from the light-emitting element 1606 is extracted only from the second substrate 1500 side. On the other hand, in the case where the first electrode 1604 is formed with a light-transmissive conductive film, and the first electrode 1519B is formed with a metal film such as aluminum, the light emitted from the light-emitting element 1606 is extracted only from the first substrate 1603 side. In addition, in the case where both the first electrode 1604 and the electrode 1519B are formed with light-transmissive conductive films, the light emitted from the light-emitting element 1606 can be extracted from both the first substrate 1603 and the second substrate 1500.

Since the electrode 1519B also functions as a second electrode of a light-emitting element in the structures shown in FIGS. 34A and 34B, the second electrode is not required to be formed over the first substrate. Accordingly, the number of the manufacturing steps of the light-emitting device can be reduced, unlike the structures shown in FIGS. 33A and 33B.

Although the description has been made heretofore of a case where the pixel circuit 609 shown in FIG. 12 is used as an example of a pixel circuit for driving a light-emitting element provided in each pixel, the structure thereof is not limited to this. The structure of the pixel circuit 609 shown in FIG. 12 is illustrative only, and therefore, this embodiment mode can be implemented in various other pixel circuits.

The pixel circuit 609 shown in FIG. 12 has a circuit configuration where the light-emitting element 607 is connected to the driving transistor 606 as a thin film transistor for driving the light-emitting element 607. Accordingly, the light-emitting element 607 and the driving transistor 606 are electrically connected through an anisotropic conductive film. Thus, when applying the invention to other pixel circuit configurations, it is only required that an element that is to be connected to a light-emitting element be electrically connected to the light-emitting element through an anisotropic conductive film. In most of the pixel circuits, an element connected to a light-emitting element is a thin film transistor for driving the light-emitting element. Thus, in most cases, a light-emitting element and a transistor for driving the light-emitting element are electrically connected through an anisotropic conductive film.

Note that this embodiment mode can be implemented in combination with the techniques described in other embodiment modes as appropriate. Accordingly, for example, a structure where a driver circuit of a light-emitting element is formed using a film including a pixel circuit for driving a light-emitting element instead of using a second substrate as in Embodiment Mode 6, or a structure where a second substrate is thinned as in Embodiment Mode 7 can be used.

Embodiment Mode 10

In Embodiment Modes 1, 2, 4, 5, 8, and 9, a process of thinning the first substrate and the second substrate (thinning process) can be performed after attaching the first substrate and the second substrate to each other.

In this case, since the thinning process of the first substrate and the second substrate is performed after attaching the first substrate and the second substrate to each other, the thinning process of the first substrate and the second substrate can be performed concurrently.

Note that the thinning process of the substrates can be performed by grinding or polishing the substrates with a grinder or a polisher, or etching the substrates by wet etching, and the like.

Since the light-emitting device described in this embodiment mode is formed through a process of thinning the first substrate and the second substrate (thinning process), the thickness of the light-emitting device itself can be reduced. Accordingly, by using the light-emitting device in this embodiment mode for an electronic device and the like, the dimension of the electronic device in the thickness direction can be further reduced. Thus, the invention is advantageous in that downsizing can be achieved when applied to an electric device that is required to be reduced in size (a portable electronic device, in particular) such as a portable phone, a portable game machine, a mobile computer, a personal computer, and a camera (e.g., a digital camera and a video camera).

If the thinning process is performed to allow the first substrate and the second substrate to be thin enough to have flexibility (e.g., 100 μm or less, or preferably 20 to 50 μm), a flexible light-emitting device can be provided.

Note that as for Embodiment Mode 3, the process of thinning the second substrate and the third substrate (thinning process) is performed after attaching the first substrate, the second substrate, and the third substrate to each other. In this case, if the thinning process is performed to allow the second substrate and the third substrate to be thin enough to have flexibility (e.g., 100 μm or less, or preferably 20 to 50 μm), a flexible light-emitting device can be provided.

Embodiment Mode 11

Referring concurrently to the light-emitting device described in Embodiment Modes 1 to 10, description will be made of a method of attaching the first substrate over which a light-emitting element is formed and the second substrate over which a driver circuit of the light-emitting element is formed, to each other. Note that as for Embodiment Mode 6, it is assumed that the second substrate over which a driver circuit of a light-emitting element is formed is replaced by a film including a driver circuit of a light-emitting element. In addition, in the structure of Embodiment Mode 7 where the second substrate 1000 is completely removed, it is also assumed that the second substrate over which a driver circuit of a light-emitting element is formed is replaced by a film including a driver circuit of a light-emitting element.

Figure 31A:
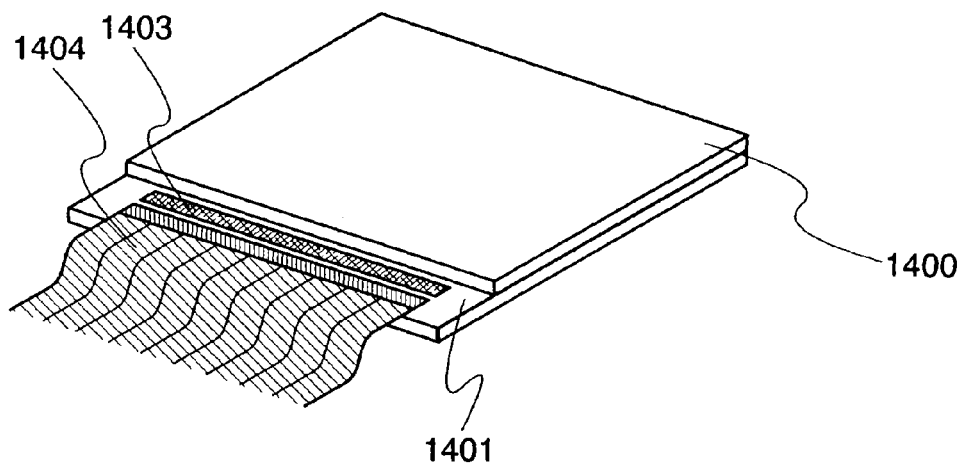
FIGS. 31A and 31B illustrate Embodiment Mode 11.

As a method of attaching the first substrate over which a light-emitting element is formed and the second substrate over which a driver circuit of the light-emitting element is formed, a method of attaching one second substrate to one first substrate can be considered. FIG. 31A shows an illustrative method of attaching one second substrate to one first substrate.

In FIG. 31A, a second substrate 1401 over which a driver circuit of a light-emitting element is formed is attached to face a first substrate 1400 over which a light-emitting element is formed. A peripheral driver circuit 1403 is formed over the second substrate 1401, and an external connecting terminal formed over the second substrate 1401 is connected to an FPC (Flexible Printed Circuit) 1404.

Figure 31B:
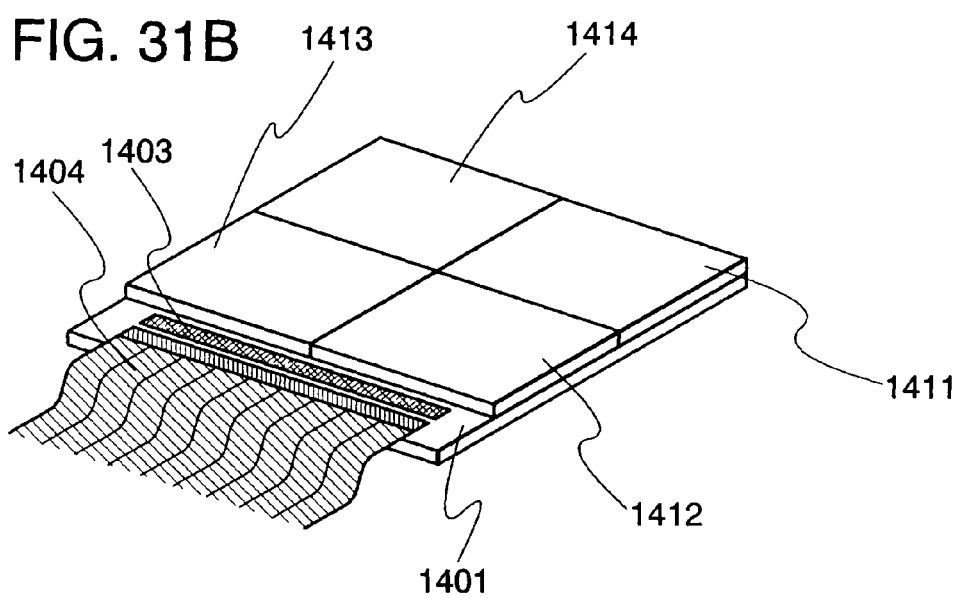

As another method of attaching the first substrate and the second substrate to each other, there is a method of attaching a plurality of first substrates to one second substrate. FIG. 31B shows a case of attaching four first substrates to one second substrate as an illustrative method of attaching a plurality of first substrates to one second substrate. Note that although FIG. 31B shows the case where four first substrates are attached to one second substrate, the number of the first substrates is not limited to four and it may be less than four or more than four as long as it is more than one. Accordingly, for example, a structure where the first substrates are arranged in 100 rows by 100 columns so as to face one second substrate may be employed.

In FIG. 31B, first substrates 1411 to 1414 over which light-emitting elements are formed are attached to face a second substrate 1401 over which a driver circuit of a light-emitting element is formed. Although the first substrates 1411 to 1414 may be formed to have either the same size or different size, they are preferably formed to have the same size for mass production. Note that portions common to FIG. 31A are denoted by common reference numerals.

Although FIGS. 31A and 31B show examples where one peripheral driver circuit 1403 is formed over the second substrate, the position and the number of the peripheral driver circuits are not limited to those shown in FIGS. 31A and 31B.

Figure 32A:
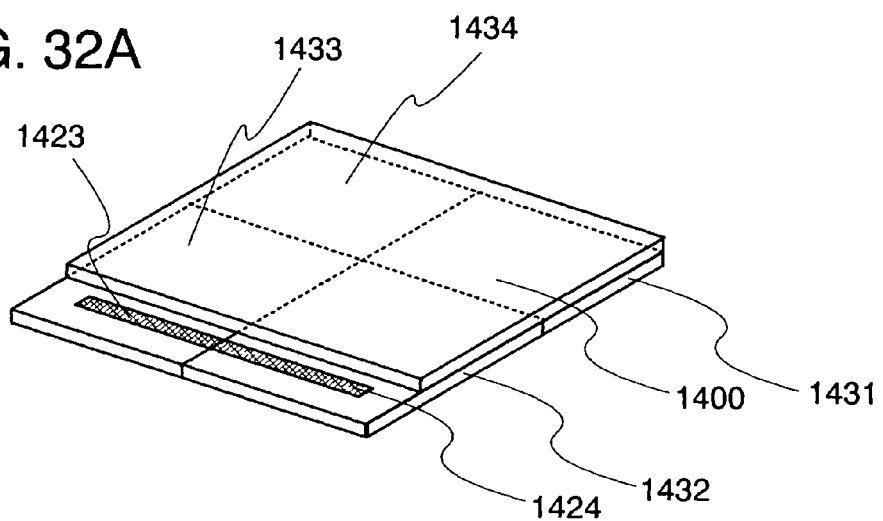
FIGS. 32A and 32B illustrate Embodiment Mode 11.

As another method of attaching the first substrate and the second substrate to each other, there is a method of attaching a plurality of second substrates to one first substrate. FIG. 32A shows a case of attaching four second substrates to one first substrate as an illustrative method of attaching a plurality of second substrates to one first substrate. Note that although FIG. 32A shows the case where four second substrates are attached to one first substrate, the number of the second substrates is not limited to four and it may be less than four or more than four as long as it is more than one. Accordingly, for example, a structure where the second substrates are arranged in 100 rows by 100 columns so as to face one first substrate may be employed.

In FIG. 32A, second substrates 1431 to 1434 over which circuits for driving light-emitting elements are formed are attached to face a first substrate 1400 over which light-emitting elements are formed. In the example shown in FIG. 32A, peripheral driver circuits 1423 and 1424 are formed over the second substrates 1433 and 1432 respectively among the four substrates.

Since the peripheral driver circuits 1423 and 1424 are formed over different substrates, they are not electrically connected to each other without modification. If it is necessary to electrically connect the peripheral driver circuits 1423 and 1424, the peripheral driver circuits 1423 and 1424 may be electrically connected by wire bonding or by using a wire which is formed by ink-jet method.

The second substrates 1431 to 1434 may be formed to have either the same size or different size. Note that although FIG. 32A shows the case where the peripheral driver circuits are formed over the second substrates 1432 and 1433, the position and the number of the peripheral driver circuits are not limited to those shown in FIG. 32A.

Figure 32B:
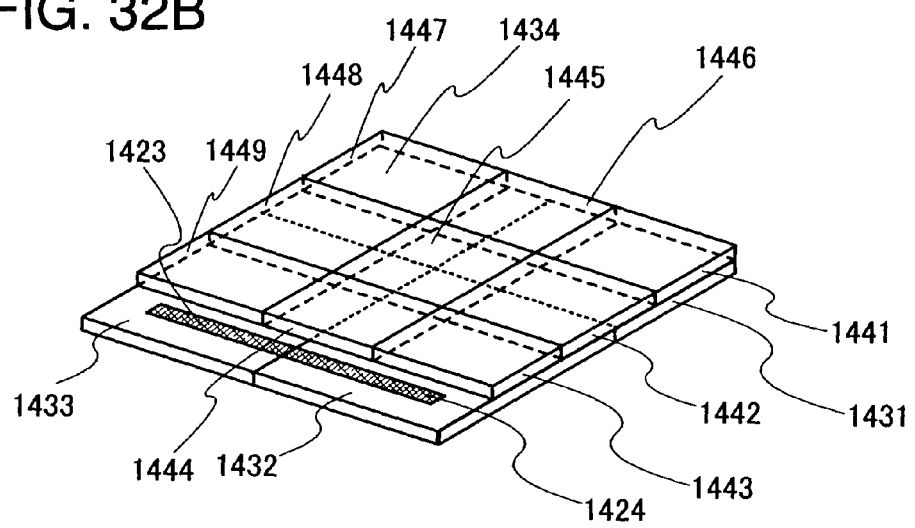

Note also that although an FPC is shown in FIGS. 31A and 31B, it is not shown in FIGS. 32A and 32B in order to clearly show that the four substrates 1431 to 1434 are attached to one first substrate. However, an FPC is actually provided in the structure shown in FIGS. 32A and 32B so as to be connected to an external connecting terminal formed over the second substrate. In this case, the FPC may be provided such that FPCs are connected to the second substrates 1432 and 1433 respectively, or such that one common FPC is connected to the second substrates 1432 and 1433.

It is also possible to attach a plurality of first substrates and a plurality of second substrates to each other. Note that in this case, the number of the first substrates is not required to be equal to that of the second substrates. That is, the number of the first substrates may be different from that of the second substrates. FIG. 32B shows a case where the number of the first substrates is different from that of the second substrates. In FIG. 32B, nine first substrates 1441 to 1449 and four second substrates 1431 to 1434 are attached to each other. In the case where the size of a first substrate over which a light emitting element is formed is different from that of a second substrate, boundary lines between the adjacent first substrates do not overlap with boundary lines between the adjacent second substrates as shown in FIG. 32B. Therefore, the strength of the first substrates and second substrates after being attached is increased, as compared with a case where an attached first substrates and second substrates have the same number. Thus, the attached first substrates and second substrates become difficult to be broken. In the invention, a first substrate over which a light-emitting element is formed is manufactured through different steps from and a second substrate over which a driver circuit of a light-emitting element is formed; therefore, the number of the first substrates and the second substrates to be attached to each other may be different, and also the size of the first substrate and the second substrate to be attached to each other may be different.

Note also that in FIGS. 31A, 31B, 32A and 32B, the first substrate is provided such that the first substrate is not present over a region where the peripheral driver circuit of the second substrate is formed. However, the first substrate and the second substrate may be attached to each other such that the first substrate is present over the region where the peripheral driver circuit of the second substrate is formed.

In addition, although FIGS. 31A, 31B, 32A and 32B show the case where the peripheral driver circuit is formed over the second substrate, the invention is not specifically limited to such a structure, and a part or all of the peripheral driver circuit may be formed with an IC or the like.

As described above, the light-emitting device can be easily increased in size by attaching a plurality of second substrates to one first substrate, attaching a plurality of first substrates to one second substrate, or attaching a plurality of first substrates and a plurality of second substrates to each other. Accordingly, by applying the structure of this embodiment mode to a display device such as a TV set which is demanded to be increased in size, a display device with a larger size can be manufactured.

Note that although the description has been made heretofore of an example of an active matrix light-emitting device, with reference to FIGS. 31A, 31B, 32A and 32B, the invention can be also applied to a passive matrix light-emitting device.

Embodiment 1

Figure 23A:
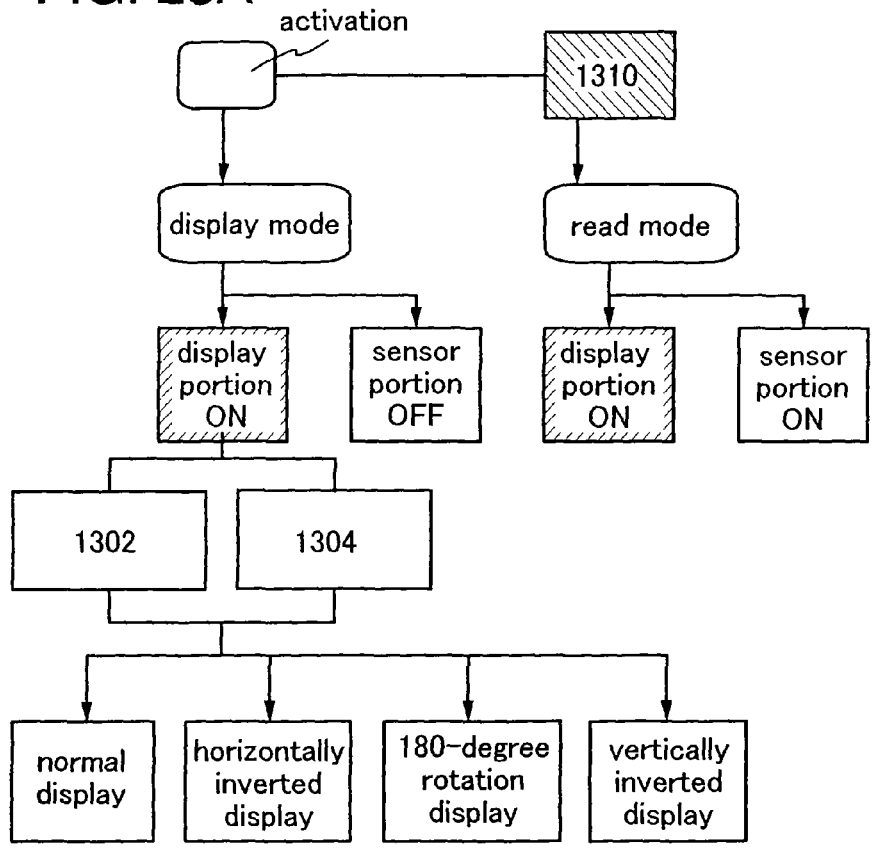
FIGS. 23A to 23C illustrate a display mode and a read mode in Embodiment 1.

The light-emitting devices described in Embodiment Modes 4 and 5 have two functions of a display function and a readout function. Here, description will be made of a method of switching between the display function and the readout function, with reference to a flow chart in FIG. 23A.

First, a light-emitting device is activated. When the light-emitting device is activated, the device automatically enters a display mode, and a display portion is turned on, while a sensor portion is turned off. In this case, the display portion means all subpixels each including a light-emitting element, and the sensor portion means all subpixels each including an image sensor. The display portion performs normal display, horizontally inverted display, 180-degree rotation display, or vertically inverted display, in response to a signal supplied from a hinge-switching circuit 1302 or a switching circuit 1304. On the other hand, when the device enters a read mode, both of the display portion and the sensor portion are turned on, in response to a signal supplied from a button 1310. Then, the sensor portion reads out information of an object by using the display portion as a light source.

Figure 23B:
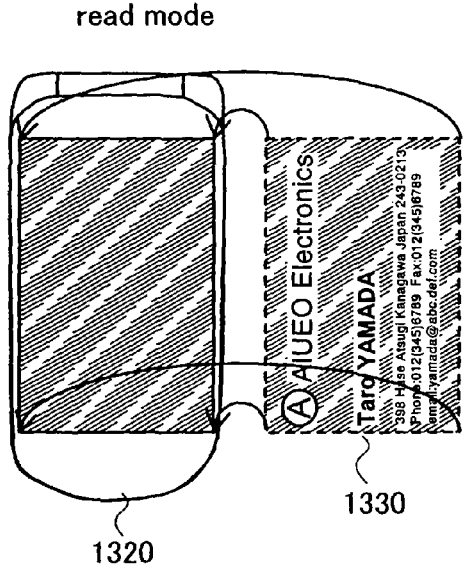
Figure 23C:
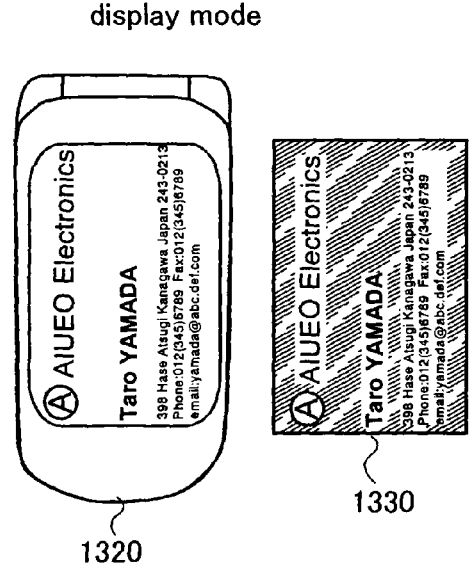

Description will be made of the operation in this case, using an illustrative example where a business card 1330 is read out by using a housing 1320 of a folding portable terminal, with referent to FIGS. 23B and 23C. First, when the device is in a read mode, a business card 1330 is put on the display panel so as to block the outside light (FIG. 23B). The information read out is stored in a storage medium in the portable terminal. Subsequently, the display portion performs display based on the information of the business card 1330 read out (FIG. 23C).

In this manner, the light-emitting device in this embodiment mode has two functions of an image sensor function for reading out information of an object, and a display function of displaying an image. Notwithstanding the foregoing two functions, a light source and a light-scattering plate, which are usually required in using an image sensor function, are not required. Therefore, drastic reduction in size, thickness, and weight can be realized. In this case, the light-emitting element functions as both a light source for reading out information of an object and a display medium for displaying an image.

Embodiment 2

Various electronic devices can be manufactured by incorporating a light-emitting device of the invention into a display portion. As examples of such electronic devices, there are a camera (e.g., a video camera or a digital camera), a goggle display (e.g., a head mounted display), a navigation system, an audio reproducing device (e.g., a car audio or an audio component stereo), a personal computer, a game machine, a portable information terminal (e.g., a mobile computer, a portable phone set, a portable game machine, or an electronic book), an image reproducing device provided with a recording medium (e.g., a device for reproducing a recording medium such as a digital versatile disc (DVD) and having a display for displaying the reproduced image), and the like. FIGS. 30A to 30H illustrate specific examples of such electronic devices.

Figure 30A:
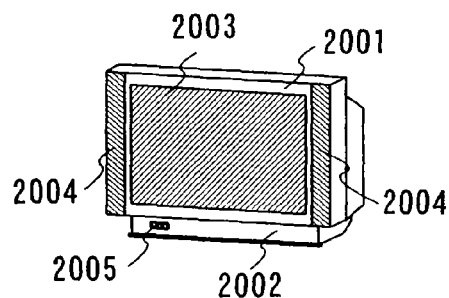
FIGS. 30A to 30H illustrate electronic devices in Embodiment 2.

FIG. 30A shows a television set, which includes a housing 2001, a supporting base 2002, a display portion 2003, speaker portions 2004, a video input terminal 2005, and the like. The light-emitting device of the invention can be applied to the display portion 2003. Note that the television set includes all information display mediums such as those for a personal computer, TV broadcasting reception, and advertisement display.

Figure 30B:
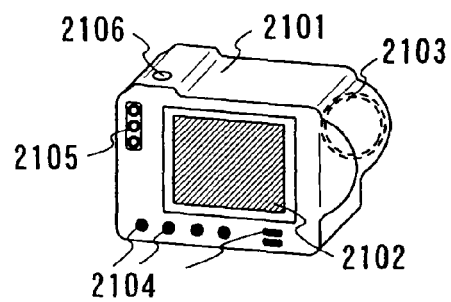

FIG. 30B shows a digital camera, which includes a main body 2101, a display portion 2102, an image receiving portion 2103, operating keys 2104, an external connecting port 2105, a shutter 2106, and the like. The light-emitting device of the invention can be applied to the display portion 2102.

Figure 30C:
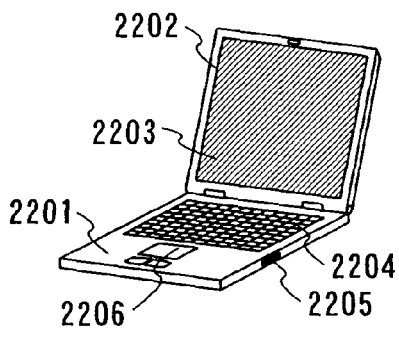

FIG. 30C shows a personal computer, which includes a main body 2201, a housing 2202, a display portion 2203, a keyboard 2204, an external connecting port 2205, a pointing mouse 2206, and the like. The light-emitting device of the invention can be applied to the display portion 2203.

Figure 30D:
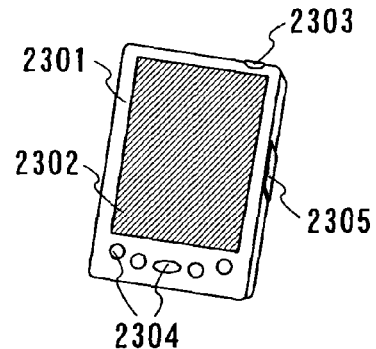

FIG. 30D shows a mobile computer, which includes a main body 2301, a display portion 2302, a switch 2303, operating keys 2304, an infrared port 2305, and the like. The light-emitting device of the invention can be applied to the display portion 2302.

Figure 30E:
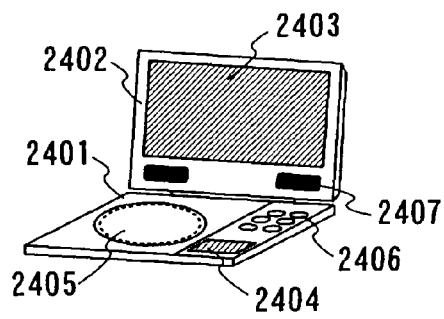

FIG. 30E is a portable image reproducing device provided with a recording medium (specifically, a DVD player), which includes a main body 2401, a housing 2402, a display portion A 2403, a display portion B 2404, a recording medium (e.g., DVD) reading portion 2405, an operating key 2406, a speaker portion 2407, and the like. The display portion A 2403 mainly displays image data, while the display portion B 2404 mainly displays text data. The light-emitting device of the invention can be applied to the display portions A 2403 and B 2404. Note that the image reproducing device provided with a recording medium includes a home-use game machine and the like.

Figure 30F:
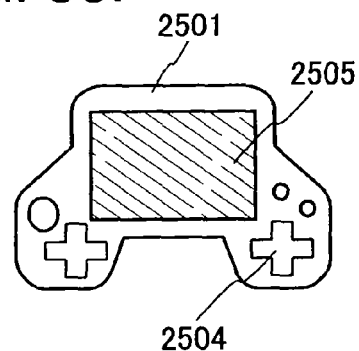

FIG. 30F shows a game machine, which includes a main body 2501, a display portion 2505, an operating switch 2504, and the like. The light-emitting device of the invention can be applied to the display portion 2502.

Figure 30G:
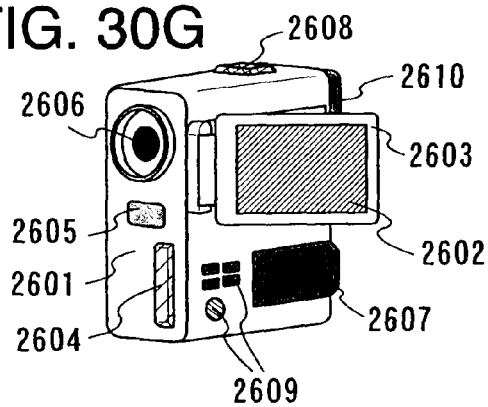

FIG. 30G shows a video camera, which includes a main body 2601, a display portion 2602, a housing 2603, an external connecting port 2604, a remote controller receiving portion 2605, an image receiving portion 2606, a battery 2607, an audio input portion 2608, operating keys 2609, an eyepiece portion 2610, and the like. The light-emitting device of the invention can be applied to the display portion 2602.

Figure 30H:
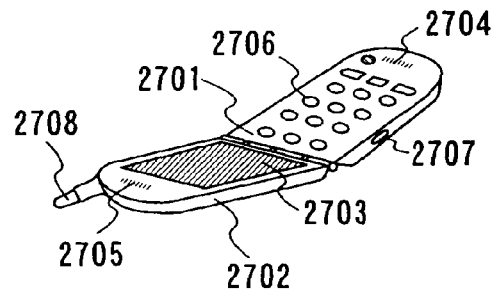

FIG. 30H shows a portable phone set, which includes a main body 2701, a housing 2702, a display portion 2703, an audio input portion 2704, an audio output portion 2705, an operating key 2706, an external connecting port 2707, an antenna 2708, and the like. The light-emitting device of the invention can be applied to the display portion 2703.

As described above, the light-emitting device of the invention can be used as a display portion of various electronic devices. Note that the electronic devices in this embodiment may employ a light-emitting device manufactured by using any of the structures in Embodiment Modes 1 to 11 or Embodiment 1.

The present application is based on Japanese Priority application No. 2005-228678 filed on Aug. 5, 2005 with the Japanese Patent Office, the entire contents of which are hereby incorporated by reference.

What is claimed is:
1. A light-emitting device comprising:
a first substrate;
a light-emitting element over the first substrate;
an insulating film which covers the light-emitting element;
a second substrate; and a pixel circuit for driving the light-emitting element over the second substrate, the second substrate being provided to face the first substrate, wherein the light-emitting element is electrically connected to the pixel circuit through the insulating film.

2. The light-emitting device according to claim 1, wherein the second substrate is provided to face a surface of the first substrate where the light-emitting element is formed so as to cover the light-emitting element.

3. The light-emitting device according to claim 1 further comprising an image sensor over the second substrate.

4. The light-emitting device according to claim 1 further comprising an image sensor over the first substrate.

5. The light-emitting device according to claim 1 further comprising an image sensor over the first substrate,
wherein the pixel circuit comprises a plurality of thin film transistors,
wherein the image sensor comprises an amorphous semiconductor film, and
wherein each of the plurality of thin film transistors comprises a crystalline semiconductor.

6. The light-emitting device according to claim 1, wherein the first substrate and the second substrate are attached to each other with an anisotropic conductive film, thereby the light-emitting element is electrically connected to the pixel circuit.

7. The light-emitting device according to claim 1, wherein each of the first substrate and the second substrate is a light-transmissive substrate.

8. The light-emitting device according to claim 1, wherein the number of the first substrates is one, and the number of the second substrates is more than one two or more.

9. The light-emitting device according to claim 1, wherein the number of the first substrates is two or more, and the number of the second substrates is one.

10. The light-emitting device according to claim 1, wherein the number of the first substrates and the number of the second substrates are two or more.

11. The light-emitting device according to claim 1, wherein the light-emitting element is electrically connected to the pixel circuit through an opening in the insulating film.

12. A light-emitting device comprising:
a first substrate;
a light-emitting element over the first substrate;
an insulating film which covers the light-emitting element;
a second substrate; and
a pixel circuit for driving the light-emitting element over the second substrate, the second substrate being provided to face the first substrate,
wherein the pixel circuit comprises a driving transistor for driving the light-emitting element, and
wherein the driving transistor is electrically connected to the light-emitting element through the insulating film.

13. The light-emitting device according to claim 12, wherein the second substrate is provided to face a surface of the first substrate where the light-emitting element is formed so as to cover the light-emitting element.

14. The light-emitting device according to claim 12, wherein the first substrate and the second substrate are attached to each other with an anisotropic conductive film, thereby the light-emitting element is electrically connected to the driving transistor.

15. The light-emitting device according to claim 12, wherein each of the first substrate and the second substrate is a light-transmissive substrate.

16. The light-emitting device according to claim 12, wherein the number of the first substrates is one, and the number of the second substrates is two or more.

17. The light-emitting device according to claim 12, wherein the number of the first substrates is two or more, and the number of the second substrates is one.

18. The light-emitting device according to claim 12, wherein the number of the first substrates and the number of the second substrates are two or more.

19. A light-emitting device comprising:
a first substrate;
a first electrode of a light-emitting element over the first substrate;
a layer containing a light-emitting substance formed over the first substrate with the first electrode of the light-emitting element interposed between the first substrate and the layer containing the light-emitting substance;
a second substrate provided to face the first substrate;
a transistor for driving the light-emitting element over the second substrate;
an interlayer insulating film over the transistor; and
a second electrode which is electrically connected to a source region or a drain region of the transistor over the interlayer insulating film,
wherein the second electrode which is electrically connected to the source region or the drain region of the transistor is electrically connected to the first electrode.

20. The light-emitting device according to claim 19, wherein each of the first substrate and the second substrate is a light-transmissive substrate.

21. The light-emitting device according to claim 19, wherein the number of the first substrates is one, and the number of the second substrates is two or more.

22. The light-emitting device according to claim 19, wherein the number of the first substrates is two or more, and the number of the second substrates is one.

23. The light-emitting device according to claim 19, wherein the number of the first substrates and the number of the second substrates are two or more.

24. A light-emitting device comprising:
a substrate;
a light-emitting element over the substrate;
an insulating film which covers the light-emitting element; and
a film comprising a pixel circuit for driving the light-emitting element, the film being provided to face the substrate,
wherein the light-emitting element is electrically connected to the pixel circuit through the insulating film.

25. The light-emitting device according to claim 24, wherein the substrate and the film are attached to each other with an anisotropic conductive film, thereby the light-emitting element is electrically connected to the pixel circuit.

26. The light-emitting device according to claim 24, wherein each of the substrate and the film is light-transmissive.

27. The light-emitting device according to claim 24, wherein the number of the substrates is one, and the number of the films is two or more.

28. The light-emitting device according to claim 24, wherein the number of the substrates is two or more, and the number of the films is one.

29. The light-emitting device according to claim 24, wherein the number of the substrates and the number of the films are two or more.

30. The light-emitting device according to claim 24, wherein the light-emitting element is electrically connected to the pixel circuit through and opening in the insulating film.

31. A light-emitting device comprising:
a substrate;
a light-emitting element over the substrate;
an insulating film which covers the light-emitting element; and
a film comprising a pixel circuit for driving the light-emitting element, the film being provided to face the substrate,
wherein the pixel circuit for driving the light-emitting element comprises a driving transistor for driving the light-emitting element, and
wherein the light-emitting element is electrically connected to the driving transistor through the insulating film.

32. The light-emitting device according to claim 31, wherein the substrate and the film are attached to each other with an anisotropic conductive film, thereby the light-emitting element is electrically connected to the driving transistor.

33. The light-emitting device according to claim 31, wherein each of the substrate and the film is light-transmissive.

34. The light-emitting device according to claim 31, wherein the number of the substrates is one, and the number of the films is two or more.

35. The light-emitting device according to claim 31, wherein the number of the substrates is two or more, and the number of the films is one.

36. The light-emitting device according to claim 31, wherein the number of the substrates and the number of the films are two or more.

37. The light-emitting device according to claim 31, wherein the light-emitting element is electrically connected to the driving transistor though an opening in the insulating film.

* * * * *

UNITED STATES PATENT AND TRADEMARK OFFICE
CERTIFICATE OF CORRECTION

PATENT NO. : 8,138,502 B2
APPLICATION NO. : 11/459768
DATED : March 20, 2012
INVENTOR(S) : Osamu Nakamura et al.

Page 1 of 1

It is certified that error appears in the above-identified patent and that said Letters Patent is hereby corrected as shown below:

Column 53, line 31, in claim 8 before "two" delete "more than one".

Signed and Sealed this
Ninth Day of October, 2012

David J. Kappos
*Director of the United States Patent and Trademark Office*